(12) United States Patent
Suthiwongsunthorn et al.

(10) Patent No.: US 9,978,658 B2
(45) Date of Patent: May 22, 2018

(54) SEMICONDUCTOR PACKAGES AND METHODS OF PACKAGING SEMICONDUCTOR DEVICES

(71) Applicant: UTAC Headquarters Pte. Ltd., Singapore (SG)

(72) Inventors: Nathapong Suthiwongsunthorn, Singapore (SG); Antonio Jr. Bambalan Dimaano, Singapore (SG); Rui Huang, Singapore (SG); Hua Hong Tan, Singapore (SG); Kriangsak Sae Le, Bangkok (TH); Beng Yeung Ho, Singapore (SG); Nelson Agbisit De Vera, Singapore (SG); Roel Adeva Robles, Singapore (SG); Wedanni Linsangan Micla, Singapore (SG)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 0 days. days.

(21) Appl. No.: 15/361,487

(22) Filed: Nov. 27, 2016

(65) Prior Publication Data
US 2017/0077007 A1 Mar. 16, 2017

Related U.S. Application Data

(62) Division of application No. 14/731,484, filed on Jun. 5, 2015, now Pat. No. 9,508,623.
(Continued)

(51) Int. Cl.
*H01L 23/48* (2006.01)
*H01L 23/31* (2006.01)
(Continued)

(52) U.S. Cl.
CPC ...... *H01L 23/3135* (2013.01); *H01L 21/3105* (2013.01); *H01L 21/561* (2013.01); *H01L 21/566* (2013.01); *H01L 21/568* (2013.01); *H01L 21/6836* (2013.01); *H01L 21/78* (2013.01); *H01L 23/3114* (2013.01); *H01L 23/544* (2013.01); *H01L 24/11* (2013.01);
(Continued)

(58) Field of Classification Search
CPC . H01L 23/3135; H01L 23/3114; H01L 23/544
USPC .................................. 257/778, 787
See application file for complete search history.

(56) References Cited

U.S. PATENT DOCUMENTS 5,814,894 A * 9/1998 Igarashi ................ H01L 21/563
257/778
6,004,867 A 12/1999 Kim et al.
(Continued)

*Primary Examiner* — Nitin Parekh
(74) *Attorney, Agent, or Firm* — Horizon IP Pte Ltd.

(57) ABSTRACT

Semiconductor packages and methods for forming a semiconductor package are disclosed. The method includes providing a wafer having first and second major surfaces. The wafer is prepared with a plurality of dies and a plurality of external electrical contacts disposed on the first major surface of the wafer. The method includes processing the wafer. Processing the wafer includes separating the wafer into a plurality of individual dies. An individual die includes first and second major surfaces and first and second sidewalls, and the external electrical contacts are formed on the first major surface of the die. An encapsulant material is formed. The encapsulant material covers at least a portion of the first and second sidewalls of the die.

18 Claims, 41 Drawing Sheets

Related U.S. Application Data

(60) Provisional application No. 62/009,309, filed on Jun. 8, 2014, provisional application No. 62/037,128, filed on Aug. 14, 2014, provisional application No. 62/081,541, filed on Nov. 18, 2014.

(51) Int. Cl.
*H01L 21/56* (2006.01)
*H01L 21/78* (2006.01)
*H01L 21/3105* (2006.01)
*H01L 21/683* (2006.01)
*H01L 23/544* (2006.01)
*H01L 23/00* (2006.01)

(52) U.S. Cl.
CPC .............. *H01L 24/13* (2013.01); *H01L 24/94* (2013.01); *H01L 2221/6834* (2013.01); *H01L 2221/68327* (2013.01); *H01L 2221/68336* (2013.01); *H01L 2223/54426* (2013.01); *H01L 2224/0391* (2013.01); *H01L 2224/1134* (2013.01); *H01L 2224/131* (2013.01); *H01L 2224/13144* (2013.01); *H01L 2224/13147* (2013.01); *H01L 2224/94* (2013.01); *H01L 2924/10156* (2013.01); *H01L 2924/1815* (2013.01)

(56) References Cited

U.S. PATENT DOCUMENTS

| | | |
|---|---|---|
| 6,043,109 A | 3/2000 | Yang et al. |
| 6,107,164 A | 8/2000 | Ohuchi |
| 6,245,598 B1 | 6/2001 | Chen et al. |
| 6,291,884 B1 | 9/2001 | Glenn et al. |
| 6,338,980 B1 | 1/2002 | Satoh |
| 6,468,832 B1 * | 10/2002 | Mostafazadeh ....... H01L 21/565 257/738 |
| 6,544,821 B2 | 4/2003 | Akram |
| 6,649,445 B1 | 11/2003 | Qi et al. |
| 6,657,282 B2 | 12/2003 | Fukasawa et al. |
| 6,780,746 B2 | 8/2004 | Kinsman et al. |
| 6,953,988 B2 * | 10/2005 | Seo .................... H01L 23/4951 257/666 |
| 7,727,875 B2 | 6/2010 | Shin et al. |
| 7,838,424 B2 | 11/2010 | Karta et al. |
| 7,939,916 B2 | 5/2011 | O'Donnell et al. |
| 7,947,529 B2 * | 5/2011 | Koon .................. H01L 23/3107 257/E21.499 |
| 8,546,160 B2 | 10/2013 | Chen |
| 8,778,735 B1 | 7/2014 | Xue et al. |
| 2004/0113283 A1 | 6/2004 | Farnworth et al. |
| 2005/0148160 A1 | 7/2005 | Farnworth et al. |
| 2012/0142165 A1 | 6/2012 | Huang et al. |
| 2014/0091455 A1 | 4/2014 | Strothmann et al. |
| 2014/0091458 A1 | 4/2014 | Van Gemert et al. |
| 2014/0091482 A1 | 4/2014 | Lin et al. |
| 2014/0252601 A1 | 9/2014 | Lu et al. |

* cited by examiner

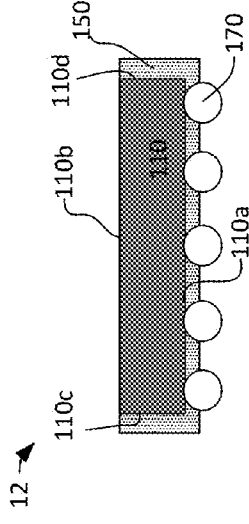
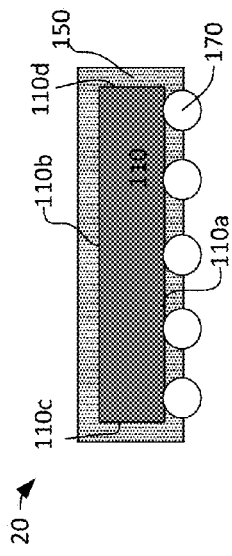
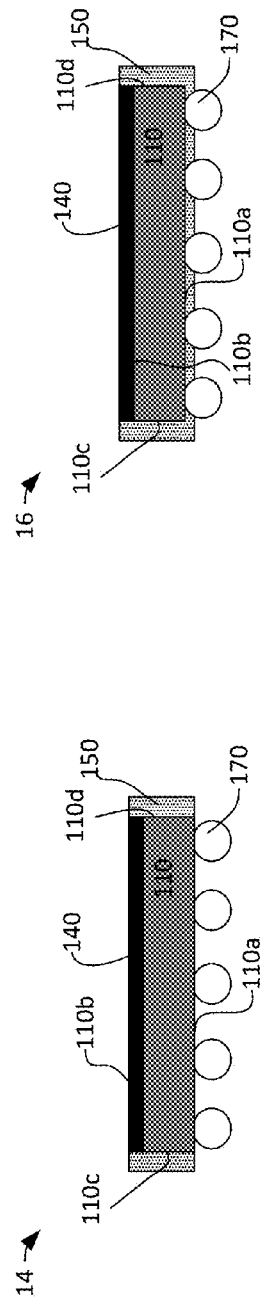
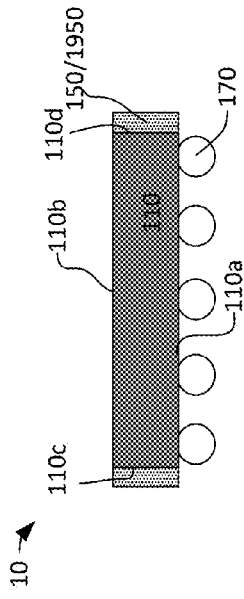
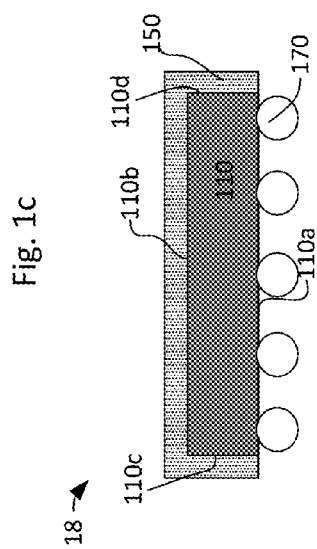

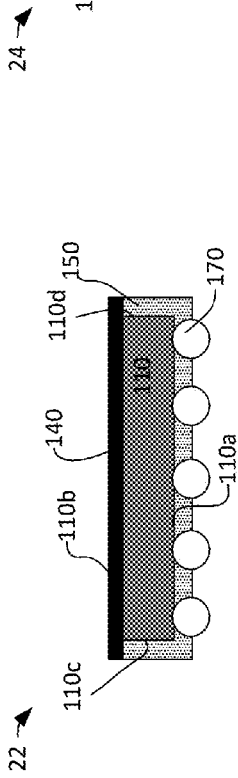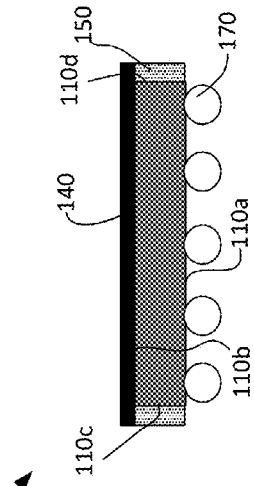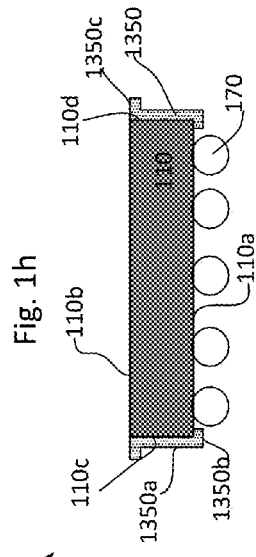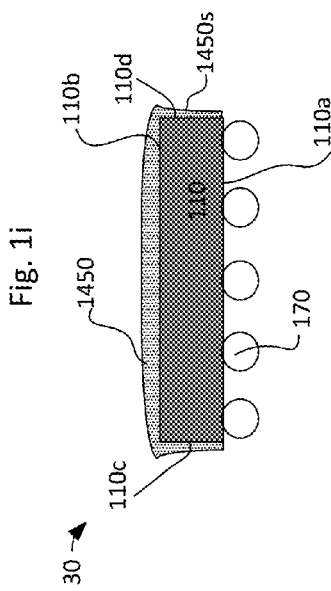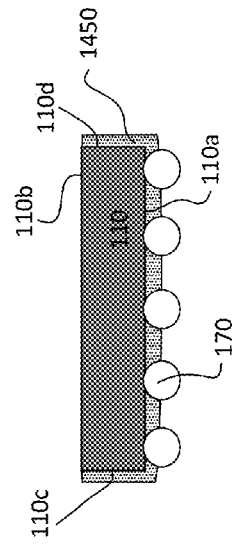

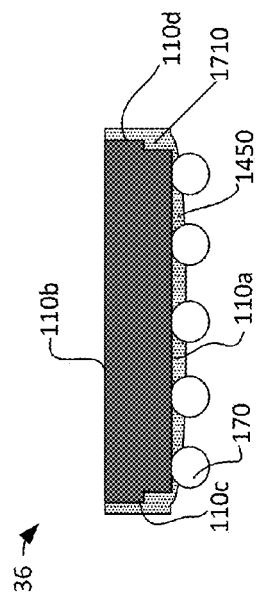
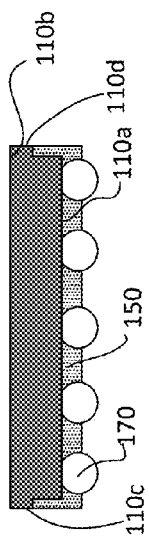
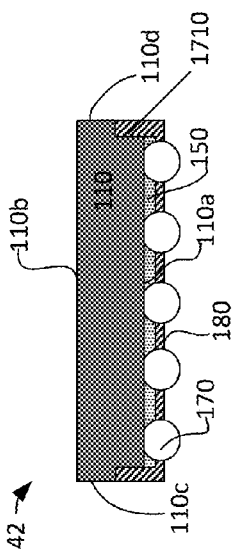
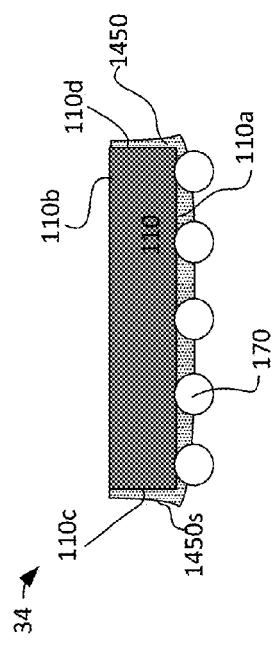
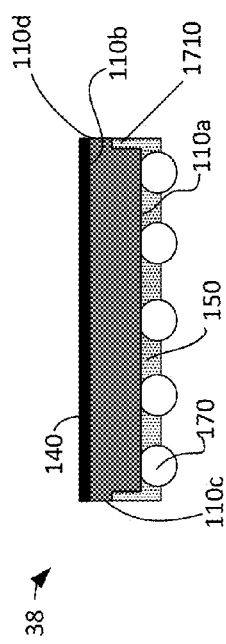
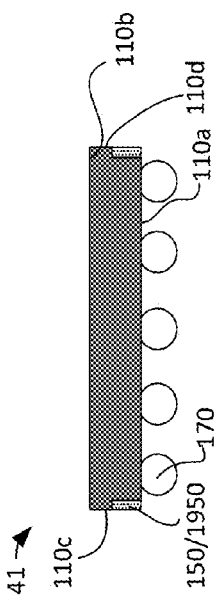

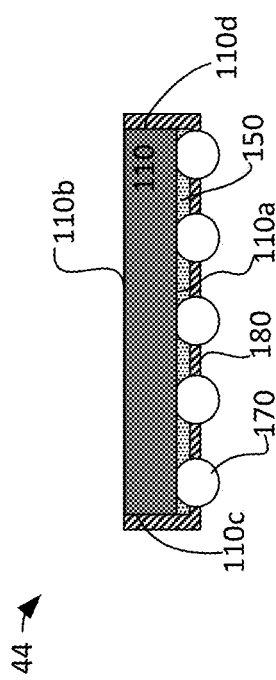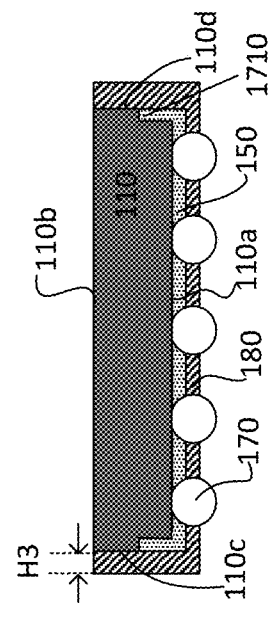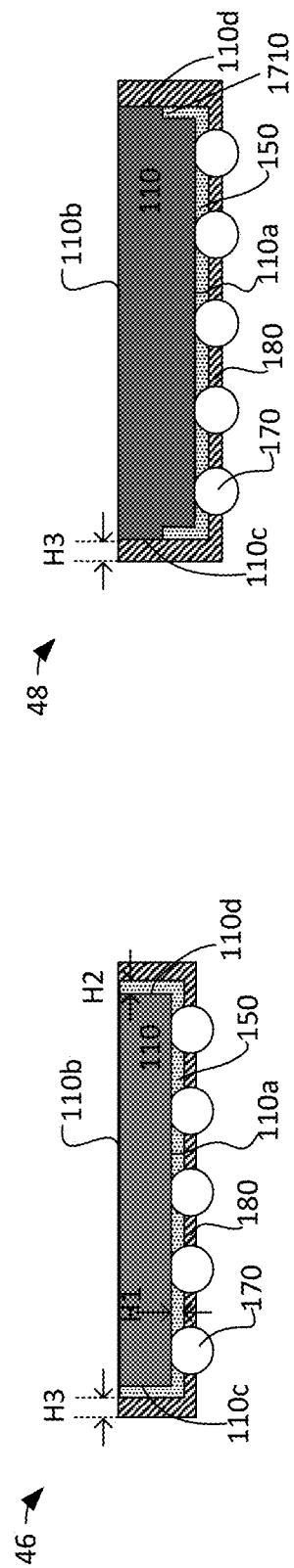

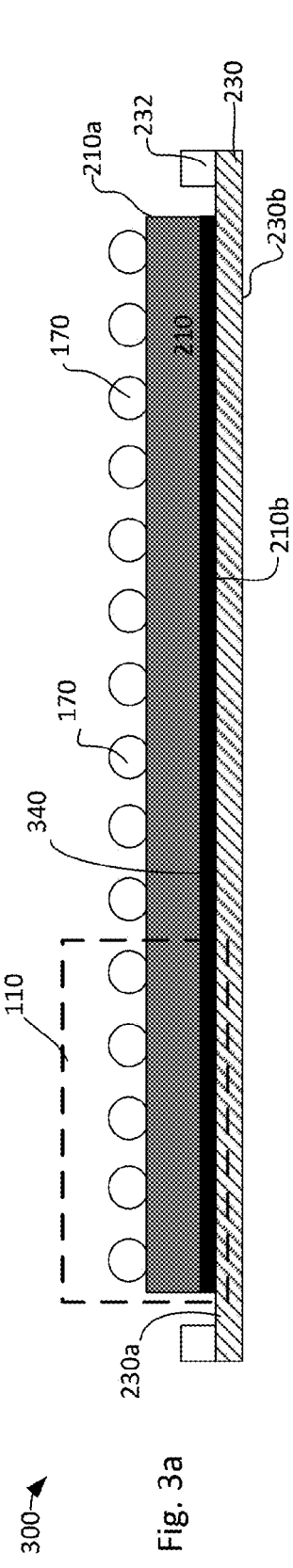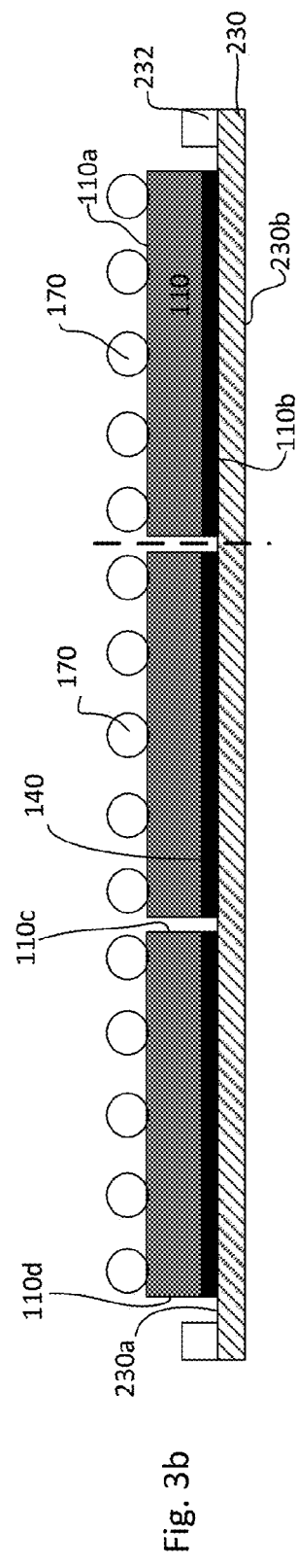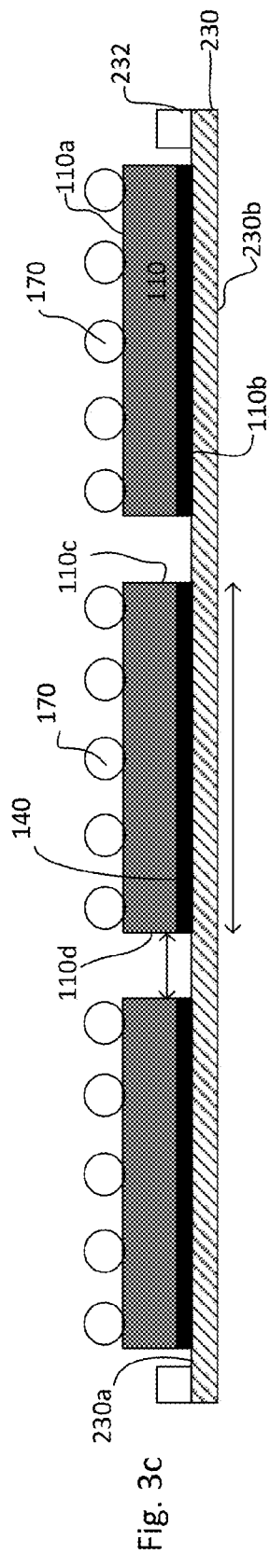

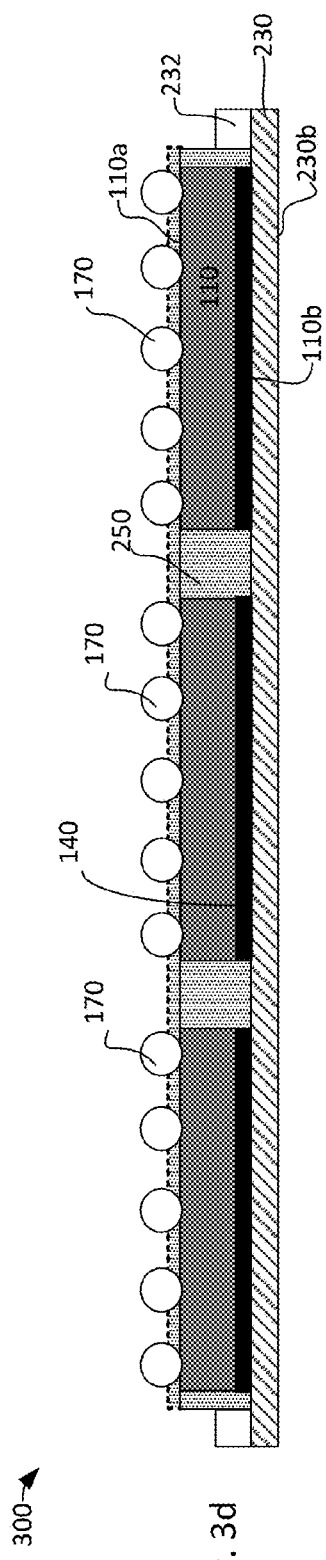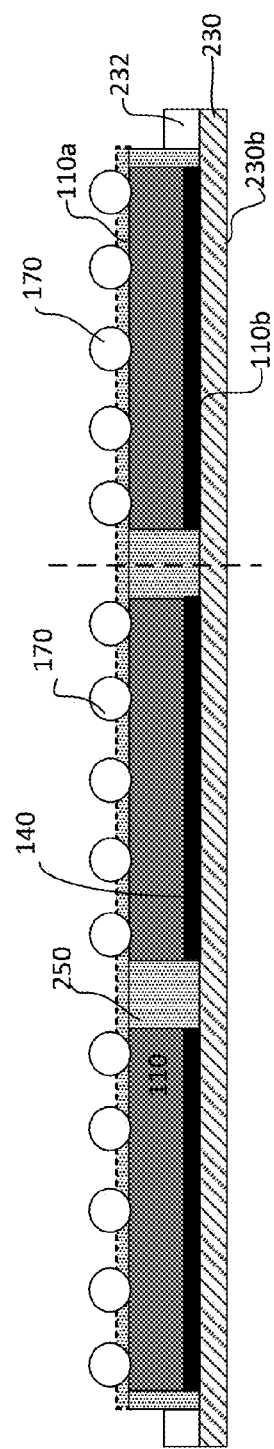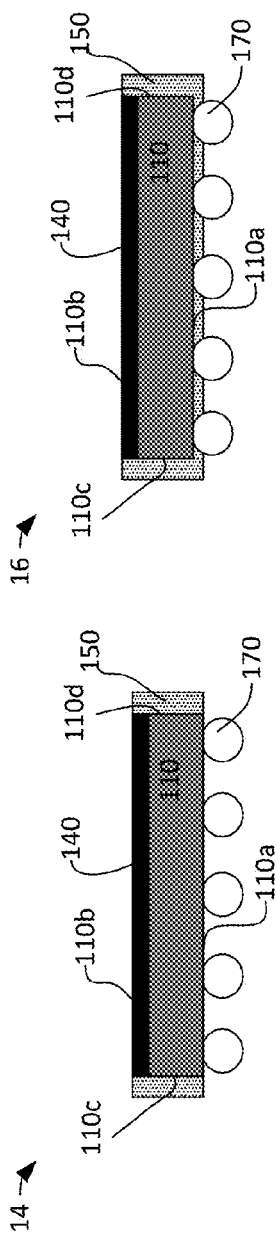

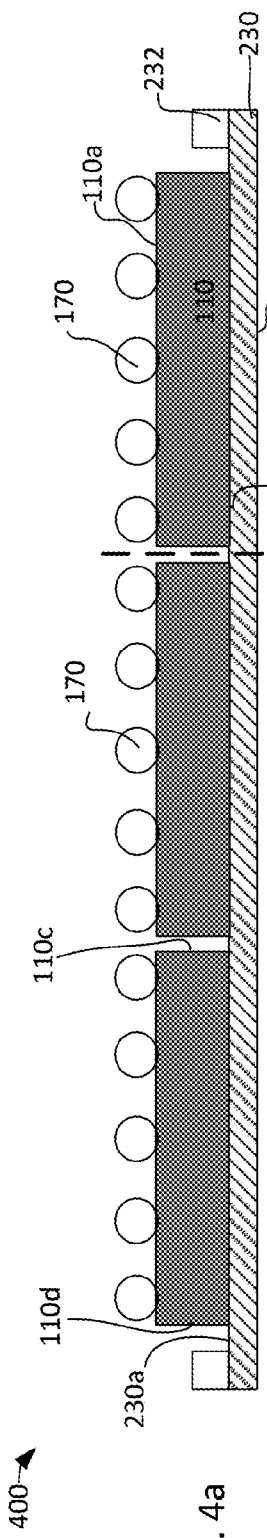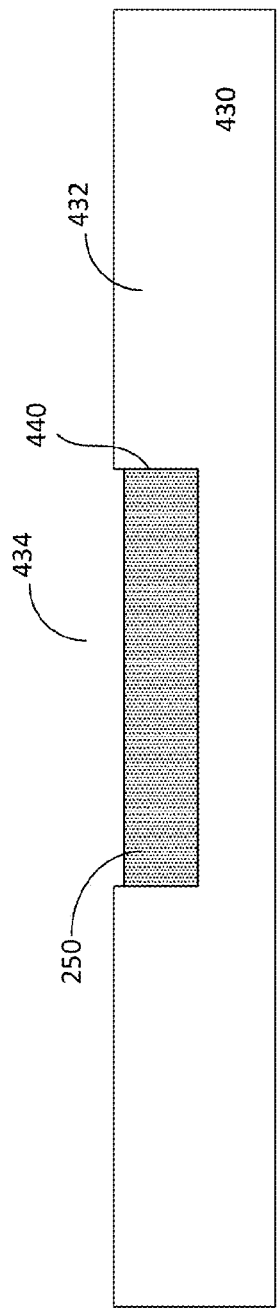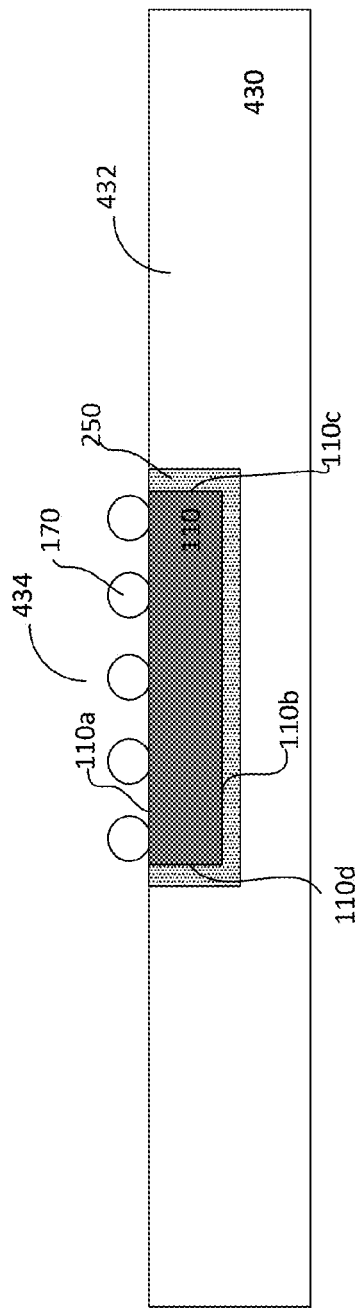

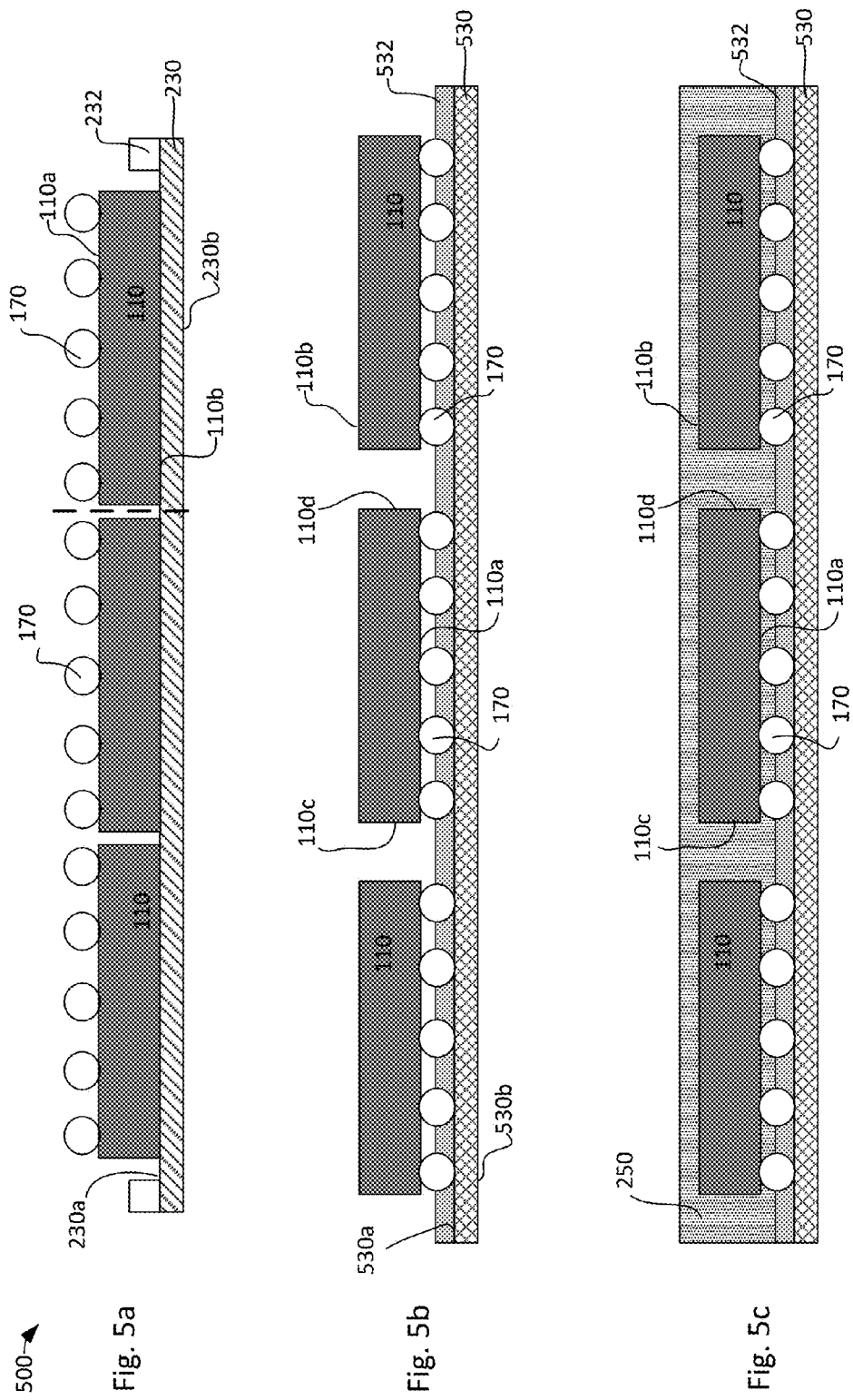

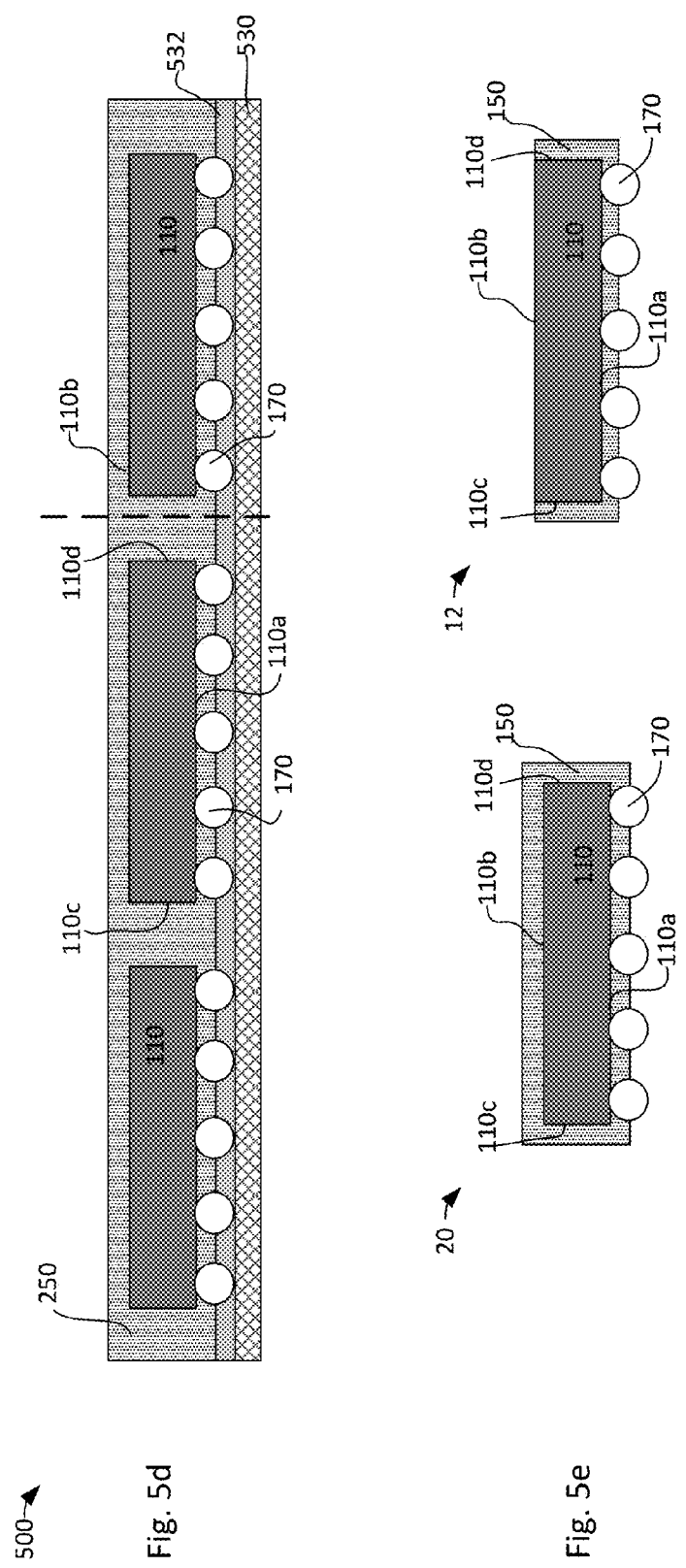

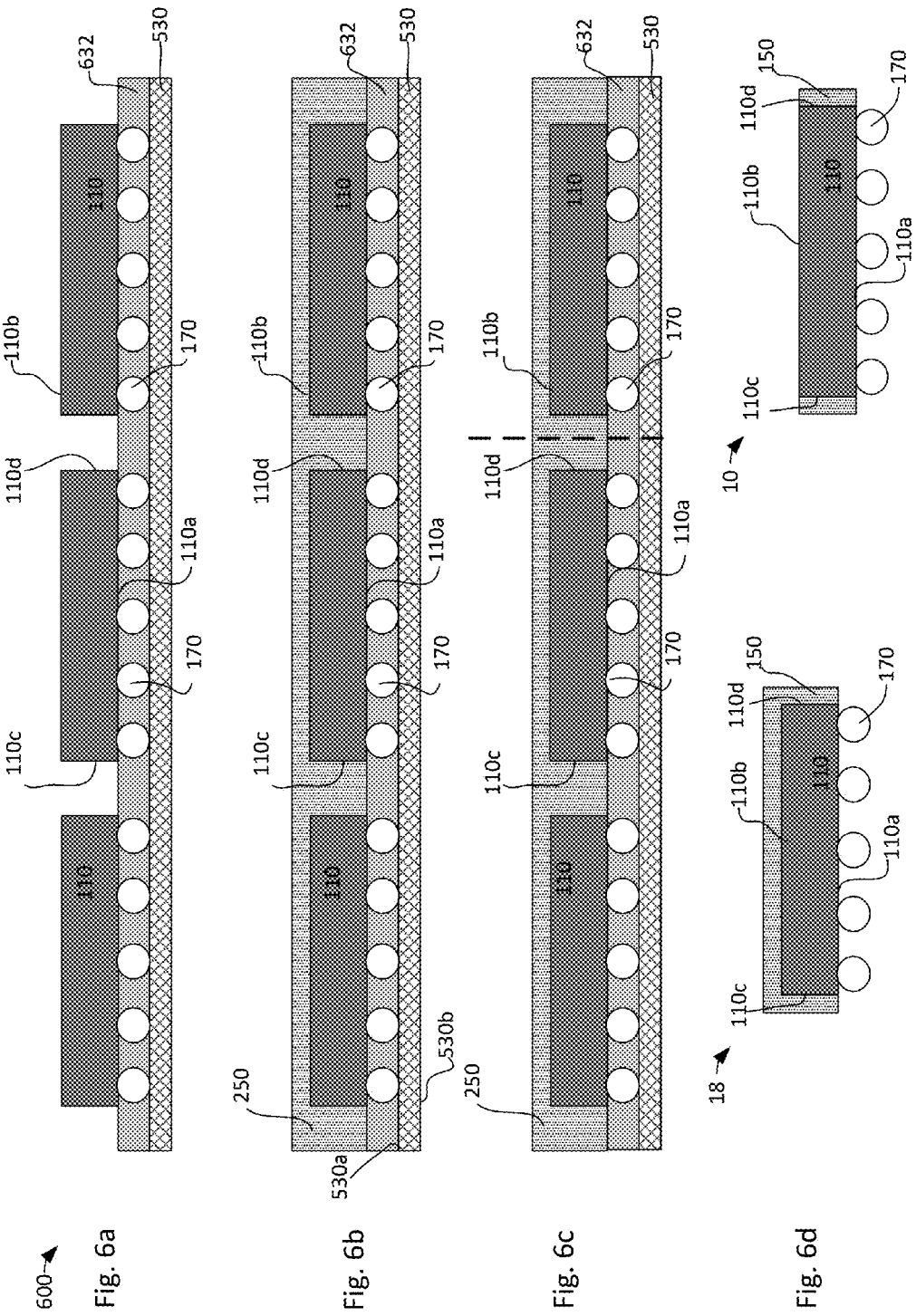

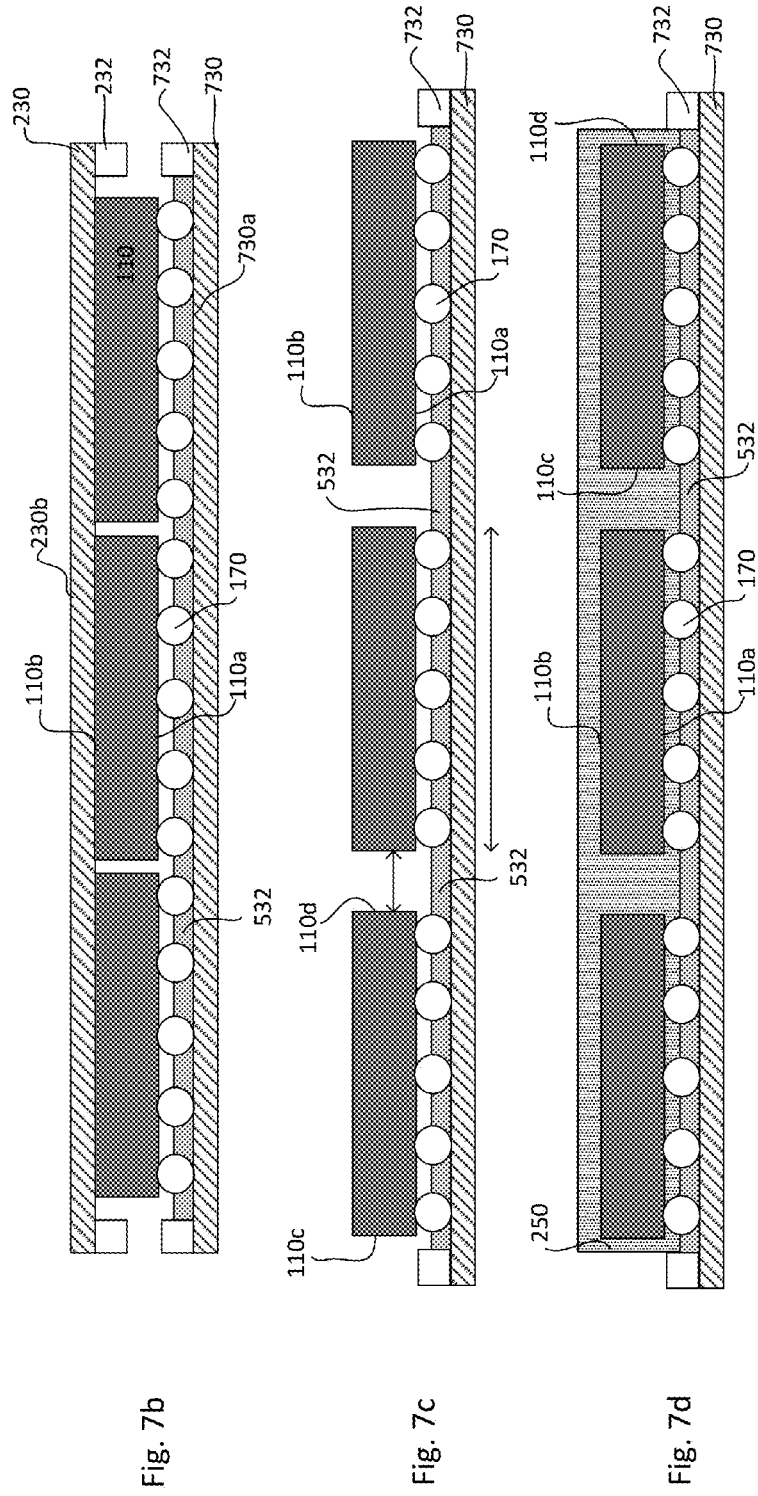

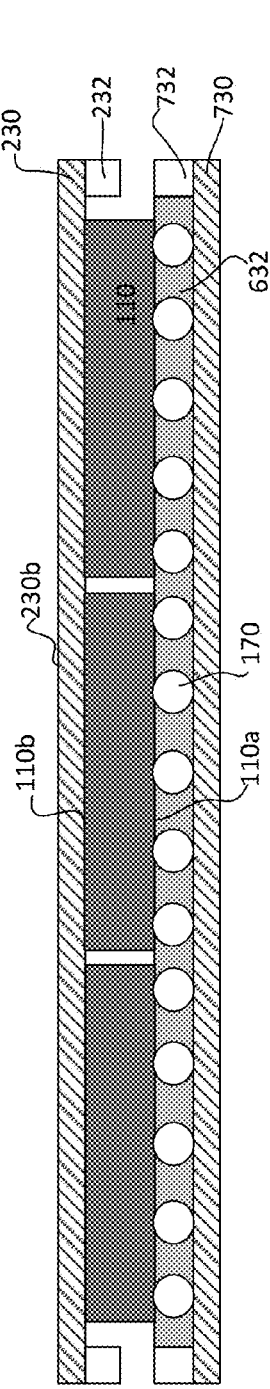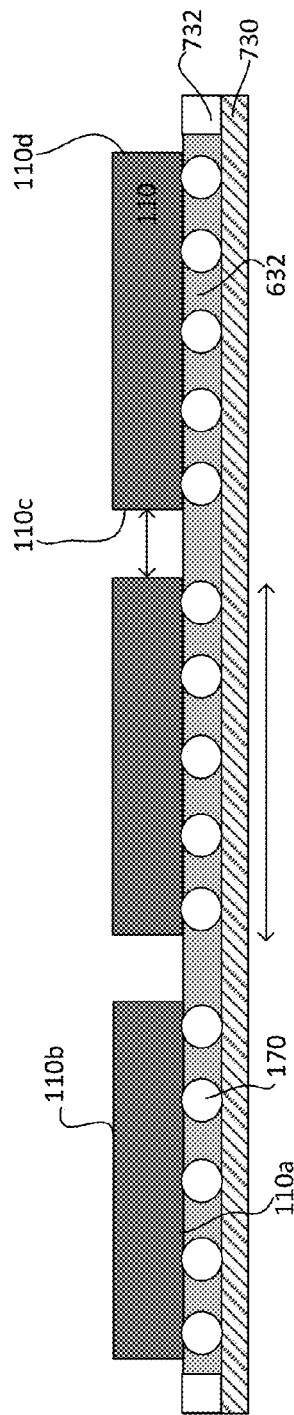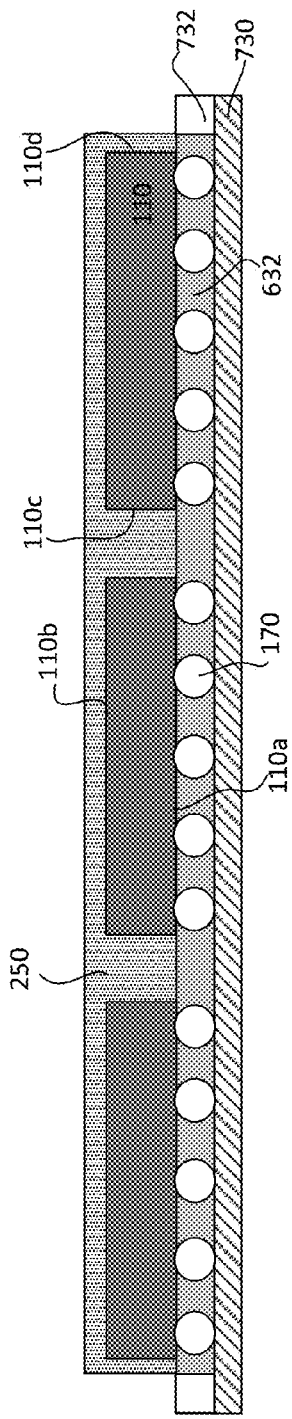
Fig. 8a
Fig. 8b
Fig. 8c

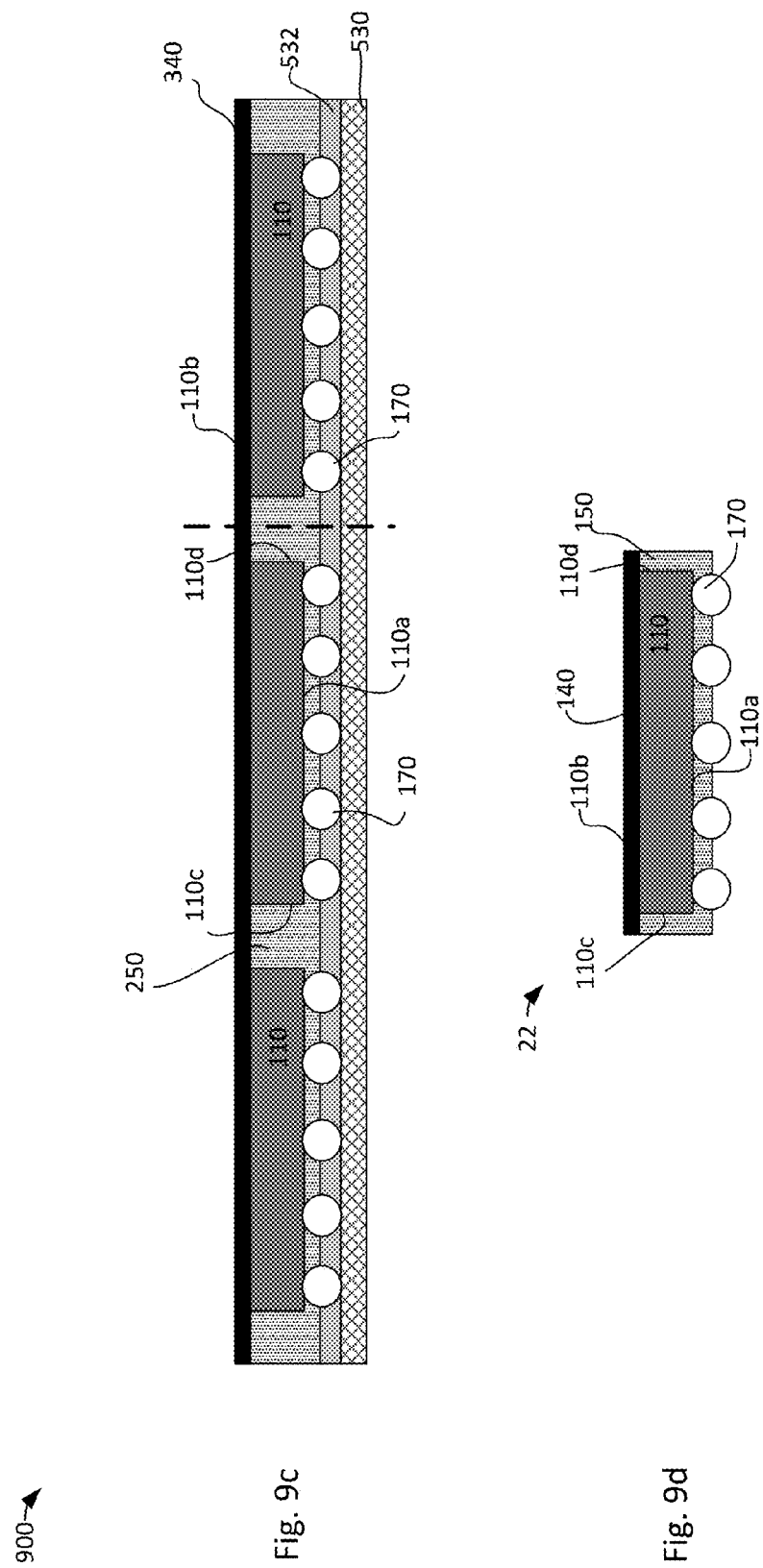

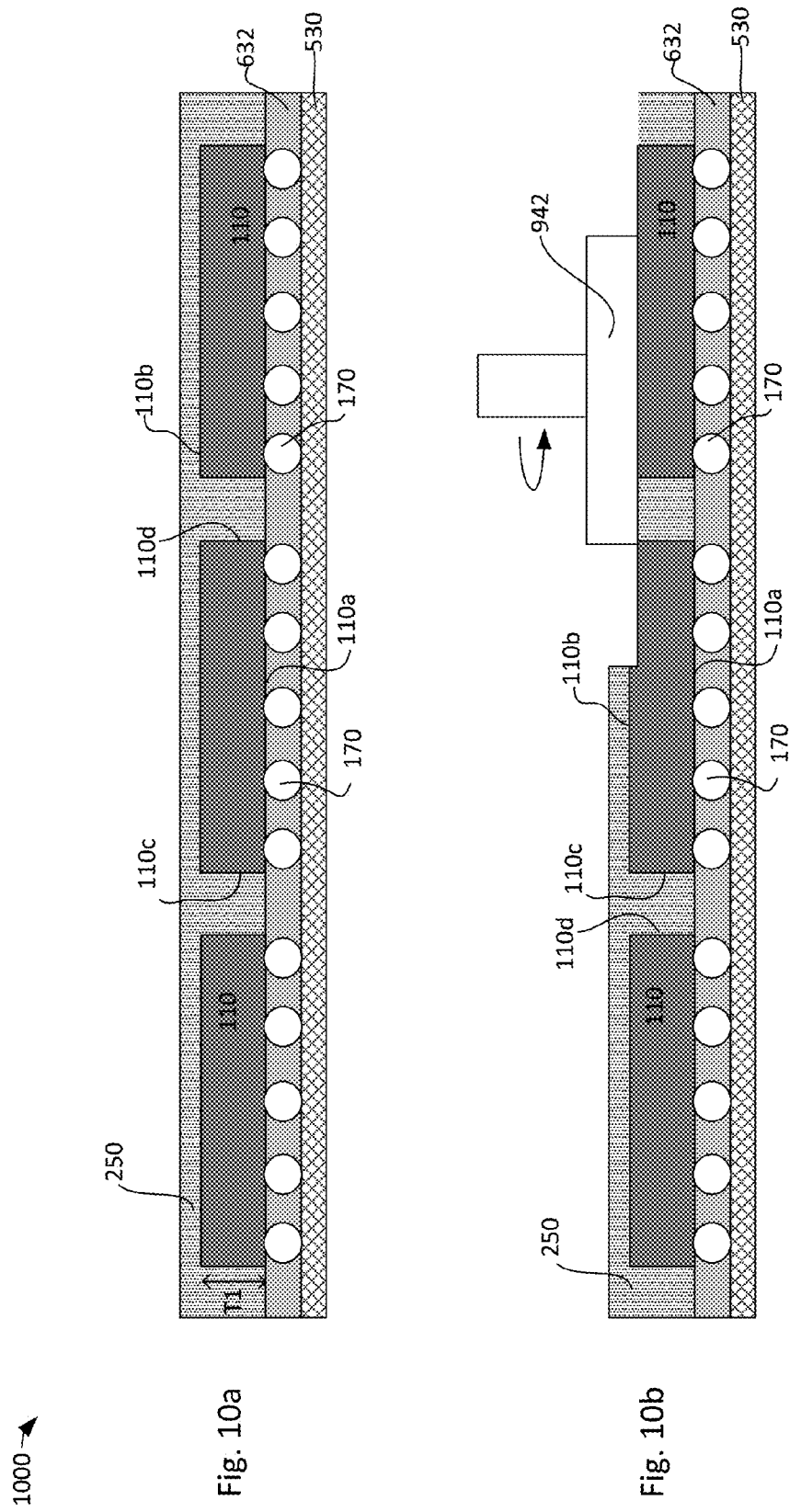

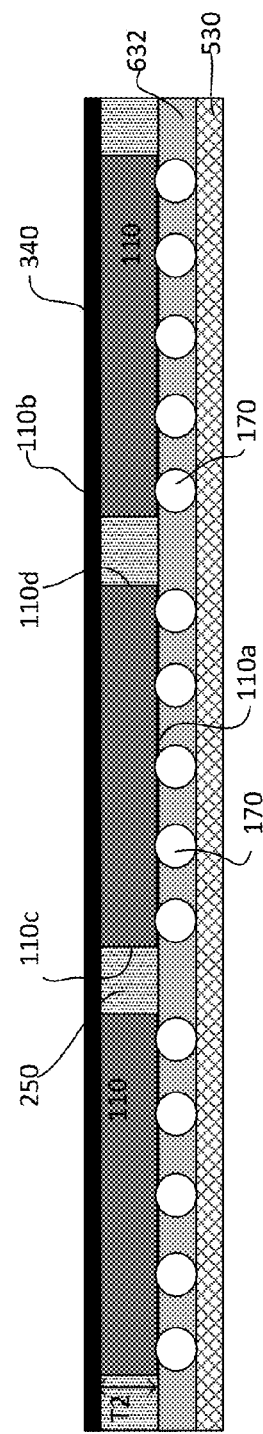
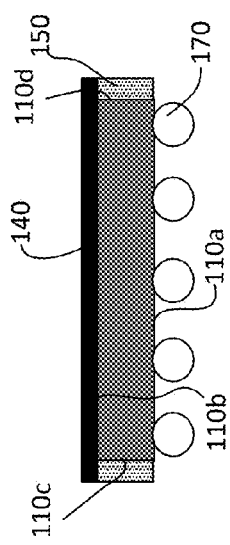
Fig. 10c
Fig. 10d

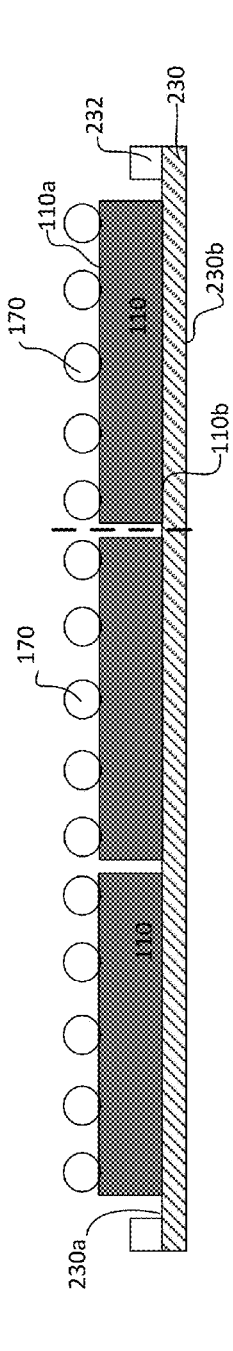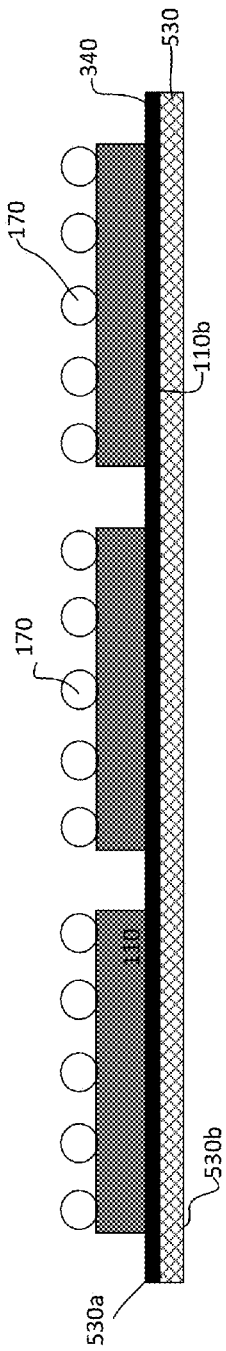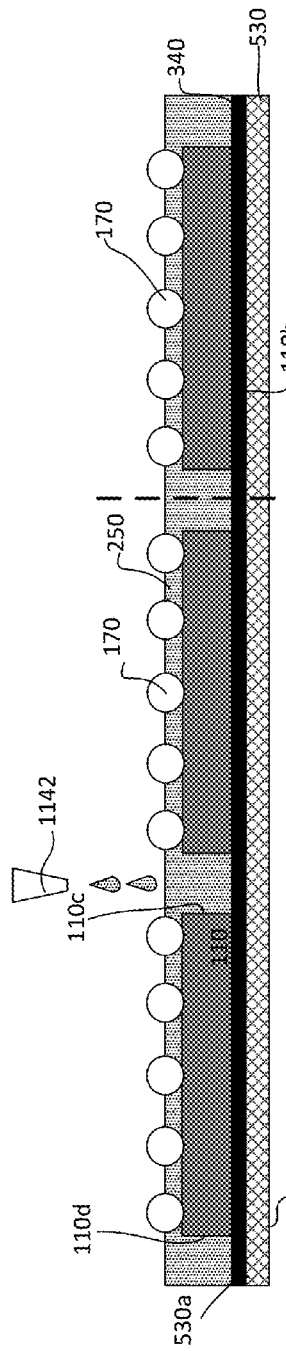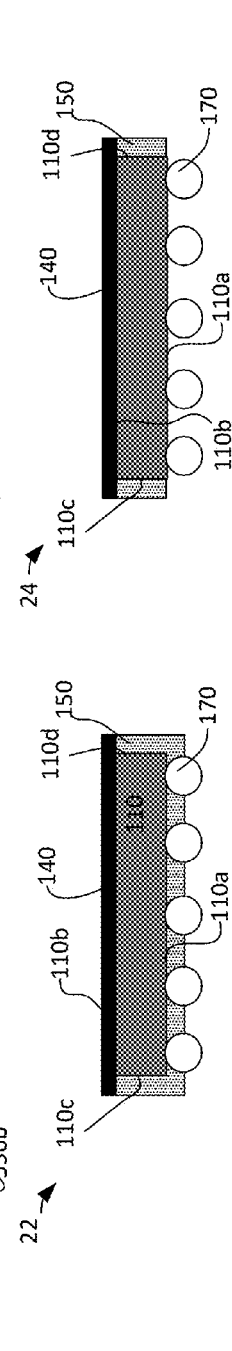

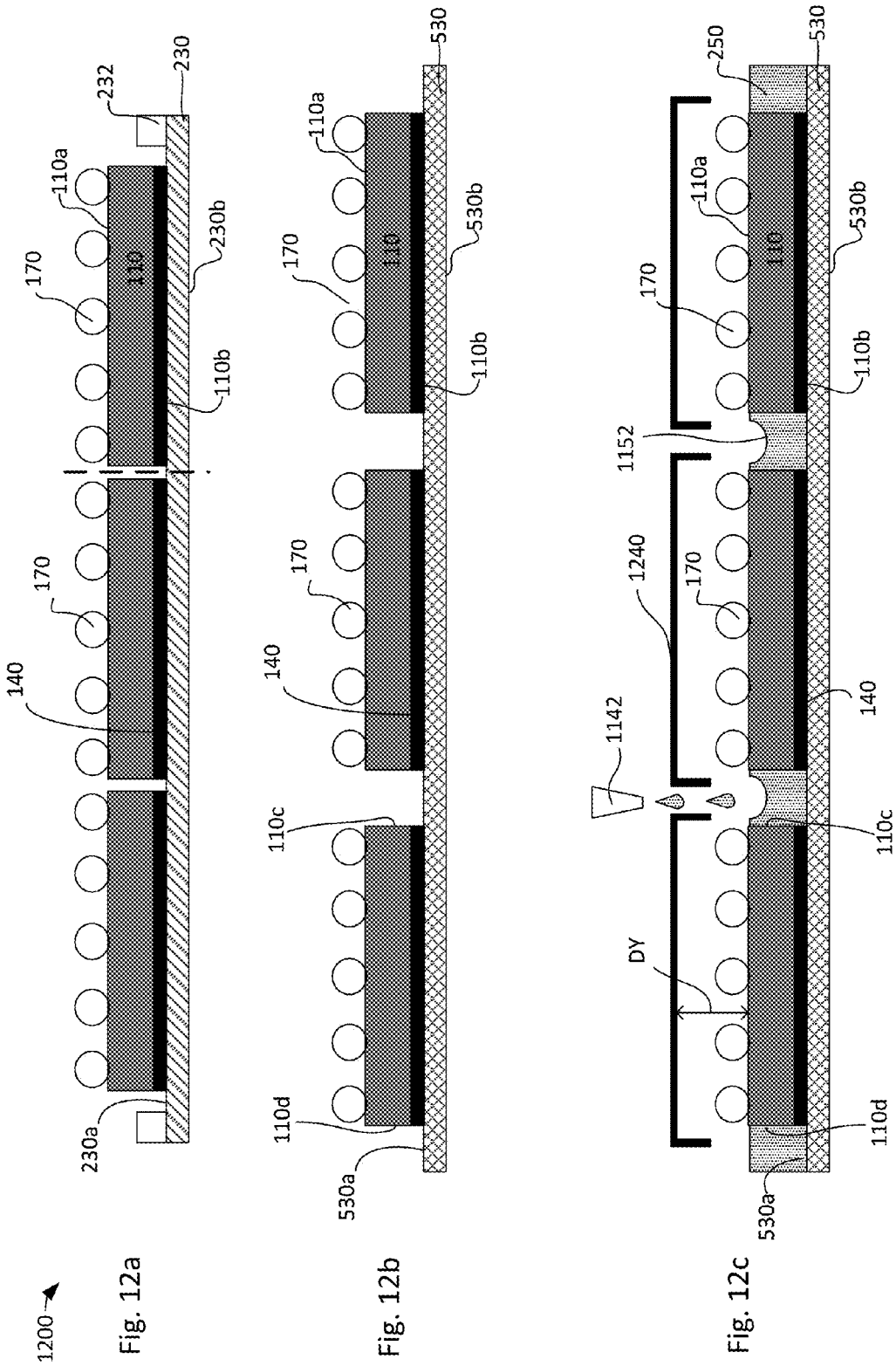

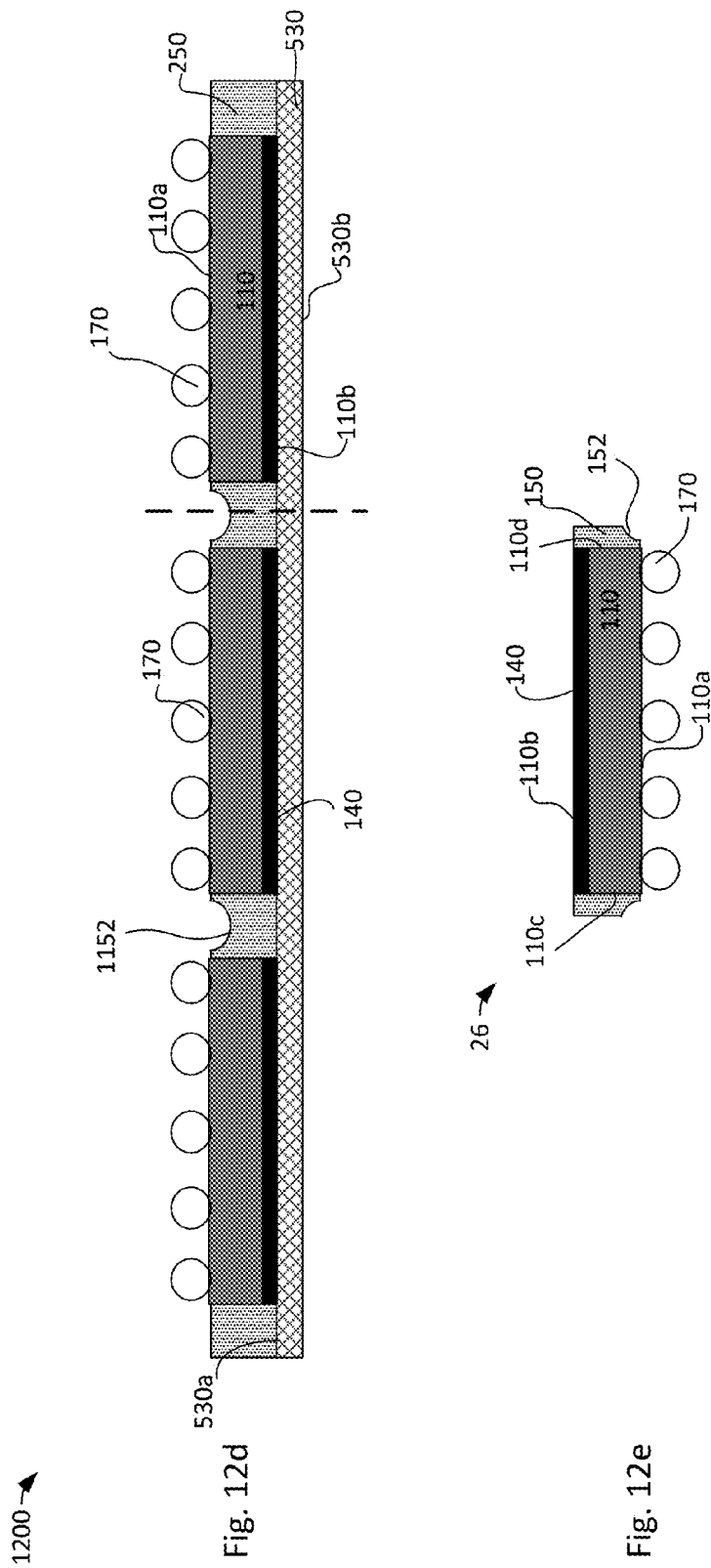

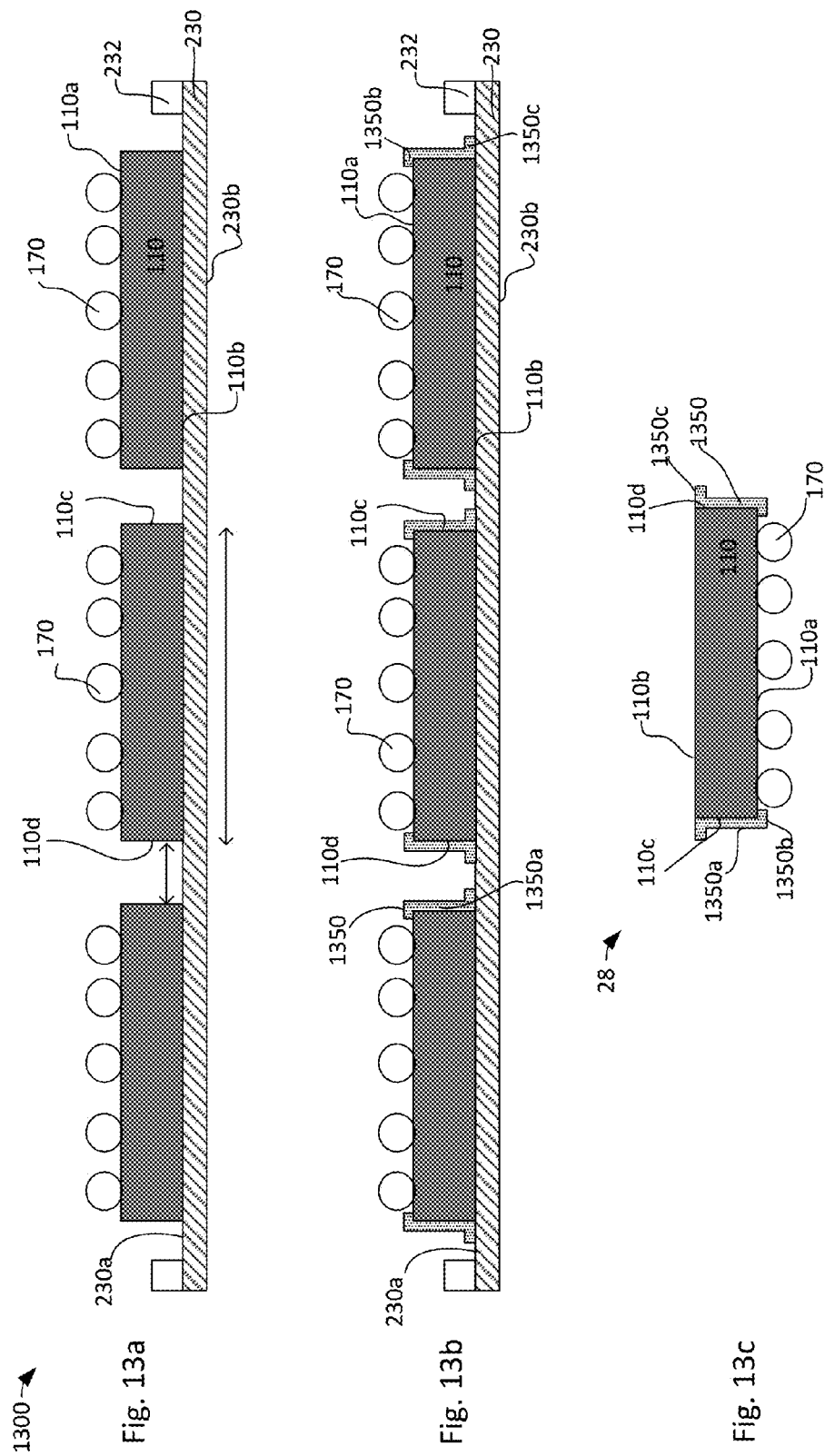

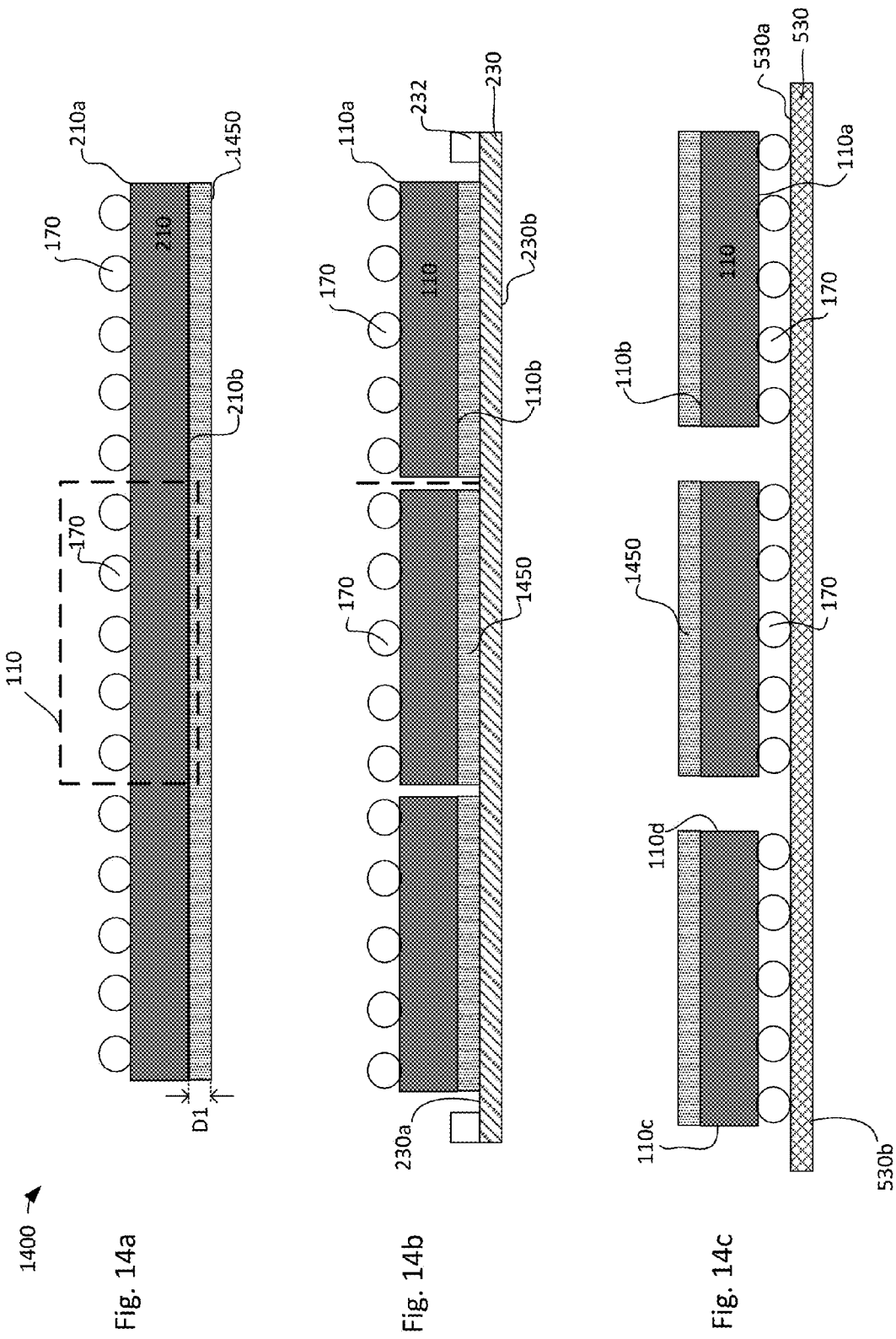

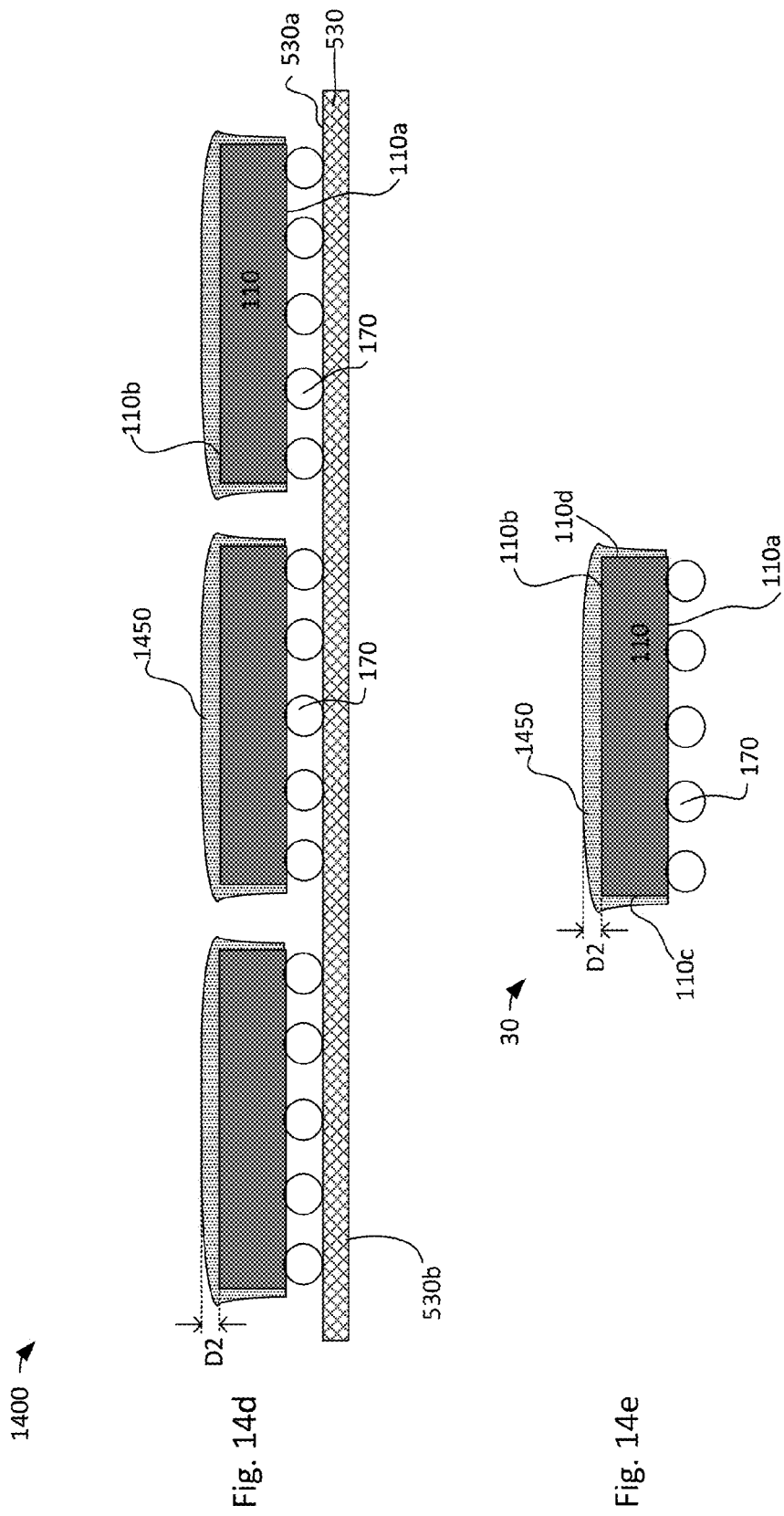

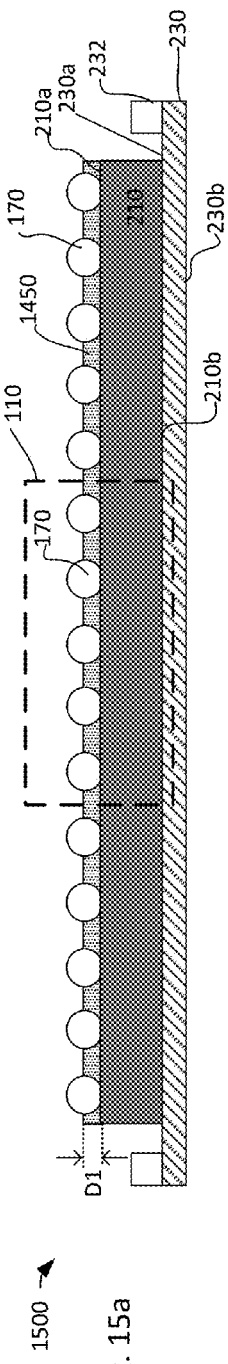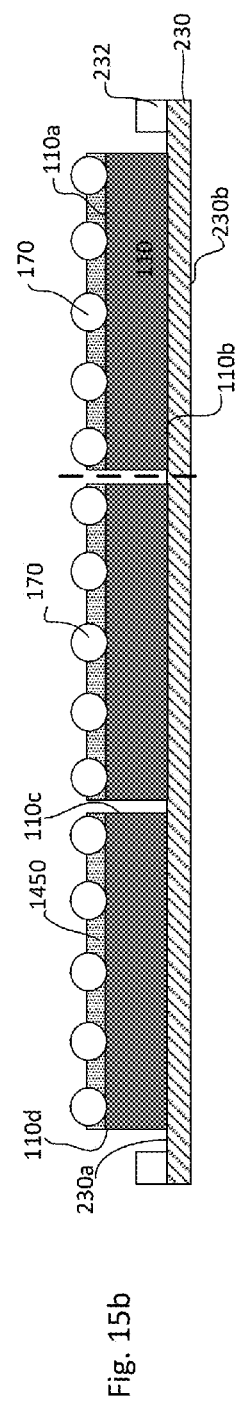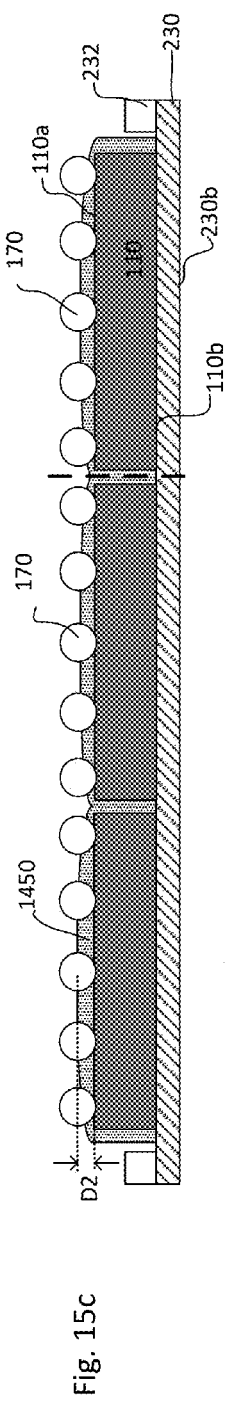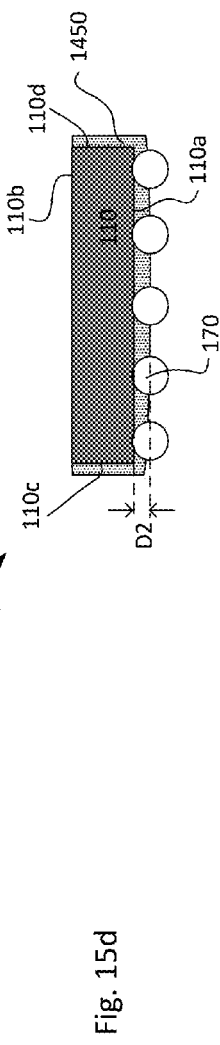
Fig. 15a
Fig. 15b
Fig. 15c
Fig. 15d

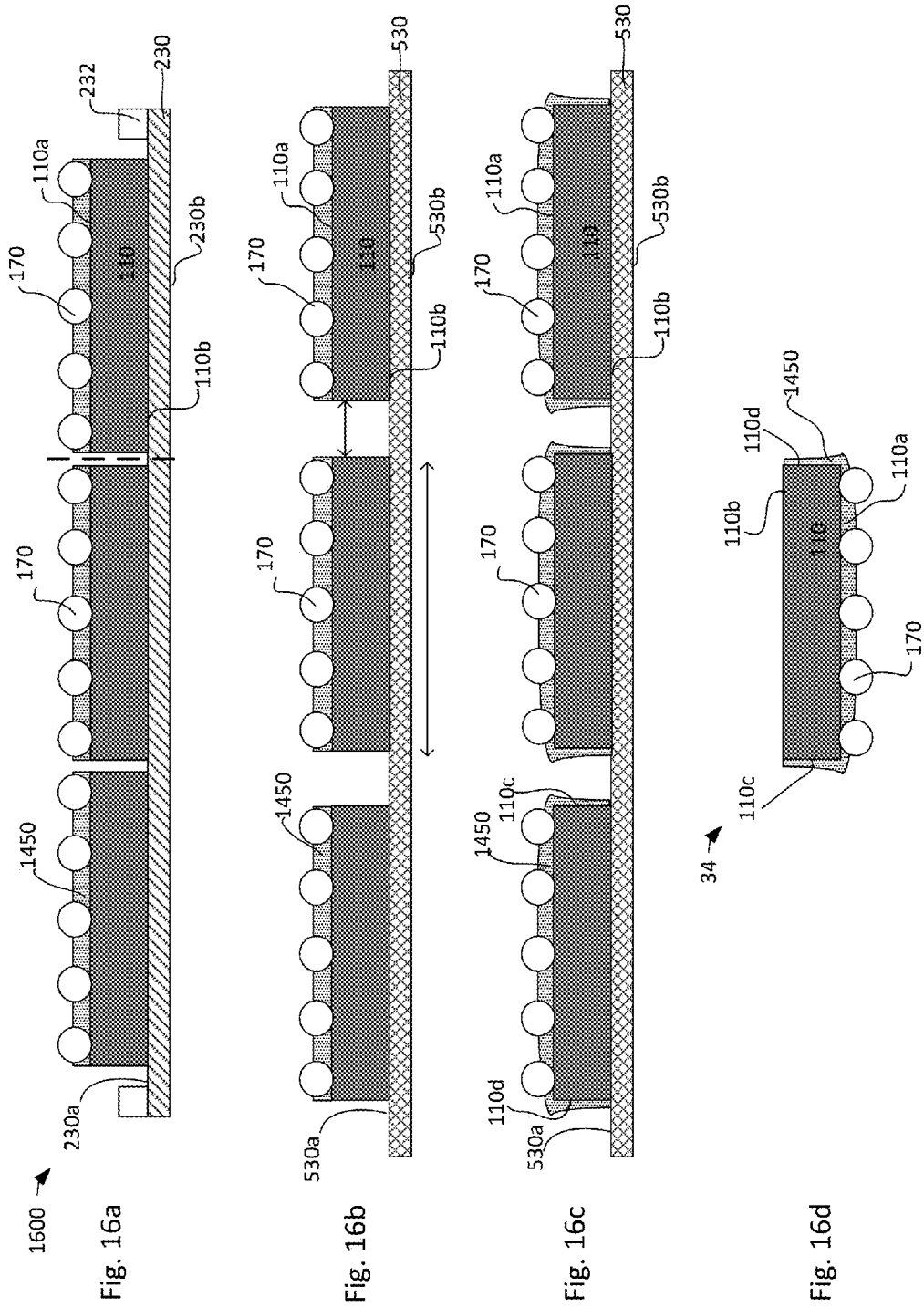

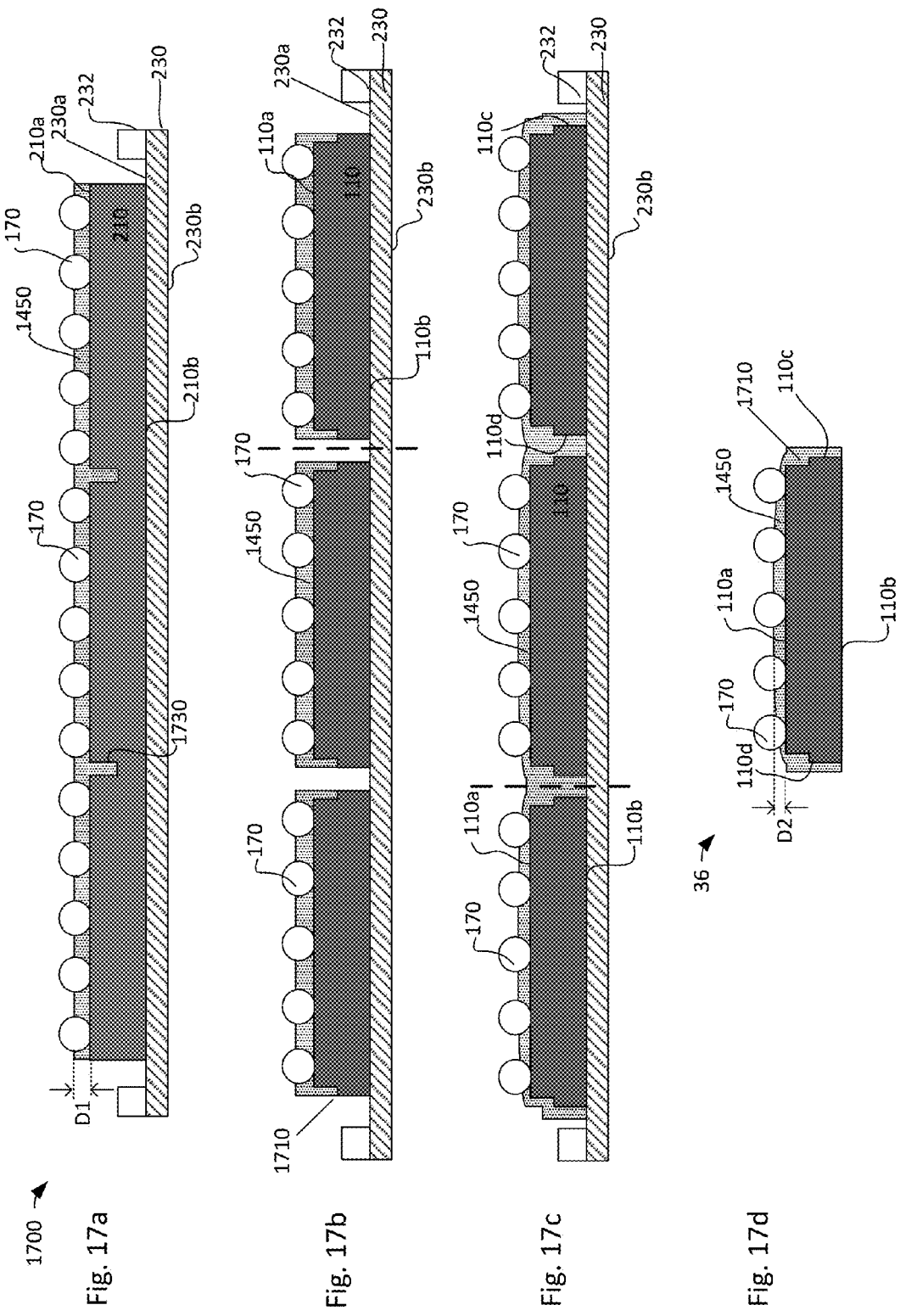

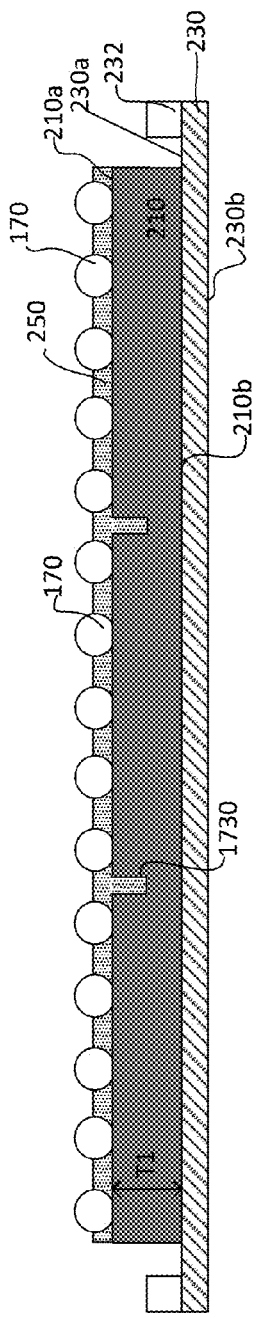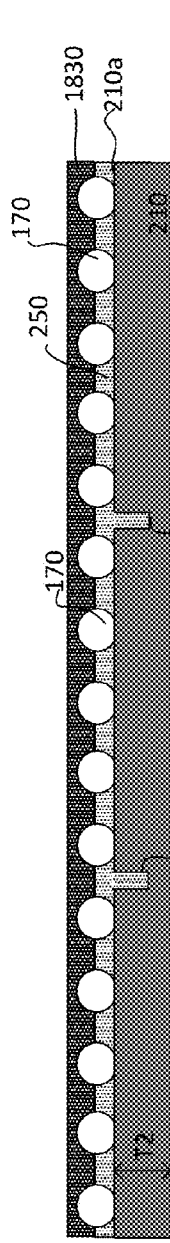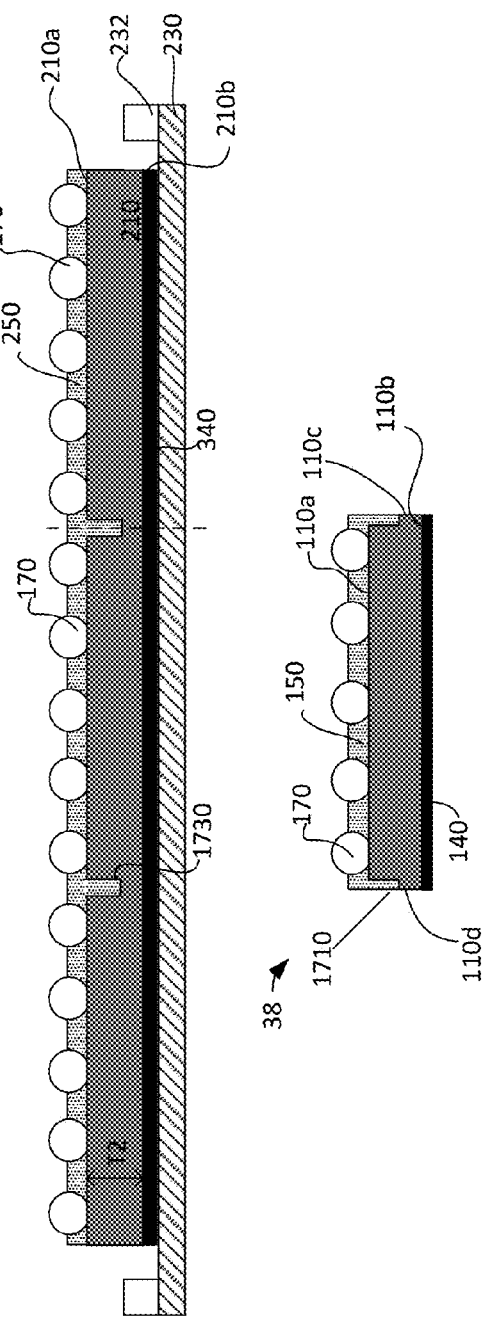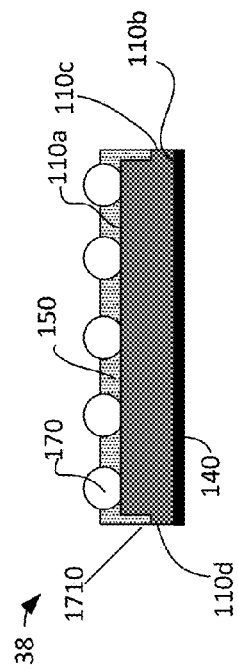
Fig. 19a
Fig. 19b
Fig. 19c
Fig. 19d

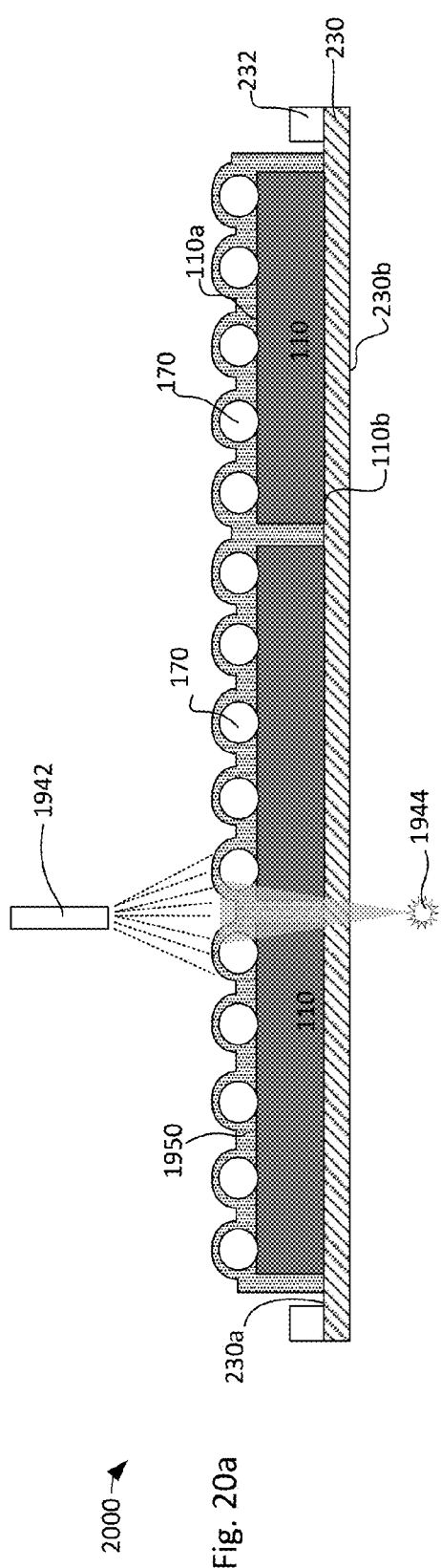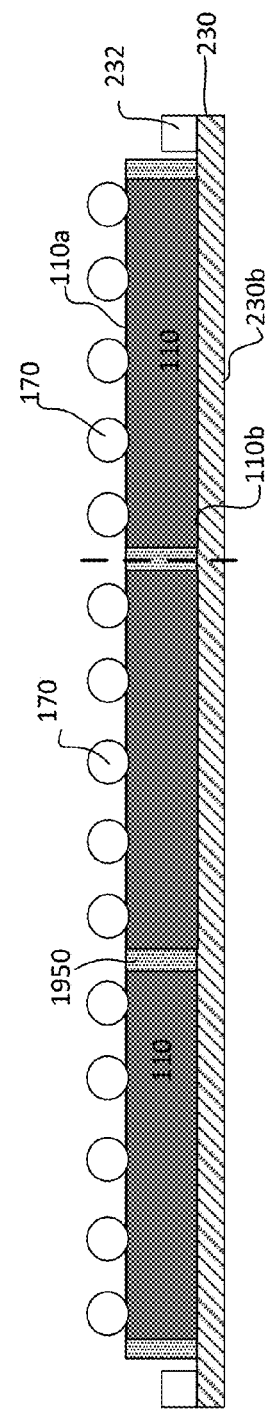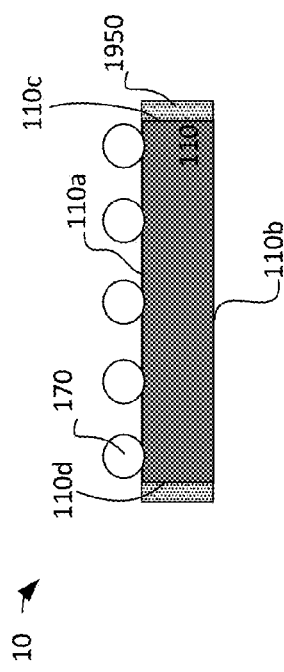
Fig. 20a
Fig. 20b
Fig. 20c

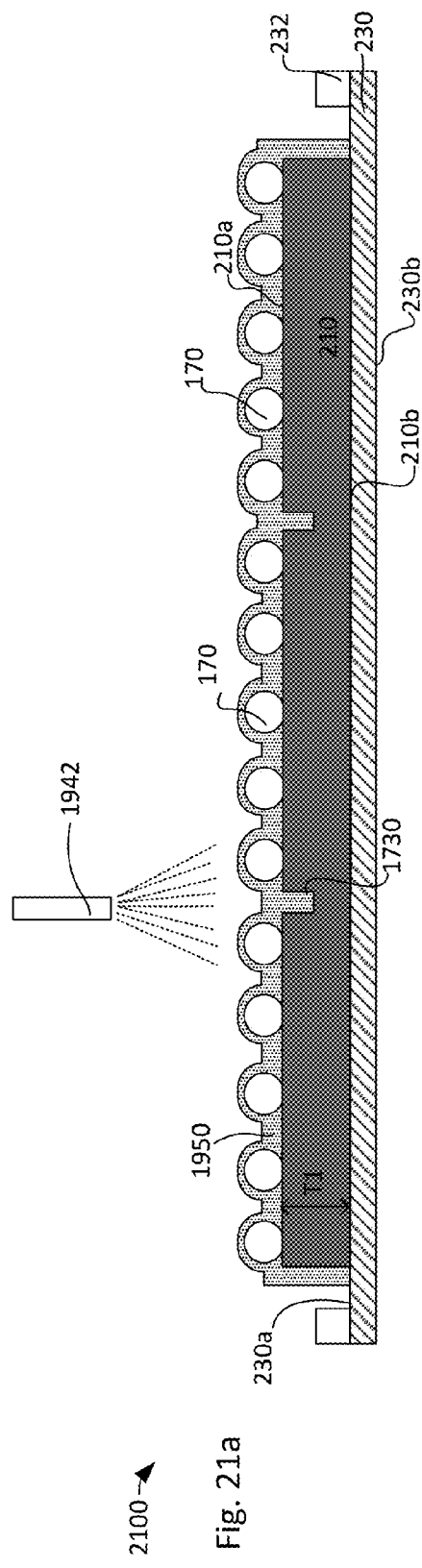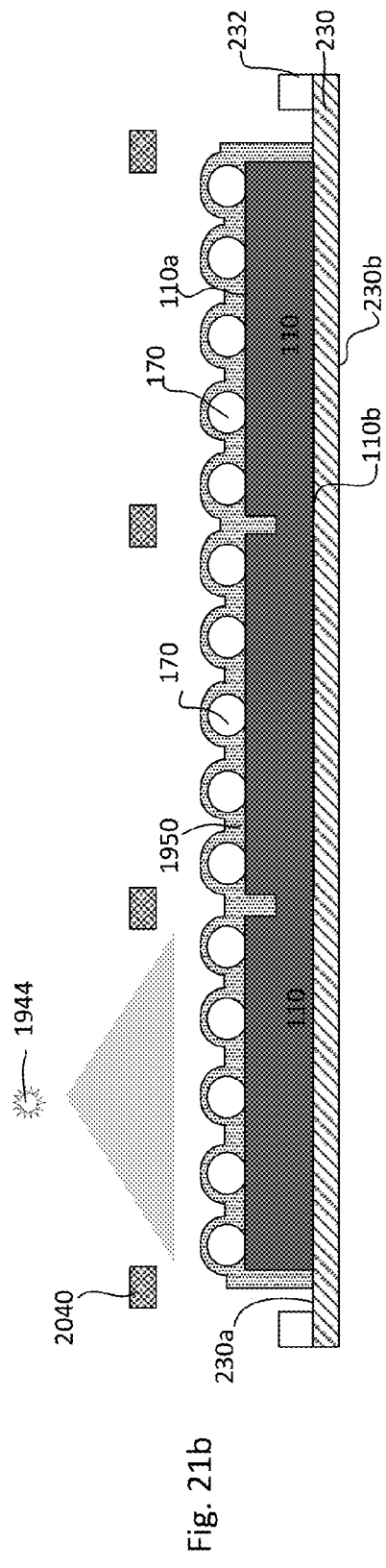

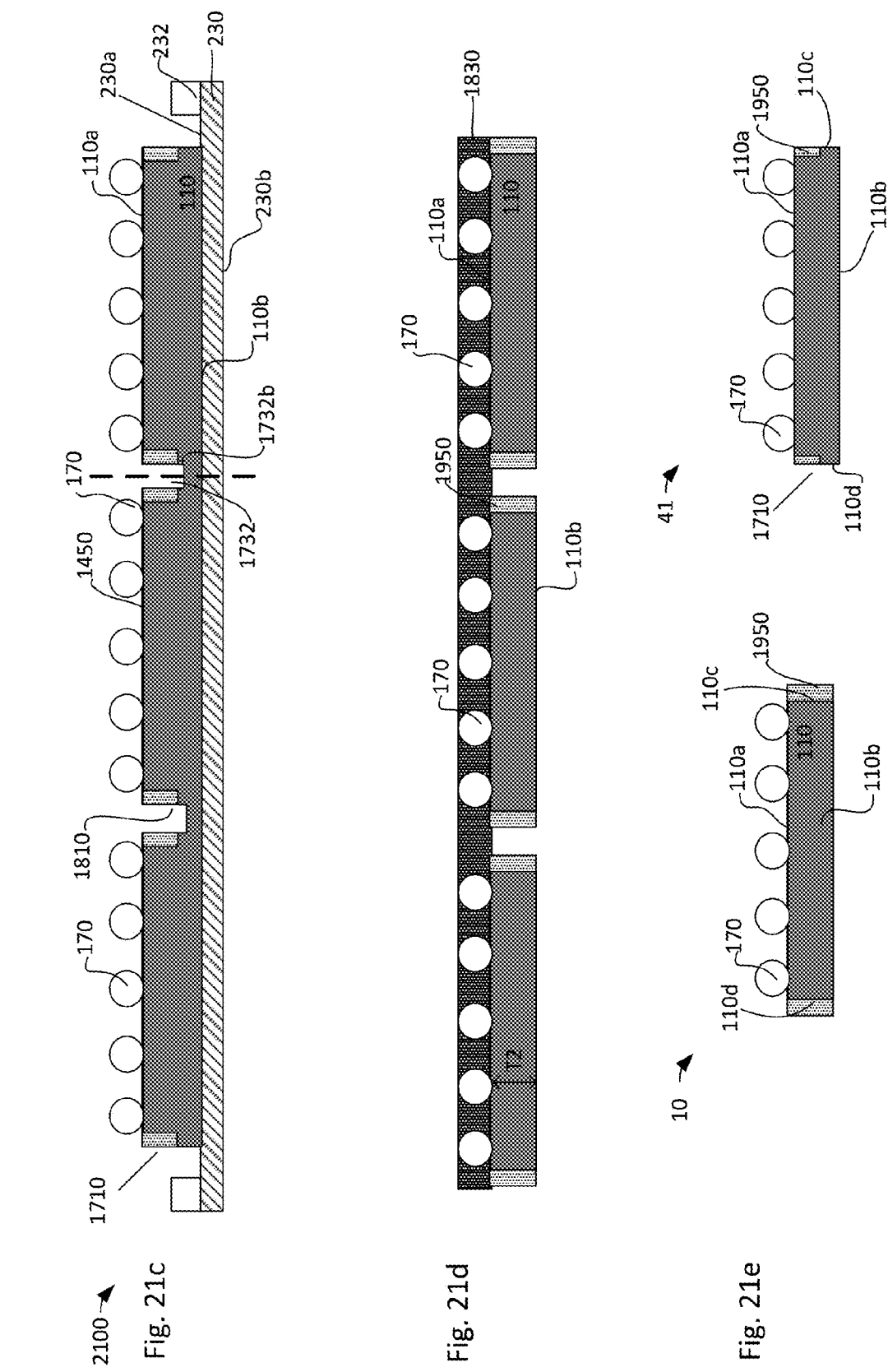

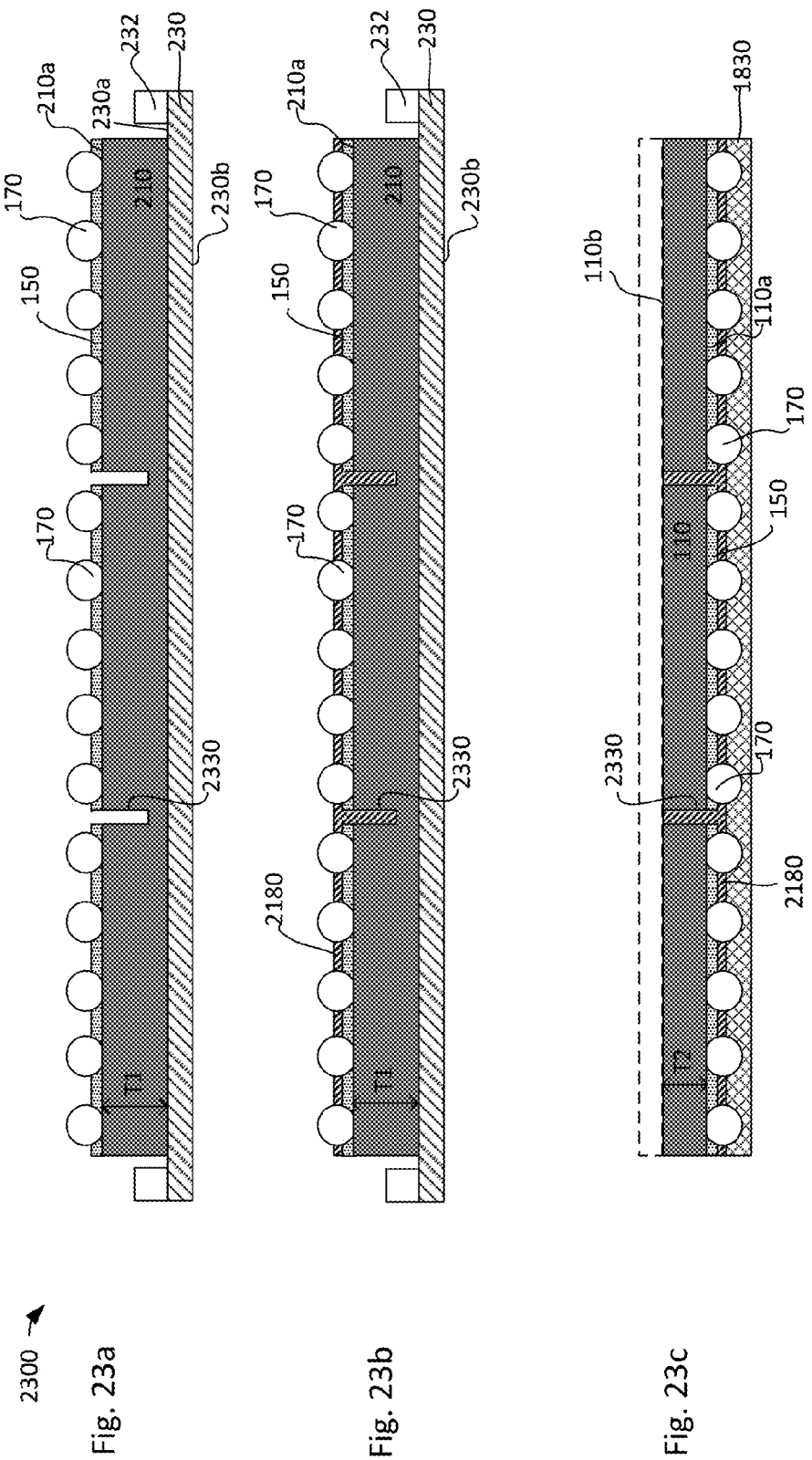

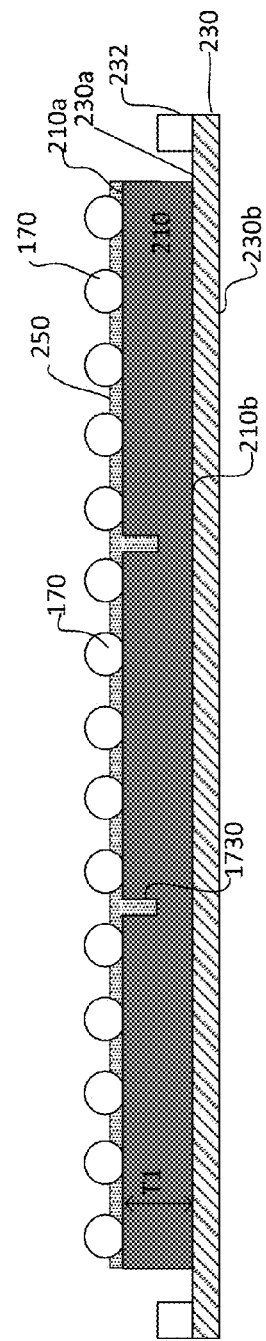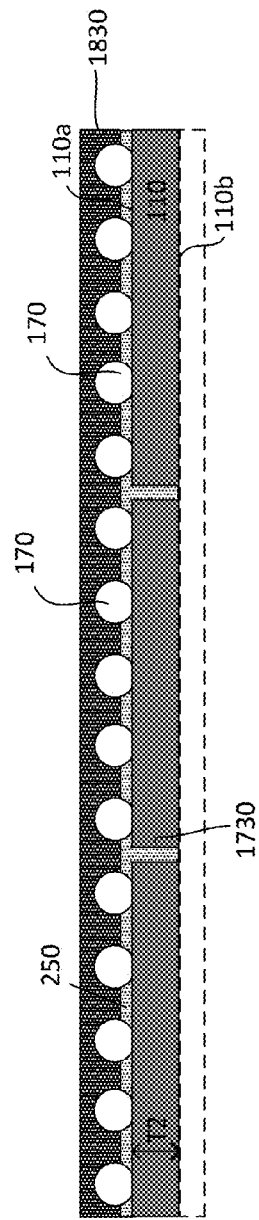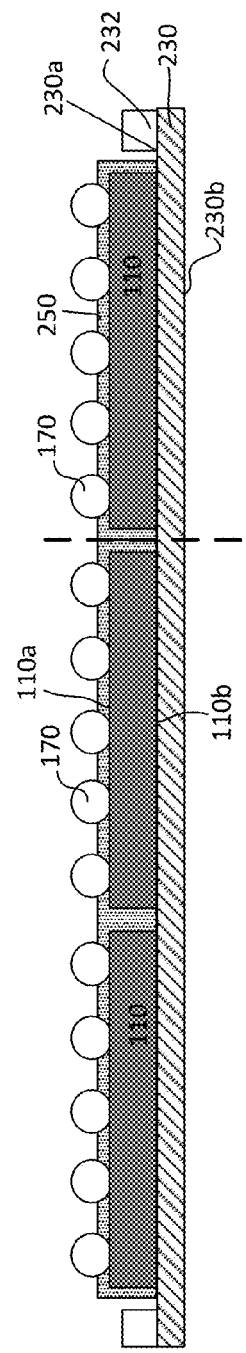
Fig. 24a
Fig. 24b
Fig. 24c

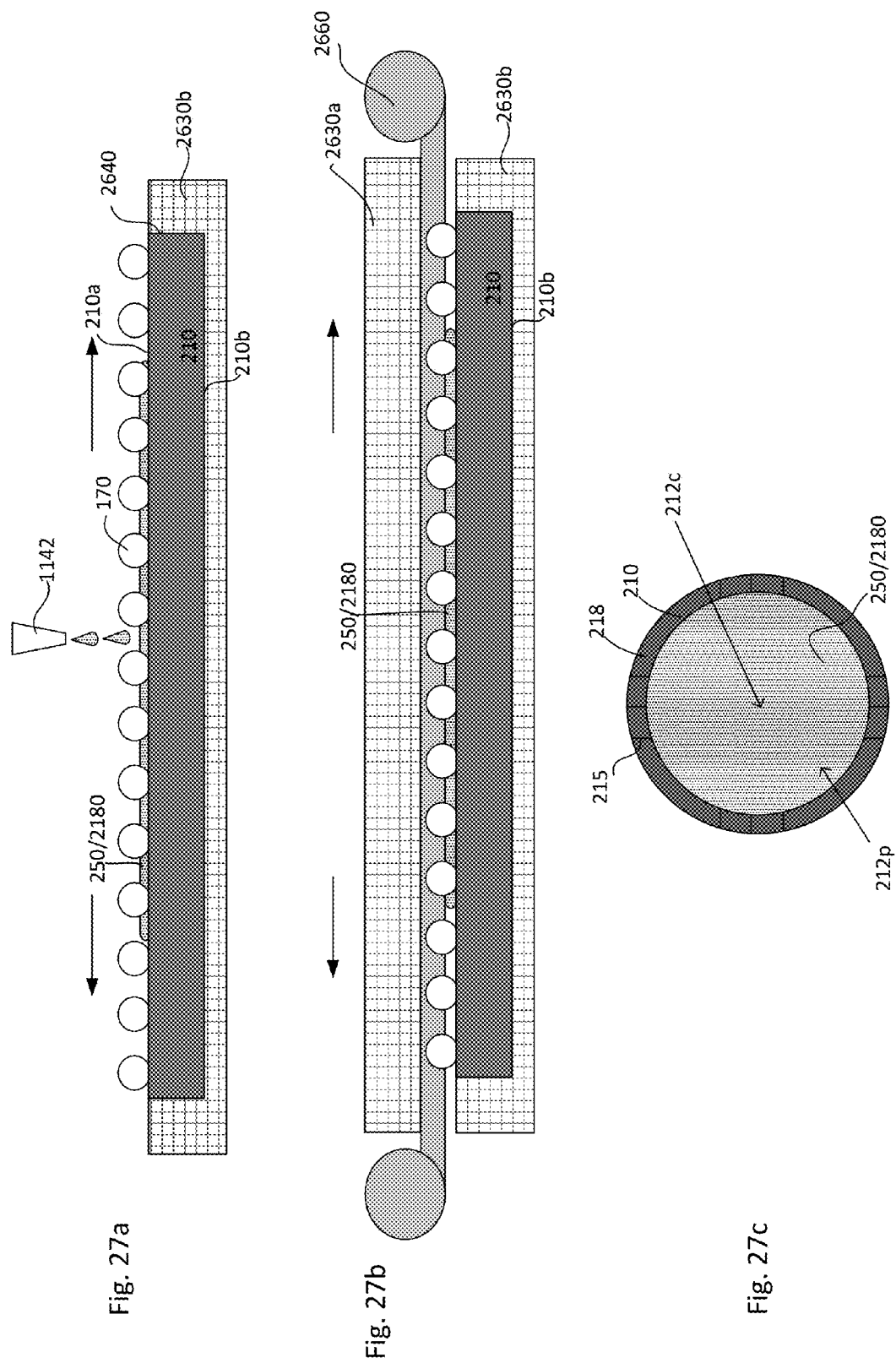

SEMICONDUCTOR PACKAGES AND METHODS OF PACKAGING SEMICONDUCTOR DEVICES

CROSS-REFERENCE TO RELATED APPLICATIONS

This application is a divisional application which claims the benefit of co-pending U.S. patent application Ser. No. 14/731,484, filed on Jun. 5, 2015, which claims the benefits of U.S. Provisional Application No. 62/009,309 entitled "WLCSP Having Protective Layer Thereon" filed on Jun. 8, 2014, U.S. Provisional Application No. 62/037,128 entitled "WLCSP Having Protective Layer Thereon" filed on Aug. 14, 2014 and U.S. Provisional Application No. 62/081,541 entitled "WLCSP Sidewall Protection" filed on Nov. 18, 2014, the disclosures of which are herein incorporated by reference in their entireties for all purposes.

BACKGROUND

Miniaturization of electronic products are driving the need for smaller size packages with high circuit density and more functionality. As such, there is a demand for higher packaging efficiency. The need for miniaturization motivates the use of advanced packages, such as wafer level chip scale packages (WLCSP). WLCSP are desired as it is about the same size or slightly larger than the die itself and therefore reduces the required board real estate compared to other types of packages. However, current WLCSP is susceptible to damage, such as crack and/or chipping which may be formed during wafer saw or package singulation. Such damage may cause the chip to fail to perform its desired function.

In view of the foregoing, there is a desire to provide reliable WLCSP as well as simplified and cost effective methods for forming these packages.

SUMMARY

Embodiments generally relate to semiconductor packages and methods for forming a semiconductor package. In one embodiment, a method for forming a semiconductor package is disclosed. The method includes providing a wafer having first and second major surfaces. The wafer is prepared with a plurality of dies and a plurality of external electrical contacts disposed on the first major surface of the wafer. The method includes processing the wafer. Processing the wafer includes separating the wafer into a plurality of individual dies. An individual die includes first and second major surfaces and first and second sidewalls, and the external electrical contacts are formed on the first major surface of the die. An encapsulant material is formed. The encapsulant material covers at least a portion of the first and second sidewalls of the die.

In another embodiment, a method for forming a semiconductor package is presented. The method includes providing a semiconductor die. The die includes first and second major surfaces and first and second sidewalls, and external electrical contacts formed on the first major surface of the die. An encapsulant material is formed. The encapsulant material covers at least a portion of the first and second sidewalls of the die.

In yet another embodiment, a semiconductor package is disclosed. The semiconductor package includes a semiconductor die. The die includes first and second major surfaces and first and second sidewalls, and a plurality of external electrical contacts disposed on the first major surface of the die. The semiconductor package includes an encapsulant material. The encapsulant material is disposed over and covers at least a portion of the first and second sidewalls of the die.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1a-1u show various embodiments of a semiconductor package, and

FIGS. 2a-2f, FIGS. 3a-3f, FIGS. 4a-4d, FIGS. 5a-5e, FIGS. 6a-6d, FIGS. 7a-7d, FIGS. 8a-8c, FIGS. 9a-9d, FIGS. 10a-10d, FIGS. 11a-d, FIGS. 12a-12e, FIGS. 13a-13c, FIGS. 14a-14e, FIGS. 15a-15d, FIGS. 16a-16d, FIGS. 17a-17d, FIGS. 18a-18d, FIGS. 19a-19d, FIGS. 20a-20c, FIGS. 21a-21e, FIGS. 22a-22d, FIGS. 23a-23e, FIGS. 24a-24f and FIGS. 25a-25d show various embodiments of a process for forming a semiconductor package;

FIGS. 27a-27b show another embodiment of a film-assisted molding process while FIG. 27c shows a top view of a wafer substrate with encapsulation layer formed thereon.

DESCRIPTION

Figure 2A:
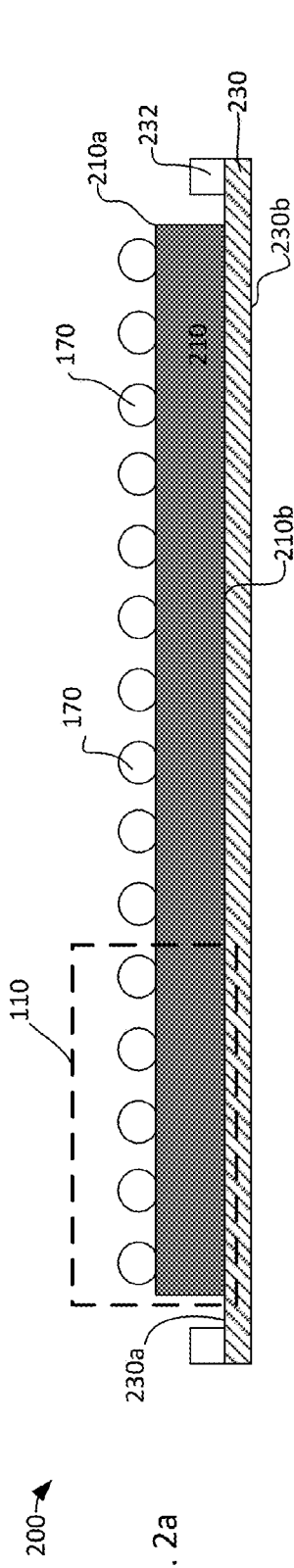

Embodiments relate to semiconductor packages and methods for forming a semiconductor package. The packages, for example, include wafer level chip scale packages (WLCSP) having about the same size or slightly larger than the singulated chip itself. The packages, as will be described later, include an encapsulation material which may include a single or multiple encapsulant layers formed thereon. The encapsulant material serves as a protection layer which prevents or minimizes damage to the semiconductor chip or die. The die, for example, may include memory device, logic device, communication device, optoelectronic device, digital signal processor (DSP), microcontroller, system-on-chips (SOC) as well as other suitable types of devices or a combination thereof. Such packages may be incorporated into electronic products or equipment, such as phones, computers as well as mobile and mobile smart products. Incorporating the packages into other types of products may also be useful.

FIG. 1a shows a simplified cross-sectional view of an embodiment of a semiconductor package 10. The package 10, in one embodiment, includes a WLCSP having a size slightly larger than the singulated chip or die itself. The package, in one embodiment, includes a die 110. The die can be a semiconductor die or chip. The die, for example, may be any type of integrated circuit (IC), such as a memory device including a dynamic random access memory (DRAM), a static random access memory (SRAM) and various types of non-volatile memories including programmable read-only memories (PROM) and flash memories, an optoelectronic device, a logic device, a communication device, a digital signal processor (DSP), a microcontroller, a system-on-chip, as well as other types of devices. The die 110 includes circuit components (not shown) such as transistors, resistors, capacitors and interconnections to form the IC.

The die 110 includes a first major surface 110a and a second major surface 110b. The first major surface, for example, is an active or frontside of the die and the second major surface is an inactive/passive or backside surface of the die. Other designations for the surfaces of the die may also be useful. The active surface 110a, for example, includes openings in a final passivation layer (not shown) to expose die contacts pads (not shown). The die contact pads provide connections to the circuitry of the die. The die contact pads, for example, are formed of a conductive material, such as copper, aluminum, gold, nickel or alloys thereof. Other types of conductive material may also be used for the die pads.

As described, openings are provided in the final passivation layer in which die contacts or external electrical contacts 170 are disposed. As shown in FIG. 1a, the external electrical contacts 170 are disposed in the openings on the first surface 110a of the die 110. The contacts 170, for example, are spherical shaped structures or balls. The external contacts protrude from the first surface of the die. The external contacts, for example, include solder balls. Other suitable types of external contacts, such as but not limited to copper pillars or gold stud bumps, may also be useful.

The package 10 may be electrically coupled to an external device (not shown), such as a circuit board, by the external electrical contacts 170.

In one embodiment, the package 10 is provided with an encapsulation material or layer. The encapsulant material may include any suitable dielectric material 150, such as but not limited to mold compound, epoxy, silicone or silicone based material or photosensitive material 1950. The encapsulant material 150/1950, in one embodiment, includes sufficient thickness and serves as a protective layer to protect the die 110 from crack/chipping during, for example, package singulation, assembly, logistic transfer after assembly process or electrically coupling to an external device (not shown), such as a circuit board later. In one embodiment, at least first and second sidewalls or lateral side surfaces 110c and 110d of the die 110 are fully covered by the encapsulant material 150/1950. The first and second sidewalls of the die, for example, include vertical sidewall profile. The encapsulant material 150/1950, for example, covers the sidewalls 110c-110d but not the first and second major surfaces 110a and 110b of the die as shown in package 10. Other suitable configurations of the encapsulant material or layer may also be useful as will be described later.

FIGS. 1b-1u show various embodiments of a semiconductor package. The semiconductor package, as shown in FIGS. 1b-1u, is similar to that described in FIG. 1a. In the interest of brevity, common elements or elements having the same reference numerals may not be described or described in detail. As such, the description below primarily focuses on the difference(s) between the packages.

The package 12 shown in FIG. 1b is similar to that described in FIG. 1a. Referring to FIG. 1b, the encapsulant material 150, in one embodiment, is a single encapsulant layer which covers the sidewalls 110c-110d and first surface 110a of the die as shown in package 12. As shown, the portion of the encapsulant layer 150 which is disposed over the first surface of the die includes a thickness which is less than a height of the electrical contacts 170 so that the electrical contacts are protruded from the encapsulant layer to provide external connections. FIG. 1c shows another embodiment of a package 14. The package 14, in one embodiment, includes a backside protective layer 140 disposed over the second surface 110b of the die 110. The backside protective layer, for example, includes thermoplastic polymer based resin film with thermosetting type of adhesive thereon. In one embodiment, the encapsulant material 150 at least covers the first and second sidewalls or lateral side surfaces 110c-110d of the die 110 and side surfaces of the backside protective layer 140 as shown in package 14. In another embodiment, a package 16 includes an encapsulant material 150 which is a single encapsulant layer that covers the side surfaces of the backside protective layer 140 as well as side surfaces 110c-110d and the first surface 110a of the die as shown in FIG. 1d.

FIG. 1e shows another embodiment of a package 18. The package 18 differs from the package 10 in such a way that the encapsulant material 150 is a single encapsulant layer which covers the sidewalls 110c-110d and second surface 110b of the die, leaving the first surface of the die 110a exposed. In an alternate embodiment, the encapsulant material 150 may be a single encapsulant layer which surrounds and covers all surfaces of the die and leaves portions of the external contacts protruded as shown by package 20 in FIG. 1f. For example, the encapsulant layer covers the first and second surfaces 110a-110b and side surfaces 110c-110d of the die as well as covering portions of the electrical contacts 170 nearer to the first surface of the die.

FIG. 1g shows another embodiment of a package 22. The package 22 is different from the package 10 in that it includes a backside protective layer 140 which is disposed over the second surface 110b of the die 110. The package 22 includes an encapsulant material 150 which is a single encapsulant layer, covering side surfaces 110c-110d and active surface 110a of the die and portions of the electrical contacts 170. As shown, the backside protective layer 140 also covers surfaces of the encapsulant layer 150 which are substantially coplanar with the second surface of the die. As for the package 24 shown in FIG. 1h, it differs from the package 22 in that the encapsulant material 150 covers the side surfaces 110c-110d of the die without covering the first surface 110a of the die.

FIG. 1i shows another embodiment of a package 26. The package 26 is similar to the package 14 shown in FIG. 1c. However, the package 26 differs from the package 14 in that portion of the encapsulant material 150 nearer to the external contacts 170 includes a substantially arc shape profile 152. FIG. 1j shows another embodiment of a package 28 having different configuration for the encapsulant layer. As shown, the package 28 includes an encapsulant layer 1350 having a vertical portion 1350a and first and second lateral extended portions 1350b-1350c. The vertical portion 1350a is disposed over the sidewall 110c or 110d of the die and the first lateral extended portion 1350b extends to peripheral portion of the first surface 110a of the die. As for the second lateral extended portion 1350c, it extends outward and away from the die and has a top surface which is substantially coplanar with the second surface 110b of the die.

FIGS. 1k-1n show various embodiments of a package. In one embodiment, the package shown in FIGS. 1k-1n differs from those described in FIGS. 1a-1j in that the encapsulant material/layer 1450 includes any suitable dielectric material which is flowable when subjected to a treatment later. For example, the encapsulant material 1450, includes a flowable polymeric material. As shown in FIG. 1k, the encapsulated package 30 includes an encapsulant material 1450 that covers both the second surface 110b and sidewalls 110c-110d of the die. In one embodiment, the thickness of the encapsulant material 1450 is non-uniform across the second surface of the die. The encapsulant material 1450 over the second surface 110b, for example, includes a convex profile. Similarly, portions of the encapsulant material 1450 disposed over the sidewalls 110c-110d of the die also include non-uniform thickness. As shown, surface 1450s of the encapsulant material over sidewalls 110c-110d of the die includes non-planar surface profile.

Referring to FIG. 1l, the encapsulated package 32 differs from the package 30 in that it includes an encapsulant material 1450 that covers both the first surface 110a and sidewalls 10c-110d of the die. In one embodiment, the thickness of the encapsulant material is non-uniform across the first surface 110a of the die. For example, the encapsulant material 1450 over the first surface 110a includes a convex profile. On the other hand, the surface of the encapsulant material 1450 over the sidewalls 110c-110d of the die includes substantially straight profile as shown in FIG. 1l.

The encapsulated package 34, as shown in FIG. 1m, is similar to the package 32. For example, it includes an encapsulant material 1450 that covers both the first surface 110a and sidewalls 110c-110d of the die. The thickness of the encapsulant material is uneven across the first surface 110a of the die and has a convex profile. However, package 34 differs from package 32 in that the thickness of the encapsulant material is non-uniform across side surfaces 110c-110d of the die. For example, surface 1450s of the encapsulant material over sidewalls 10c-110d of the die includes non-planar surface profile.

As for the encapsulated package 36 shown in FIG. 1n, it differs from the package 30, 32 and 34 in that it includes a die having side surfaces 110c-110d with a step profile 1710. In one embodiment, the thickness of the encapsulant material 1450 is non-uniform across the first surface of the die, forming a convex surface profile. The encapsulant material 1450 over the sidewalls of the die may also include a step profile or substantially a straight profile as shown in FIG. 1n.

FIG. 1o shows another embodiment of a package 38. The package 38 also includes a die 110 of which its sidewalls 110c-110d include a step profile 1710. The package also includes a backside protective layer 140 which is disposed over the second surface 110b of the die. As shown, the encapsulation material 150, in one embodiment, is a single encapsulant layer which covers the active surface 110a of the die and the step portion of the sidewalls 110c-110d of the die. The encapsulant layer 150, as shown, does not cover the entire sidewalls 110c-110d of the die. As for package 40 shown in FIG. 1p, it is similar to the package 38, except that no backside protective layer is disposed on the second surface of the die. Referring to FIG. 1q, the package 41 is similar to the package 40, except that the encapsulant material 150/1950 covers the step portion of the sidewalls 110c-110d of the die without covering the active surface 110a of the die.

FIGS. 1r-1u show various embodiments of a package. The package, as shown in FIGS. 1r-1u includes an encapsulant material which includes first and second encapsulant layers/materials 150 and 180. The first and second encapsulant layers may include dielectric materials, such as epoxy, mold compound, silicone, or photosensitive material. In one embodiment, the package 42 as shown in FIG. 1r also includes a die having sidewalls with a step profile 1710. The first encapsulant layer 150 of package 42, as shown, covers the first surface 10a of the die while the second encapsulant layer 180 covers the first encapsulant layer 150 and a portion of the sidewalls 110c-110d of the die. For example, the second encapsulant layer is a single encapsulant layer which covers the first encapsulant layer and the step portions of the sidewalls of the dies.

As for package 44 shown in FIG. 1s, it includes a die 110 having sidewalls 110c-110d with vertical or straight profile. In one embodiment, the first encapsulant layer 150 covers the first surface 110a of the die while the second encapsulant layer 180 covers the first encapsulant layer 150 and the entire sidewalls 110c-110d of the die. As for the package 46 shown in FIG. 1t, it differs from the package 44 in that the first encapsulant layer 150 covers the first surface and sidewalls 110c-110d of the die while the second encapsulant layer 180 covers the first encapsulant layer 150. The first encapsulant layer 150, in one embodiment, includes a first thickness H1 over the first surface 110a of the die and a second thickness H2 over the sidewalls 110c-110d of the die. H1, for example, is about 15-20 μm and H2, for example, is about 12-18 μm. The second encapsulant layer 180 includes any suitable thickness dimension such that the total thickness of the first and second encapsulant layers over the first surface of the die is less than the height of the external contacts 170. For example, the second encapsulant layer includes a thickness H3. H3, for example, is about 80-120 μm. Other suitable thickness dimensions may also be useful.

Referring to FIG. 1u, the package 48 includes a die 110 having sidewalls with a step profile 1710. In one embodiment, the first encapsulant layer 150 covers the first surface 110a and step portions of the sidewalls 110c-110d of the die. The first encapsulant layer 150 does not cover the entire sidewalls of the die. The second encapsulant layer 180 covers the first encapsulant layer 150 and exposed sidewalls 110c-110d of the die. The second encapsulant layer 180 includes any suitable thickness dimension such that the total thickness of the first and second encapsulant layers over the first surface of the die is less than the height of the external contacts 170 as described in FIG. 1t.

FIGS. 2a-2f show an embodiment of a method or process for forming a semiconductor package 200. The process 200, for example, forms a package 10 or 12 such as that shown in FIG. 1a or FIG. 1b. As such, in the interest of brevity, common elements and features having the same reference numerals may not be described or described in detail.

FIG. 2a shows a wafer 210 having a first surface 210a and a second surface 210b. The wafer serves as a substrate for forming a die 110. The first surface, for example, is an active surface while the second surface is an inactive or passive surface. Other designations of the surfaces may also be useful. The wafer, for example, includes a semiconductor wafer, such as a silicon wafer. Other suitable types of semiconductor wafers may also be useful. In one embodiment, the wafer is processed to include a plurality of dies or chips. For example, a plurality of dies are processed in parallel on the wafer. A die 110 includes circuit components formed on the wafer or substrate. The circuit components include, for example, transistors, resistors, capacitors and interconnections to form an integrated circuit (IC). The plurality of dies are formed on the wafer and are separated by scribe lines or dicing channels.

The wafer 210, in one embodiment, is processed up to the stage where an array of external electrical contacts or die contacts 170 are formed on die contact pads (not shown) exposed by a final passivation layer (not shown) formed over the active surface 210a of the wafer substrate. In one embodiment, the wafer is a bumped wafer of which external contacts having spherical shaped structures or balls are formed over the active surface of the wafer as shown in FIG. 2a. The external contacts, for example, include solder balls. Providing other suitable types of external contacts, such as but not limited to copper pillars or gold stud bumps, may also be useful.

As shown in FIG. 2a, the wafer 210 is provided on a support unit. The support unit, for example, includes a carrier tape or dicing tape 230. Other suitable types of support unit which is sufficiently rigid to provide temporary support may also be useful. The carrier tape, for example, is a retractable tape and is secured by a ring or frame 232. The carrier tape includes top and bottom major surfaces 230a and 230b. The wafer is placed on the top surface 230a of the carrier tape. As shown, the wafer is disposed such that the second (or inactive) surface of the wafer 210b contacts the top surface of the carrier while the first (or active) surface of the wafer is away from the carrier tape.

Figure 2B:
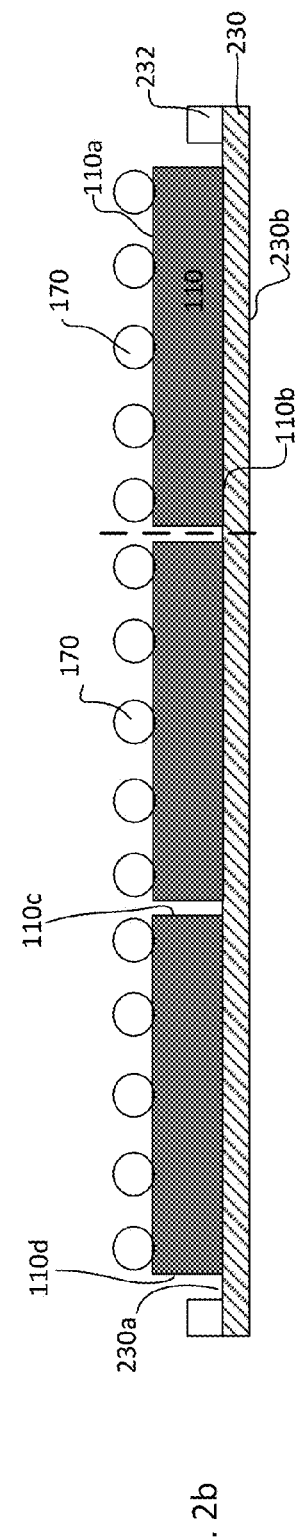

Referring to FIG. 2b, the process continues by introducing openings through the wafer. In one embodiment, a first singulation process is performed through the dicing channels of the wafer. In one embodiment, the first singulation may be achieved by mechanical sawing. In other embodiments, the first singulation may be performed using other suitable techniques which minimize cracking and chipping, such as plasma etching, laser processing, backgrinding, or any suitable combination thereof. The first singulation process, in one embodiment, includes a full cut which completely separates the wafer into individual dies or chips through the dicing channel. Illustratively, three individual dies are shown. It is understood that there could be other suitable number of dies. As shown in FIG. 2b, the individual die includes first (or active) surface 110a, second (or inactive) surface 110b and first and second sidewalls or side surfaces 110c and 110d. In other embodiments, the first singulation may include a partial cut to the wafer substrate and may not fully separate the wafer into individual dies at this stage. The partial cut introduces openings or grooves/channels which extend partially into the wafer.

Figure 2C:
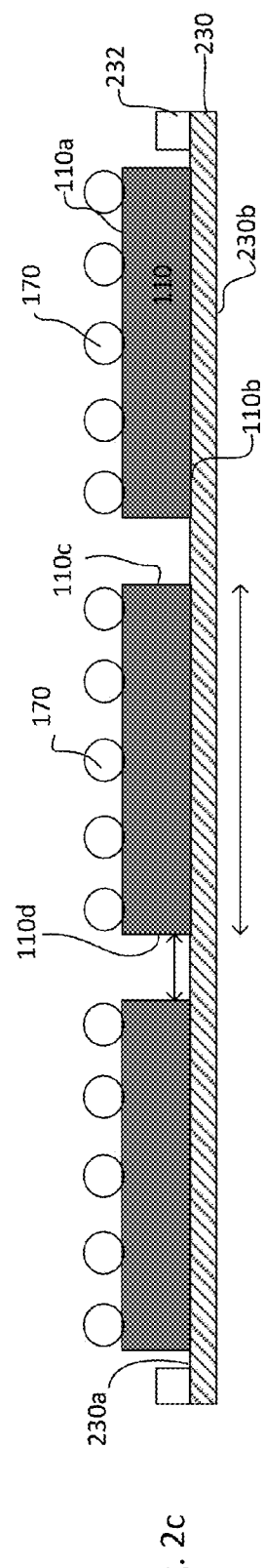

Referring to FIG. 2c, the process continues to increase the gap or separation distance between the individual dies 110. In one embodiment, the gap is increased to a predetermined distance by expanding the carrier tape 230 along the radius of the carrier tape. Other suitable techniques to increase the gap or separation distance between the individual dies may also be useful. The predetermined distance, for example, should be sufficiently wide to accommodate encapsulant material and tools used for a second singulation later. The individual dies with increased distances between each other are now processed together, for example in a wafer format, on the carrier tape. The carrier tape may also in other suitable format or shape.

Figure 2D:
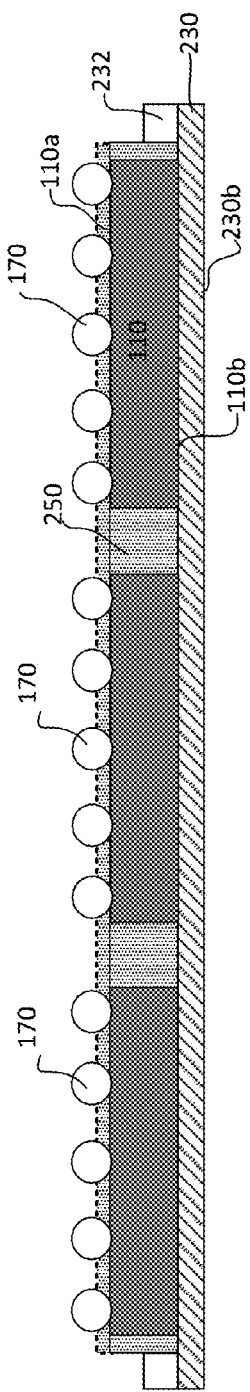

In one embodiment, the process continues by providing an encapsulant material 250 over the individual dies 110 and carrier tape 230. The encapsulant material may include any suitable dielectric material, such as but not limited to mold compound, epoxy, silicone or silicone based material or photosensitive material. Other suitable types of encapsulant material may also be useful. In one embodiment, an encapsulant material, such as an epoxy based material, is deposited to fill the gaps between the individual dies as shown in FIG. 2d. The encapsulant material may be provided using various techniques. In one embodiment, the encapsulant material is deposited through a dispensing technique by moving a dispensing nozzle (not shown) along the gaps of the individual dies which define dicing channels between die packages later. In such case, the encapsulant material fills and covers the gaps as well as sidewalls of the individual dies as shown in FIG. 2d. In one embodiment, the encapsulant material includes a top surface which is substantially coplanar with first surface 110a of the dies.

In another embodiment, encapsulant material may also be dispensed by moving the dispensing nozzle over the first surface of the dies. In such case, the encapsulant material may be provided to fill the gaps and cover the sidewalls 110c-110d of the dies and at least a portion of the first (or active) surface 110a of the dies. For example, at least the periphery of the first surface of the die is covered by the encapsulant material. Alternatively, the neck of at least one electrical contact 170, where the contact joins with underlying contact pads is enclosed and supported by the encapsulant material. In another embodiment, the first surface of the dies maybe fully covered by the encapsulant material as shown by portion of the encapsulant material with dotted lines, leaving portions of the electrical contact 170 protruded and exposed from the encapsulant material as shown in FIG. 2d.

In other embodiments, other suitable techniques, such as screen printing, spin coating, injection molding or compression molding, may be employed to provide the encapsulant material. In yet another embodiment, film assisted molding technique, such as that shown and described in FIGS. 26a-26b and FIGS. 27a-27 later, may also be used to form the encapsulant material. The techniques employed may depend on the type of encapsulant material. A curing process may be performed after depositing the encapsulant material, depending on the type of encapsulant material being used. The curing process may include a UV cure process or suitable heat treatment. In some other embodiments, a reflow process may optionally be performed to restore the flattened external electrical contacts 170 to sphere shape.

Figure 2E:
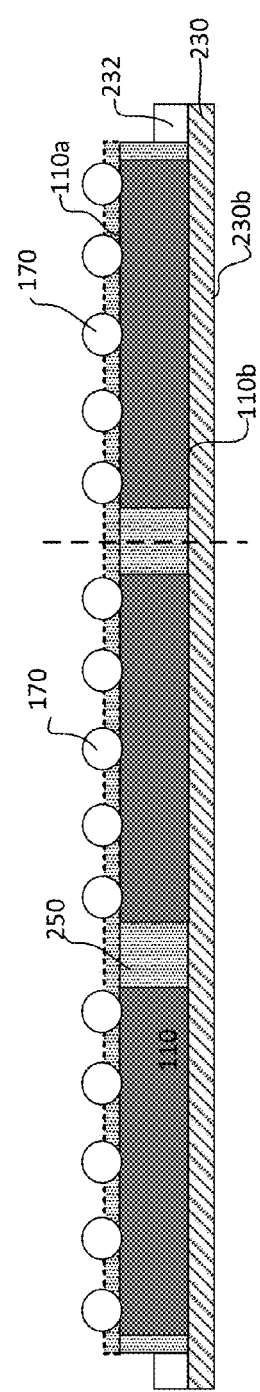

In one embodiment, the process continues with a second singulation process which is performed through the encapsulant material 250 as shown in FIG. 2e. In one embodiment, the second singulation process may be achieved by mechanical sawing. In cases where the first and second singulation processes are performed by mechanical sawing, the first singulation process may employ a saw blade having a larger width relative to that of a saw blade used for the second singulation process. In other embodiments, the second singulation may be performed using other suitable techniques such as plasma etching, laser processing or any suitable combination thereof. In one embodiment, the second singulation process singulates or separates the encapsulated dies in a wafer format through the encapsulant material 250 to form individual packages, such as individual wafer level chip scale packages (WLCSPs). The individual packages are removed from the carrier tape after the second singulation process using suitable techniques.

Figure 2F:
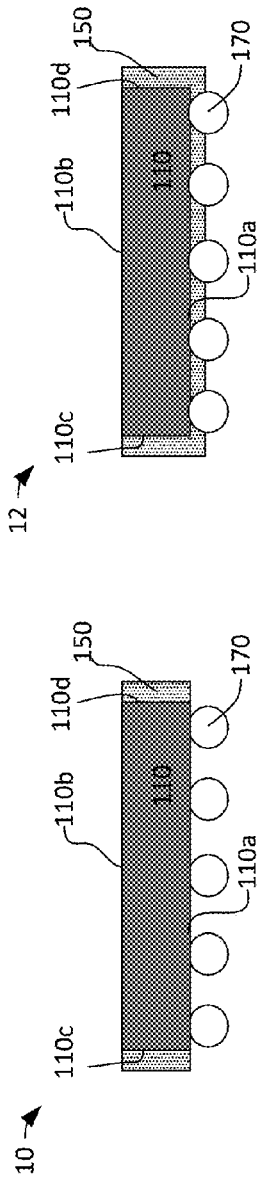

FIG. 2f shows various embodiments of singulated individual package formed above. In one embodiment, at least first and second sidewalls or lateral side surfaces 110c and 110d of the die 110 are fully covered by the encapsulant material 150. For example, the encapsulant material 150 covers the sidewalls 110c-110d but not the first and second surfaces 110a and 110b of the die as shown in package 10. Alternatively, the encapsulant material 150 is a single encapsulant layer which covers the sidewalls 110c-110d and first surface 110a of the die as shown in package 12. The different configuration shown in package 10 or 12 depends on whether encapsulant material is also provided over the first surface of the dies as described in FIG. 2d. Other suitable configurations for the individual package may also be useful as will be described later. The encapsulant material serves as a protective layer to protect the die from crack/chipping during, for example, package singulation, assembly, logistic transfer after assembly process or electrically coupling to an external device (not shown), such as a circuit board later.

FIGS. 3a-3f show an embodiment of a process for forming a semiconductor package 300. The process 300 is similar to the process 200 shown in FIGS. 2a-2f. In the interest of brevity, common elements and processes may not be described or described in detail. As such, the description below primarily focuses on the difference(s) between these processes.

Referring to FIG. 3a, a wafer 210 is provided on the support unit. For example, the wafer is provided on the carrier tape 230. The wafer 210 is the same as that described in FIG. 2a, except that an additional backside protective layer 340 is provided and formed over the second surface 210b of the wafer 210. The backside protective layer, for example, includes thermoplastic polymer based resin film with thermosetting type of adhesive thereon. The backside protective layer may be provided in the form of tape and is applied to the second (or passive) surface of the wafer by lamination process. Other suitable materials and techniques may be used for forming the backside protective layer.

Referring to FIG. 3b, the process continues by introducing openings through the wafer. In one embodiment, a first singulation process is performed through the dicing channels of the wafer. The first singulation process is the same as that described in FIG. 2b. In one embodiment, the first singulation process includes a full cut which completely separates the wafer into individual dies or chips through the dicing channel. In other embodiments, the first singulation may include a partial cut to the wafer substrate and may not fully separate the wafer into individual dies at this stage. As shown, the individual die includes first (or active) surface 10a, second (or inactive) surface 110b, first and second sidewalls 110c and 110d and a backside protective layer 140 disposed on the second surface 110b of the die.

Referring to FIG. 3c, the process continues to increase the gap or separation distance between the individual dies 110 having the backside protective layer 140 on its second surface. Suitable techniques for increasing the separation distance, including those described in FIG. 2c may be used. In one embodiment, the process continues by providing an encapsulant material 250 over the individual dies 110 with backside protective layer 140 and carrier tape 230. The encapsulant material and forming techniques include those as described in FIG. 2d. As shown, the encapsulant material, for example, fills the gaps and at least covers sidewalls of the individual dies and sidewalls of the backside protective layer as shown in FIG. 3d. In other embodiments, the encapsulant material, for example, may further cover at least a portion of the first surface of the dies or fully cover the first surface of the dies as shown by dotted lines, leaving the electrical contacts 170 exposed and protruded from the encapsulant material.

In one embodiment, the process continues with a second singulation process which is performed through the encapsulant material 250 as shown in FIG. 3e. The second singulation process employs suitable techniques as described in FIG. 2e. In one embodiment, the second singulation process singulates the encapsulated dies in a wafer format through the encapsulant material to form individual packages, such as individual WLCSPs. The individual packages are removed from the carrier tape after the second singulation process using suitable techniques.

FIG. 3f shows various embodiments of an individual package formed above. In one embodiment, the encapsulant material 150 at least covers the first and second sidewalls or lateral side surfaces 110c-110d of the die 110 and side surfaces of the backside protective layer 140. For example, the encapsulant material 150 covers the side surfaces 110c-110d without covering the first and second surfaces 110a-110b of the die as shown in package 14. Alternatively, the encapsulant material 150 is a single encapsulant layer which covers the side surfaces 110c-110d and at least a portion of the first surface 110a of the die as shown in package 16. The different configuration shown in package 14 or 16 depends on whether encapsulant material 250 is also provided over the first surface of the dies as described in FIG. 3d. Other suitable configurations for the individual package may also be useful as will be described later.

FIGS. 4a-4d show an embodiment of a process for forming a semiconductor package 400. The process 400 may include similar processes such as those described in process 200 or process 300. In the interest of brevity, common elements and processes may not be described or described in detail.

As shown in FIG. 4a, the wafer is processed at the same stage as that described in FIG. 2b. For example, a first singulation process is performed to separate the wafer which is prepared with external contacts 170 into individual dies 110.

The process 400 continues by providing a support structure 430. The support structure 430, for example, includes metal material. Other suitable types of material which is sufficiently rigid to provide temporary support to form an encapsulated package may also be useful. The support structure, for example, includes a recess or cavity 440. In one embodiment, at least one recess is disposed in the central portion 434 of the support structure 430. As shown, one recess is provided in the central portion of the support structure while the peripheral portion 432 of the support structure is devoid of recess. In other embodiment, the support structure includes a plurality of recesses isolated by material of the support structure. In one embodiment, the dimension of the recess is sufficient to accommodate a die 110. For example, the width of the cavity is larger than the die/chip and the depth of the cavity may be about the same or greater than the height or thickness of the chip. As shown, inner sidewalls of the recess include a straight profile. Providing other suitable sidewall profiles is also useful. For example, the sidewall profile can be slanted or stepped.

In one embodiment, the process continues by providing an encapsulant material 250 to fill the recess 440. The encapsulant material 250 may include any suitable dielectric material and may be provided using various suitable techniques, including those described in FIG. 2d. For example, the encapsulant material includes epoxy and may be provided in liquid state or B-stage. Alternatively, film type encapsulant may also be employed. As shown in FIG. 4b, the encapsulant material partially fills the recess.

Figure 4D:
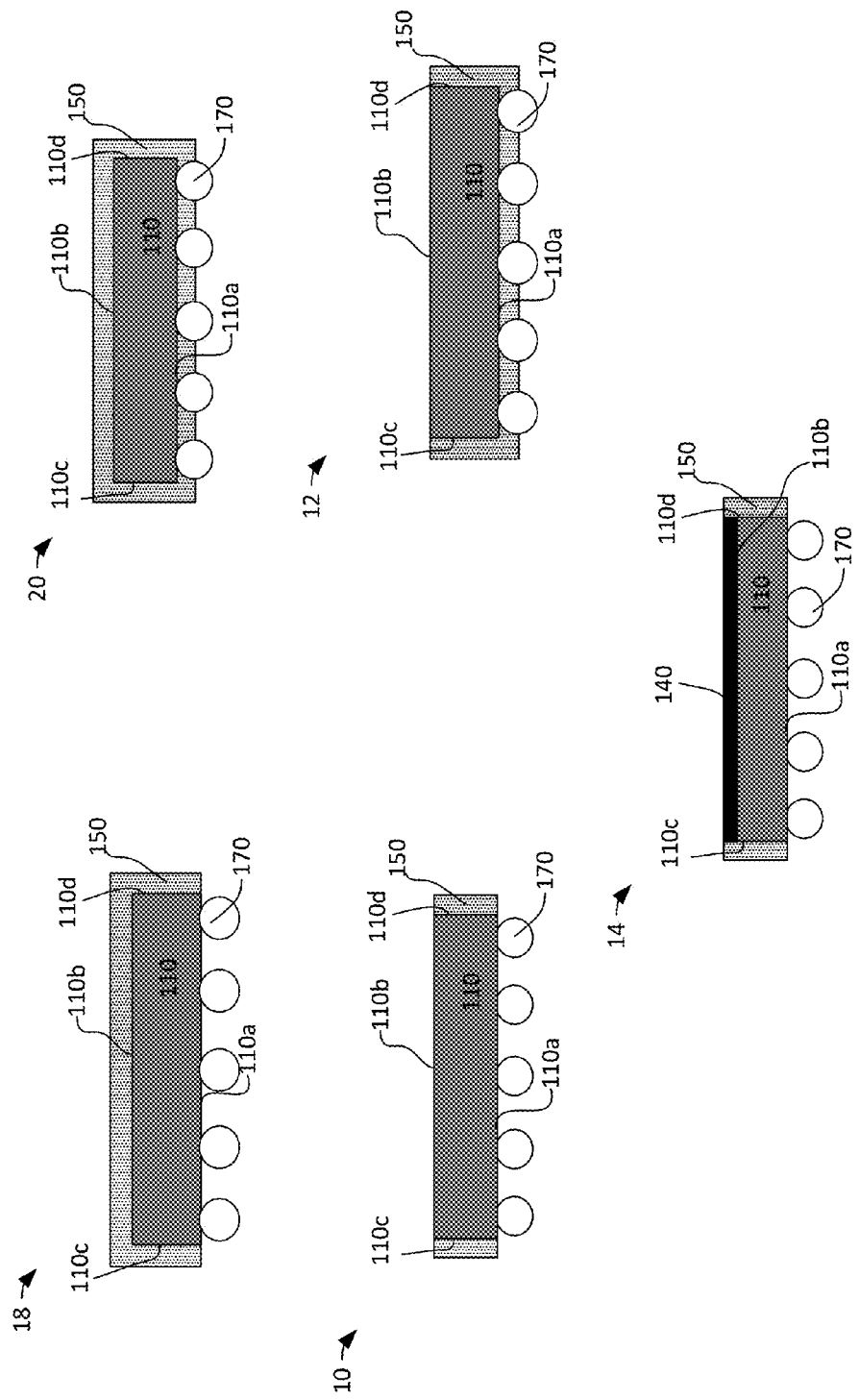

Referring to FIG. 4c, the individual dies are detached or removed from the carrier tape using suitable techniques. In one embodiment, a die 110 is provided in the recess 440 of the support structure 430 which is partially filled with encapsulant material 250. Providing the chip can be achieved by pick and place technique. As shown, the die is provided in the recess such that the second surface 110b is facing the recess and the die is placed in a central portion of the recess during the pick and place operation. As shown in FIG. 4c, the die is pressed against the encapsulant material such that at least sidewalls 110c-110d of the die and its second surface 110b are covered by the encapsulant material. Depending on the material of the encapsulant, suitable curing process may be performed after placing the die into the recess. The encapsulated die is removed from the recess using suitable techniques resulting in a package 18 such as that shown in FIG. 4d. The process 400, for example, forms an individual encapsulated WLCSP without the need of a second singulation process.

As described, the encapsulant material is provided in the recess prior to placement of the die into the recess. As shown in FIG. 4d, a package 18 formed by technique described in FIGS. 4a-4c above includes an encapsulant material having a single encapsulant layer 150 which covers the sidewalls 110c-110d and second surface 110b of the die, leaving the first surface of the die 110a exposed. Alternatively, a package 20 may be formed by technique described above, depending on the depth of the recess and volume of the encapsulant material 250 provided in the groove. For example, the package 20 includes an encapsulant material having a single encapsulant layer 150 which surrounds and covers all surfaces of the die and leaves portions of the external contacts protruded.

In another embodiment, the die 110 may be provided in a central portion of the recess 440 prior to providing the encapsulant material. In such case, the die is provided in the recess such that the second surface 110b is facing the recess and the die is placed in a central portion of the recess during the pick and place operation, leaving some space or gaps between the die and sidewalls of the recess. An encapsulant material 250 is then provided into the recess using various suitable techniques. Depending on depth of the recess, the encapsulant material may be provided to fill the gap between the recess and the die such that the encapsulant covers at least the sidewalls 110c-110d of the die. For example, if the depth of the recess is about the same as the thickness of the die, the package 10 which includes encapsulant material 150 covering the sidewalls 110c-110d of die is formed, which is the same as the package shown in FIG. 1a. On the other hand, if the depth of the recess is greater than the thickness of the die, the encapsulant layer 150 covers the sidewalls 110c-110d as well as the first surface of the die 110a and partially covering the electrical contacts 170 to form a package 12. In other embodiments, the process 400 may be modified such that a chip or die 110 having a backside protective layer 140 formed over its second surface 110b as shown in FIG. 3b is provided. In such case, a package 14 formed by process 400 may include encapsulant 150 formed on sidewalls 110c-110d of the die and sidewalls of the backside protective layer 140 as shown in FIG. 4d. It is understood that the encapsulant material may also cover first surface of the die, depending on depth of the recess and volume of the encapsulant material in the recess. Other suitable configurations of the package may be formed, depending on the configuration of the recess. The shape of the encapsulant material may also vary depending on sidewall profiles of the recess.

FIGS. 5a-5e show an embodiment of a process for forming a semiconductor package 500. The process 500 is similar to the process 200 shown in FIGS. 2a-2f. In the interest of brevity, the description below will focus primarily the difference(s) between these processes and common elements and processes may not be described or described in detail.

As shown in FIG. 5a, the wafer is processed at the same stage as that described in FIG. 2b. For example, a first singulation process is performed to separate the wafer which is prepared with external contacts 170 into individual dies 110.

In one embodiment, the process continues by providing a support carrier 530 having top and bottom surfaces 530a and 530b. The support carrier, for example, is a temporary carrier for processing the die package. The carrier should be sufficiently rigid to serve as a temporary support and withstand further processing steps. By way of non-limiting example, the support carrier may be a silicon wafer, conductive tape, metallic plate or the like. Various types of materials may be used to serve as the support carrier.

In one embodiment, an adhesive layer 532 is provided on the first or top surface 530a of the support carrier. Other temporary bonding techniques may also be useful. The adhesive, for example, can be any type of adhesive that provides temporary bonding of the dies to the support carrier. The adhesive may include any suitable material and may be in different form. For example, the adhesive includes a B-stage dielectric material in the form of a tape, liquid or paste. The adhesive may be provided on the support carrier using various techniques. The technique employed may depend on the type or form of the adhesive. For example, a tape adhesive may be provided on the support, carrier by lamination, a paste adhesive may be provided on the support carrier by printing while a liquid adhesive may be provided on the substrate by spin coating or dispensing.

In one embodiment, the dies 110 are removed from the carrier tape 230 and are attached to the support carrier 530 via the adhesive as shown in FIG. 5b. The dies are removed from the carrier tape and are placed on the support carrier via pick and place technique. In one embodiment, the dies are placed on top of the support carrier and the dies are separated from each other by a predetermined distance. The predetermined distance, for example, should be sufficiently wide to accommodate encapsulant material and tools used for a second singulation later. In one embodiment, the external contacts 170 of the dies are partially embedded in the adhesive 532 as shown in FIG. 5b, Portions of the external contacts 170 of the dies nearer to the first surface 110a of the dies are not embedded in the adhesive 532. In some embodiments, one or more dummy dies (not shown) can be placed on the support carrier for alignment purpose.

In one embodiment, the process continues by providing an encapsulant material 250 over the individual dies 110 and adhesive 532. Various suitable encapsulant material and its forming techniques including those described in FIG. 2d may be used. As shown, the encapsulant material, for example, fills the gaps and at least covers the sidewalls 110c-110d. Since only partial of the external contacts 170 are embedded in the adhesive, the encapsulant material 250 also covers the first surface 110a of the dies as well as exposed portions of the external contacts of the dies. In one embodiment, the encapsulant material also covers the exposed second surface 110b of the dies as shown in FIG. 5c. In other embodiments, the encapsulant material may not cover the exposed second surface of the dies. A curing process may be performed, depending on the encapsulant material.

The process continues with a second singulation process which is performed through the encapsulant material 250 as shown in FIG. 5d. The second singulation process employs suitable techniques such as those described in FIG. 2e to form individual packages. The encapsulated packages are separated from the support carrier 530 with the adhesive 532 after preforming the second singulation process. In one embodiment, a debonding treatment is performed. The debonding treatment may, for example, cause the adhesive to lose or reduce its adhesive strength to allow separation of the packages from the support carrier. The debonding treatment, for example, includes a temperature or heat treatment. Other types of debonding treatments may also be useful. The debonding treatment may depend on the type of adhesive used. The debonding treatment may include chemical treatment, such as applying a solvent to dissolve the adhesive, or a mechanical treatment, such as pulling or twisting, to separate the packages from the support carrier.

FIG. 5e shows a package 20 formed by process described above. In one embodiment, the encapsulant material or layer 150 covers all surfaces of the die 110. The encapsulant material also covers portions of the external contacts nearer to the first surface 110a of the die while the remaining portions of the external contacts are exposed for electrical connections to external device, such as circuit board. In other embodiments, the encapsulant layer may not cover the second surface 110b of the die and forms a package 12 as that shown in FIG. 5e.

FIGS. 6a-6d show an embodiment of a process for forming a semiconductor package 600. The process 600 is similar to the process 200 and process 500 shown in FIGS. 2a-2f and FIGS. 5a-5e. In the interest of brevity, the description below will focus primarily the difference(s) between these processes and common elements and processes may not be described or described in detail.

As shown in FIG. 6a, the wafer is processed at the same stage as that described in FIG. 5b. For example, the dies 110 are removed from the carrier tape and are attached to the support carrier 530 with predetermined gap between each other as shown in FIG. 6a. In one embodiment, the process 600 differs from the process 500 in that an adhesive 632 having a thickness which is about or substantially the same as the height of the external contacts is provided over the support carrier 530 and that the external contacts 170 of the dies are fully embedded in the adhesive 632 as shown in FIG. 6a.

The process continues by providing an encapsulant material 250 over the individual dies 110 and adhesive 632. Various suitable encapsulant material and its forming techniques including those described in FIG. 2d may be used. As shown, the encapsulant material, for example, fills the gaps and at least covers sidewalls 110c-110d of the dies. Since the external contacts 170 are fully embedded in the adhesive, the encapsulant material does not cover the first surface 110a of the dies. In one embodiment, the encapsulant material also covers the exposed second surface 110b of the dies as shown in FIG. 6b. In other embodiments, the encapsulant material may not cover the exposed second surface of the dies.

The process continues with a second singulation process which is performed through the encapsulant material 250 as shown in FIG. 6c. The singulated packages are removed from the support carrier with adhesive. The second singulation process employs suitable techniques such as those described in FIG. 2e to form individual packages. The encapsulated packages are detached from the support carrier using suitable techniques as described with respect to FIG. 5d.

FIG. 6d shows an individual package formed by process described above. In one embodiment, the singulated package includes an encapsulant material 150 which covers at least sidewalls 110c-110d of the die. In other embodiments, the encapsulant material may or may not cover the second surface 110b of the die, forming a package 18 or package 10. In the process 500 and 600 described above, the adhesive allows for temporary attachment of the dies to the support carrier. In addition, the thickness of the adhesive also defines the coverage of the encapsulant material. For instance, the thickness of the adhesive may be adjusted such that the external contacts are partially or fully embedded in the adhesive such that the encapsulant material may or may not cover the first (or active) surfaces of the die.

FIGS. 7a-7d show an alternate embodiment of a process for forming a semiconductor package 700. The process 700 includes similar processes as described in FIGS. 2a-2f and FIGS. 5a-5e and forms a package in various configurations. In the interest of brevity, the description below will focus primarily the difference(s) between these processes.

As shown in FIG. 7a, the wafer is processed at the same stage as that described in FIG. 2b. For example, a first singulation process is performed to separate the wafer which is prepared with external contacts 170 into individual dies 110 disposed over a first support unit having a first carrier tape 230.

In one embodiment, the process continues by providing a second support unit. The second support unit, for example, includes a second carrier tape or dicing tape 730. Other suitable types of second support unit which is sufficiently rigid to provide temporary support may also be useful. The carrier tape 730, for example, is a retractable tape and is secured by a second ring or frame 732. In one embodiment, an adhesive 532 is provided over a first surface 730a of the second carrier tape as shown in FIG. 7b. Various suitable adhesive and its forming techniques, including those described with respect to FIG. 5b may be used.

The process continues by transferring all the dies 110 on the first carrier tape 230 simultaneously to the second carrier tape 730 as shown in FIG. 7b. The dies 110 are transferred to the second carrier tape such that the dies may be processed together, for example in a wafer format, on the second carrier tape. The dies, for example, are transferred in such a way that the external contacts 170 are facing the adhesive 532. In one embodiment, the dies are placed on the second carrier tape 730 such that the external contacts 170 are partially embedded in the adhesive 532. The first carrier tape 230 are removed using suitable techniques. For example, a suitable treatment may be performed to lose or reduce adhesive strength of the first carrier tape to allow separation of the dies from the first carrier tape.

The process continues to increase the gap or separation distance between the individual dies 110 on the second carrier tape 730 as shown in FIG. 7c. In one embodiment, the gap is increased to a predetermined distance by expanding the carrier tape 730 along the radius of the earner tape. The predetermined distance, for example, should be sufficiently wide to accommodate encapsulant material and tools used for a second singulation later. Other suitable techniques may be used to increase the separation distance between the dies.

In one embodiment, an encapsulant material 250 is provided over the individual dies 110 and adhesive 532 over the second carrier tape 730. Various suitable encapsulant material and its forming techniques including those described in FIG. 2d may be used. As shown in FIG. 7d, the encapsulant material, for example, covers all the surfaces of the die and exposed portions of the external contacts 170 of the dies. In other embodiments, the encapsulant material may not cover the exposed second surface of the dies. The process continues from FIG. 5d onwards. For example, a second singulation process is performed through the encapsulant material 250 to form individual packages and the packages are removed from the second carrier tape using techniques as described in FIG. 5d. Various configurations of a package such as those shown in FIG. 5e may be formed by process 700.

FIGS. 8a-8c show an alternate embodiment of a process for forming a semiconductor package 800. The process 800 includes similar processes as described in FIGS. 2a-2f and FIGS. 6a-6d and forms a package in various configurations. In the interest of brevity, the description below will focus primarily the difference(s) between these processes.

As shown in FIG. 8a, the wafer is processed at the same stage as that described in FIG. 7b. For example, the dies 110 are transferred to the second carrier tape 730 having an adhesive 632. In one embodiment, the process 800 differs from the process 700 in that the external contacts 170 of the dies are fully embedded in the adhesive 632 as shown in FIG. 8a. As shown, the adhesive 632 has sufficient thickness such that the external contacts 170 are embedded entirely in the adhesive.

The process continues to remove the first carrier tape 230 and to increase the gap or separation distance between the individual dies 110 on the second carrier tape 730 as shown in FIG. 8b. The removal of the first carrier tape and technique used to increase the gap between individual dies are the same as that described in FIG. 7c. An encapsulant material 250 is provided over the individual dies 110 and adhesive 632 over the second carrier tape 730 as shown in FIG. 8c. Various suitable encapsulant material and its forming techniques including those described in FIG. 2d may be used. As shown, the encapsulant material 250, for example, covers at least sidewalls or lateral surfaces 110c-110d of the dies. The encapsulant material may or may not cover the second surface of the dies. The process continues from FIG. 6c onwards. For example, a second singulation process is performed through the encapsulant material 250 to form individual packages and the packages are removed from the second carrier tape. Various configurations of a package such as those shown in FIG. 6d may be formed by process 800.

FIGS. 9a-9d show an alternate embodiment of a process for forming a semiconductor package 900. The process 900 includes similar processes as described in FIGS. 2a-2f and FIGS. 5a-5e. In the interest of brevity , the description below will focus primarily the difference(s) between these processes and elements having the same reference numerals may not be described in detail.

Figures 9A, 9B:
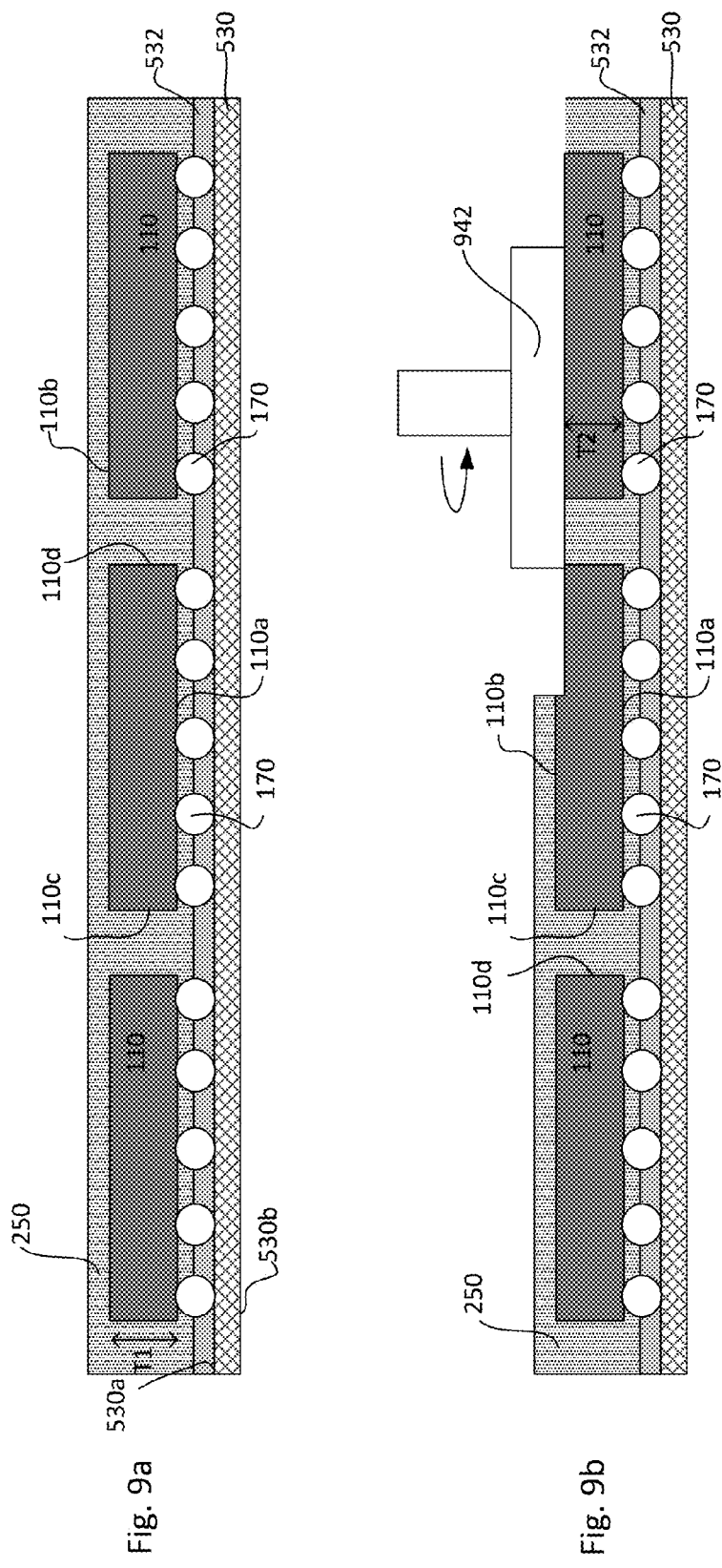

As shown in FIG. 9a, the wafer is processed at the same stage as that described in FIG. 5c. For example, an encapsulant material 250 is provided over the individual dies 110 and adhesive 532. The adhesive is disposed over the support carrier 530 and the external contacts 170 of the dies are partially embedded in the adhesive. The individual dies, for example, include an initial thickness T1. As shown, the encapsulant material, for example, fills the gaps and covers sidewalls 110c-110d and second surface 110b of the dies.

In one embodiment, the process continues to remove at least a portion of the encapsulant material 250 over the second surface 110b of the dies. This exposes the second (or passive) surface of the dies. The encapsulant material, for example, can be removed from the second surface of the dies by chemical etching, mechanical grinding, polishing, lapping or any combination thereof. For illustration purpose, portions of the encapsulant material over the second surface of the dies are removed using a grinding tool 942 as shown in FIG. 9b. It is understood that other suitable removal process may be used. In another embodiment, the process may also remove both the encapsulant material over the second surface of the dies as well as a portion of the semiconductor material of the dies from the second surface 110b. In such case, the thickness of the dies are reduced to a thickness T2.

Referring to FIG. 9c, a backside protective layer 340 is provided and formed over second surface of the dies 110b and surfaces of the encapsulant material 250 which are substantially coplanar with the second surface of the dies. The backside protective layer 340 includes the same material and is formed using techniques as described with respect to FIG. 3a. The process continues with a second singulation process. The second singulation process, for example, is performed through the backside protective layer 340 and encapsulant material 250 as shown in FIG. 9c. The second singulation process employs suitable techniques such as those described in FIG. 2e to form individual packages. The encapsulated packages are separated from the support carrier 530 with the adhesive 532 after performing the second singulation process using suitable techniques described in FIG. 5d.

FIG. 9d shows an individual package 22 formed by process 900 described above. In one embodiment, the encapsulant material 150 is an encapsulant layer which covers at least sidewalls 110c-110d and first surface 110a of the die while leaving portions of the external contacts 170 protruded for electrical connection. As shown, the package 22 includes a backside protective layer 140 which covers the second surface 110b of the die and surfaces of the encapsulant material 150 which are substantially coplanar with the second surface of the die.

FIGS. 10a-10d show an alternate embodiment of a process for forming a semiconductor package 1000. The process 1000 includes similar processes as described in FIGS. 6a-6d and FIGS. 9a-9d. In the interest of brevity, the description below will focus primarily the difference(s) between these processes and elements having the same reference numerals may not be described in detail.

As shown in FIG. 10a, the wafer is processed at the same stage as that described in FIG. 6b. For example, an encapsulant material 250 is provided over the individual dies 110 and adhesive 632. The adhesive is disposed over the support carrier 530 and the external contacts 170 are fully embedded in the adhesive. The individual dies, for example, include an initial thickness T1. As shown, the encapsulant material, for example, fills the gaps and covers the sidewalls 110c-110d and the second surface 110b of the dies.

Referring to FIG. 10b, the process continues to remove at least a portion of the encapsulant material 250 over the second surface 110b of the dies using suitable techniques as described in FIG. 9b. In another embodiment, the process may also remove both the encapsulant material over the second surface of the dies as well as a portion of the semiconductor material of the dies from the second surface 110b such that the thickness of the dies are reduced to a thickness T2. In one embodiment, a backside protective layer 340 is provided and formed over second surface of the dies 110b and surfaces of the encapsulant material which are substantially coplanar with the second surface of the dies. The backside protective layer includes the same material and is formed using techniques as described with respect to FIG. 3a. The process continues with a second singulation process. The second singulation process, for example, is performed through the backside protective layer 340 and encapsulant material 250 as shown in FIG. 10c and the singulated dies are separated from the support carrier 530 the same as that described in FIG. 9c. This forms a package 24 as shown in FIG. 10d. The package as shown in FIG. 10d is similar to the package 22 shown in FIG. 9d except that no encapsulant material is disposed on the first surface 110a of the die.

FIGS. 11a-11d show an embodiment of a process for forming a semiconductor package 1100. The process 1100 includes similar processes as described in FIGS. 2a-2f and FIGS. 3a-3f. The process 1100 forms a package 22 or package 24 which is the same as that shown in FIG. 9d or FIG. 10d. In the interest of brevity, the description below will focus primarily the difference(s) between these processes and elements having the same reference numerals may not be described in detail.

As shown in FIG. 11a, the wafer is processed at the same stage as that described in FIG. 2b. For example, a first singulation process is performed to separate the wafer which is prepared with external contacts 170 into individual dies 110. In one embodiment, the process continues by providing a support carrier 530 as shown in FIG. 11b. In one embodiment, a backside protective layer 340 is provided on a first surface 530a of the support carrier. The materials of the support carrier 530 and the backside protective layer 340 as well as its forming techniques over the support carrier are the same as that described previously. As shown, the backside protective layer covers the entire first surface 530a of the support carrier.

Referring to FIG. 11b, the individual dies are detached or removed from the carrier tape 230 and the dies are placed over the backside protective layer 340 using suitable techniques, such as pick and place technique. The dies are placed over the top surface of the support carrier such that the second surface 110b of the dies are facing the backside protective layer 340. The dies 110 are placed on top of the support carrier and are separated from each other by a predetermined distance. The predetermined distance, for example, should be sufficiently wide to accommodate encapsulant material and tools used for a second singulation process later.

The process continues by providing an encapsulant material 250 over the individual dies 110 and backside protective layer 340 as shown in FIG. 11c. Various suitable encapsulant material and its forming techniques including those described in FIG. 2d may be used to form the encapsulant material 250. By way of example and for illustration purpose, the encapsulant material 250 is shown to be provided through dispensing using a dispensing nozzle or tool 1142. The encapsulant material, such as but not limited to epoxy, is dispensed to fill the gaps and to at least cover sidewalls 110c-110d of the dies without using a stencil. This leaves the first surface of the dies exposed. In another embodiment, the encapsulant material may be dispensed such that it covers both the lateral or sidewalls 110c-110d and first surface 110a of the die as shown in FIG. 11c. As shown, the encapsulant material partially covers the external contacts 170 while remaining portions of the external contacts are exposed and protruded from the encapsulant material.

The process continues with a second singulation process which is performed through the encapsulant material 250 and backside protective layer 340 as shown in FIG. 11c. The second singulation process employs suitable techniques such as those described in FIG. 2e to form individual packages. The encapsulated packages with the backside protective layer are separated from the support carrier 530 after performing the second singulation process using suitable techniques described in FIG. 5d. This forms a package 22 as shown in FIG. 11d which is the same as that described and shown in FIG. 9d or package 24 which is the same configuration as that described in FIG. 10d, depending on whether the encapsulant material is also provided over the active surface. In another embodiment, the support carrier may be detached from the encapsulated dies prior to performing the second singulation process.

FIGS. 12a-12e show another embodiment of a process for forming a semiconductor package 1200. The process 1200 includes similar processes as described in FIGS. 3a-3f. In the interest of brevity, the description below will focus primarily the difference(s) between these processes and elements having the same reference numerals may not be described in detail.

Referring to FIG. 12a, the wafer is processed at the same stage as that described in FIG. 3b. For example, a first singulation process is performed to separate the wafer which is prepared with external contacts 170 into individual dies 110 having a backside protective layer 140 disposed on the second surface 110b of the die.

In one embodiment, the process continues by providing a support carrier 530 as shown in FIG. 12b. The support carrier 530 includes suitable materials as described in FIG. 5b. Referring to FIG. 12b, the individual dies are removed from the carrier tape 230 and are placed over the support carrier 530 using suitable techniques, such as pick and place technique. The dies are placed over the top surface of the support carrier such that the second surface 110b of the dies having the backside protective layer 140 are facing the top surface 530a of the support carrier. The dies 110 are placed on top of the support carrier and are separated from each other by a predetermined distance. The predetermined distance, for example, should be sufficiently wide to accommodate encapsulant material and tools used for a second singulation process later. Other suitable techniques may be used to increase the separation distance between the dies.

Referring to FIG. 12c, the process continues by providing an encapsulant material 250 over the individual dies 110 with backside protective layer 140 and over the support carrier 530. By way of example and for illustration purpose, the encapsulant material 250 is provided through dispensing using a dispensing nozzle or tool 1142 as shown in FIG. 12c. In one embodiment, a stencil 1240 is employed and is disposed over the first surface 110a of the dies. The stencil includes a support member which creates a distance DY between the active surface of the dies and the stencil as shown in FIG. 12c. As shown, the stencil covers the first surface of the dies and includes openings which expose the gaps between adjacent dies. The encapsulant material 250, such as but not limited to epoxy, is dispensed to fill the gaps and to at least cover sidewalls 110c-110d of the dies. Other suitable encapsulant materials, such as silicone based material or mold compound, may also be used. Providing the encapsulant material using other suitable techniques, such as screen printing, may also be useful. A curing process may be performed after depositing the encapsulant material, depending on the type of encapsulant material being used. The curing process may include a UV cure process or any suitable heat treatment. The encapsulant material 250 which fills the gaps between adjacent dies, in one embodiment, includes a U-shaped top profile 1152 as shown in FIG. 12c.

The process continues with a second singulation process which is performed through the encapsulant material 250 as shown in FIG. 12d. The second singulation process employs suitable techniques such as those described in FIG. 2e to form individual packages. The encapsulated packages are separated from the support carrier 530. This forms a package 26 as shown in FIG. 12e. In another embodiment, the support, carrier may be detached from the encapsulated dies in a wafer format prior to performing the second singulation process.

The package 26 as shown in FIG. 12e is similar to the package 14 as shown and as described in FIG. 3f. For example, encapsulant material 150 is formed at least on sidewalls 110c-110d of the dies and sidewalls of the backside protective layer 140. However, the package 26 shown in FIG. 12e differs from the package 14 shown in FIG. 3f in that portion of the encapsulant material 150 nearer to the external contacts includes a substantially arc shape profile 152. Although the package includes a backside protective layer 140 over the second surface 110b of the die, it is understood that process 1200 may be modified to include dies without backside protective layer such as that shown in FIG. 2b. In such case, the encapsulant material 150 covers the sidewalls 110c-110d of the die and portion of the encapsulant material nearer to the external contacts includes a substantially arc shape profile.

FIGS. 13a-13c show another embodiment of a process for forming a semiconductor package 1300. The process 1300 includes similar processes as described in FIGS. 2a-2f. In the interest of brevity, the description below will focus primarily the difference(s) between these processes and elements having the same reference numerals may not be described in detail.

As shown in FIG. 13a, the dies 110 are at the same stage as that described in FIG. 2c. For example, a singulation process is performed to separate the wafer which is prepared with external contacts 170 into individual dies 110. The gap and separation distance between adjacent dies is increased to a predetermined distance by expanding the carrier tape 230 along the radius of the earner tape. Other suitable techniques to increase the gap or separation distance between the individual dies may also be useful. In one embodiment, the predetermined distance, for example, should be sufficiently wide to accommodate encapsulant material which will be provided on the dies as will be discussed below.

The process continues by providing encapsulant material. In one embodiment, the encapsulant material 1350 may be provided using techniques such as jetting or spraying along edges of the dies. In other embodiments, the spraying may be performed along the gaps between the dies and the encapsulant material is applied by spraying at an angle with respect to the dies. Other suitable types of techniques may also be useful. In one example, the encapsulant material is applied using a spraying process. In such case, the encapsulant material, such as but not limited to epoxy, conforms to side surfaces of the dies. In one embodiment, the encapsulant material 1350 formed by the spraying process includes a vertical portion 1350a which covers a sidewall of the die and has a first lateral extended portion 1350b which spreads to peripheral portion of the first surface 110a of the die and a second lateral extended portion 1350c which spreads to the gap between adjacent dies and disposed over the carrier tape as shown in FIG. 13b.

Depending on the material of the encapsulant, a curing process may be performed thereafter. The individual package 28 having the die 110 with encapsulant material 1350 is removed from the carrier tape 230 without performing additional singulation process as shown in FIG. 13c. As shown, the package 28 includes an encapsulant material 1350 having a vertical portion 1350a which covers the sidewall 110c or 110d of the die and first lateral extended portion 1350b which extends to peripheral portion of the first surface 110a of the die. The encapsulant material also includes a second lateral extended portion 1350c which extends outward and away from the die and has a top surface substantially coplanar with the second surface 110b of the die.

FIGS. 14a-14e show an embodiment of a process for forming a semiconductor package 1400. The process 1400 may include similar processes such as those described in process 200 shown in FIGS. 2a-2f. In the interest of brevity, common elements having the same reference numerals and processes may not be described or described in detail.

Referring to FIG. 14a, a wafer 210 is provided. The wafer 210 is the same as that described in FIG. 2a. For example, the wafer is processed up to the stage is where an array of external electrical contacts or die contacts 170 are formed on contact pads (not shown) exposed by a final passivation layer (not shown) formed over the active surface 210a of the wafer substrate. In one embodiment, an encapsulant material 1450 having an initial thickness D1 is formed over the second (or passive) surface 210b of the wafer as shown in FIG. 14a. The thickness D1, in one embodiment, should be sufficient to form an encapsulant layer which covers second surface 110b as well as side surfaces 110c-110d of the die later. The encapsulant material may include any suitable dielectric material which is flowable when subjected to a treatment later. For example, the encapsulant material 1450, includes a flowable polymeric material. Other suitable types of encapsulant material may also be useful. In one embodiment, the encapsulant, such as epoxy, is deposited on the second surface of the wafer using various suitable techniques. The encapsulant material may be applied to the second surface of the wafer using dispensing, film/tape lamination process, screen printing, spin coating or other suitable types of techniques. The encapsulant material 1450, for example, covers the entire second surface 210b of the wafer.

The process continues by providing the wafer 210 having the encapsulant material 1450 on its second surface on a support unit. The support unit, for example, includes a carrier tape or dicing tape 230. The carrier tape is the same as that described in FIG. 2a. The wafer is provided to the carrier tape such that the encapsulant material 1450 is facing the carrier tape. Referring to FIG. 14b, a singulation process is performed through the dicing channels of the wafer. In one embodiment, the singulation process completely separates the wafer having the encapsulation material into individual dies/units through the dicing channel. Techniques used for the singulation process is the same as that described in FIG. 2b. As shown, the individual die includes first (or active) surface 110a, second (or inactive) surface 110b, first and second sidewalls 110c and 110d and an encapsulant material 1450 that covers the second surface of the die.

Referring to FIG. 14c, the process continues by providing a support carrier 530. The support carrier is the same as that described in FIG. 5b. The individual dies 110 having the encapsulant material 1450 at the second surface of the dies are transferred from the carrier tape 230 and are placed over the support carrier 530 using suitable techniques, such as pick and place technique. The dies are placed over the top surface 530a of the support carrier such that the first surface 110a of the dies having external contacts 170 are facing the support carrier 530. The dies 110 are placed on top of the support carrier and are separated from each other by a predetermined distance. The predetermined distance, for example, should be sufficiently wide to isolate the individual dies from each other during subsequent processing. Other suitable techniques to increase the separation distance between the dies may also be useful.

In one embodiment, the encapsulant material 1450 over the second surface of the dies are subjected to a treatment process as shown in FIG. 14d. The treatment, in one embodiment, transforms the encapsulant material into liquid phase. For example, the volume of the encapsulant material is controlled or adjusted such that a portion of the liquid encapsulant material flows to side surfaces 110c-110d of the die 110. As shown, the treatment causes the liquid encapsulant material covers the second surface 110b as well as side surfaces 110c-110d of the dies due to surface tension and gravity force. The increased separation distance between the dies allow the encapsulant material to flow to the side surfaces of the dies without having encapsulant material of adjacent dies contacting with each other. Thus, a singulation process to separate the encapsulated dies is not required. The treatment, for example, may include any suitable treatment, such as a heating process, UV radiation or a combination thereof. Depending on the type of encapsulant material, a curing process may be performed to cure the encapsulant material.

The encapsulated package is removed from the temporary support carrier using suitable technique. As shown in FIG. 14e, the encapsulated package 30 includes an encapsulant material 1450 that covers both the second surface 110b and sidewalls 110c-110d of the die. In one embodiment, the thickness of the encapsulant material 1450 is non-uniform across the second surface of the die. For instance, the encapsulant material over the second surface of the die includes a maximum thickness D2 at about central portion of the die. D2, for example, is less than the initial thickness D1. The encapsulant material 1450 over the second surface may have a convex profile. Similarly, the surface of the encapsulant material over sidewalls of the die includes non-planar surface profiles. Thus, the encapsulant material over the second surface and sidewalls of the die may not include planar surfaces as shown in FIG. 14e.

FIGS. 15a-15d show another embodiment of a process for forming a semiconductor package 1500. The process 1500 includes similar processes as described in FIGS. 2a-2f and FIGS. 14a-14e. In the interest of brevity, the description below will focus primarily the difference(s) between these processes and elements having the same reference numerals may not be described in detail.

Referring to FIG. 15a, the process is similar to that described in FIG. 14a except that the encapsulant material 1450 having an initial thickness D1 is provided over the first surface 210a of the wafer 210. The thickness D1, in one embodiment, is less than the height of the external contacts and should be sufficient to form an encapsulant layer which covers first surface 110a as well as side surfaces 110c-110d of the die later. The encapsulant material may include any suitable dielectric material which is flowable when subjected to a treatment later as described in FIG. 14a. In one embodiment, the encapsulant material 1450, such as but not limited to epoxy, is deposited on the first surface 210a of the wafer using various suitable techniques. The encapsulant material may be applied to the first surface of the wafer using dispensing, film/tape lamination process, screen printing, spin coating or other suitable types of techniques.

Referring back to FIG. 15a, the process continues by providing the wafer 210 having the encapsulant material 1450 on its first surface on a support unit. The support unit includes a carrier tape or dicing tape 230. The carrier tape is the same as that described in FIG. 2a. The wafer is provided to the carrier tape such that the second surface 210b of the wafer is facing the carrier tape. Referring to FIG. 15b, a first singulation process is performed through the dicing channels of the wafer. In one embodiment, the singulation process completely separates the wafer having the encapsulation material into individual dies/units through the dicing channel. Techniques used for the singulation process is the same as that described in FIG. 2b. As shown, the individual die includes first (or active) surface 110a, second (or inactive) surface 110b, first and second sidewalls 110c and 110d and an encapsulant material 1450 that covers the first surface of the dies.

In one embodiment, the process continues by performing a treatment on the encapsulant material which is formed over the first surface 110a of the dies. The treatment, in one embodiment, transforms the encapsulant material into liquid phase. For example, the volume of the encapsulant material is controlled or adjusted such that a portion of the liquid encapsulant material flows to side surfaces 110c-110d of the die 110 and fills the gaps between the dies as shown in FIG. 15c. As shown, the treatment causes the liquid encapsulant material to cover the first surface 110a as well as side surfaces 110c-110d of the dies and the gaps. A curing process may optionally be performed to cure the encapsulant material, depending on the type of encapsulant material used.

In one embodiment, the process continues with a second singulation process which is performed through the encapsulant material 1450 as shown in FIG. 15c. The second singulation process employs suitable techniques such as those described in FIG. 2e. In one embodiment, the second singulation process singulates the encapsulated dies in a wafer format through the encapsulant material to form individual packages. The individual packages are removed from the carrier tape after the second singulation process using suitable techniques. As shown in FIG. 15d, the encapsulated package 32 includes an encapsulant material 1450 that covers both the first surface and sidewalls of the die. In one embodiment, the thickness of the encapsulant material is non-uniform across the first surface of the die. For instance, the encapsulant material over the first surface of the die includes a maximum thickness D2 at about central portion of the die. D2, for example, is less than the initial thickness D1. The encapsulant material 1450 over the first surface 110a may have a convex profile. The encapsulant material 1450 over the sidewalls 10c-110d of the die includes substantially straight surface profile as shown in FIG. 15d.

FIGS. 16a-16d show another embodiment of a process for forming a semiconductor package 1600. The process 1600 includes similar processes as described in FIGS. 2a-2f and FIGS. 15a-15d. In the interest of brevity, the description below will focus primarily the difference(s) between these processes and elements having the same reference numerals may not be described in detail.

Referring to FIG. 16a, the wafer is processed at the same stage as that described in FIG. 15b. For example, a first singulation process is performed through the encapsulant material 1450 to separate the wafer which is prepared with external contacts 170 into individual dies 110. As shown, the die includes encapsulant material 1450 over its first surface 110a.

The process continues by increasing the separation distance between the individual dies 110. In one embodiment, the gap is increased to a predetermined distance by expanding the carrier tape 230 along the radius of the carrier tape. Other suitable techniques to increase the gap or separation distance between the individual dies may also be useful. For example, in other embodiment, the process continues by providing a support carrier 530 as shown in FIG. 16b. The support carrier is the same as that described in FIG. 5b. The individual dies 110 having the encapsulant material 1450 at the first surface of the dies are transferred from the carrier tape 230 and are placed over the support carrier 530 using suitable techniques, such as pick and place technique. The dies are placed over the top surface 530a of the support carrier such that the second surface 110b of the dies are facing the support carrier 530. The dies 110 are placed on top of the support carrier and are separated from each other by a predetermined distance. The predetermined distance, for example, should be sufficiently wide to isolate the individual dies from each other during subsequent processing.

The encapsulant material over the second surface of the dies are subjected to a treatment process. The treatment, for example, is the same as that described in FIG. 14d. In one embodiment, the treatment transform the encapsulant material into liquid phase. For example, the volume of the encapsulant material is controlled or adjusted such that a portion of the liquid encapsulant material flows to side surfaces 110c-110d of the die 110. As shown in FIG. 16c, the treatment causes the liquid encapsulant material to cover the first surface 110a as well as side surfaces 110c-110d of the dies due to surface tension and gravity force. The increased separation distance between the dies allow the encapsulant material to flow to the side surfaces of the dies without having encapsulant material of adjacent dies contacting with each other. This avoids the use of an additional singulation process to form individual packages.

The encapsulated package is removed from the temporary carrier using suitable technique. As shown in FIG. 16d, the encapsulated package 34 includes an encapsulant material 1450 that covers both the first surface 110a and sidewalls 110c-110d of the die. In one embodiment, the thickness of the encapsulant material is uneven across the first surface 110a of the die. For instance, the encapsulant material 1450 over the first surface of the die includes a maximum thickness D2 at about central portion of the die. D2, for example, is less than the initial thickness D1. The encapsulant material over the first surface and sidewalls of the die may not include planar surfaces as shown in FIG. 16d. For example, the surface of the encapsulant material over the first surface may have a convex profile. Similarly, the thickness of the encapsulant material is also non-uniform across side surfaces 110c-110d of the die.

FIGS. 17a-17d show an embodiment of a method or process for forming a semiconductor package 1700. The process 1700 includes similar processes as described in FIGS. 2a-2f and FIGS. 15a-15d. In the interest of brevity, the description below will focus primarily the difference(s) between these processes and elements having the same reference numerals may not be described in detail.

FIG. 17a shows a wafer 210 having a first surface 210a and a second surface 210b is provided. The wafer 210 is processed up to the stage where an array of external contacts 170 are formed on the first surface of the wafer as described in FIG. 2a.

In one embodiment, the process continues by forming channels or grooves 1730 along the dicing channels of the wafer. In one embodiment, the groove extends from the first surface 210a of the wafer and partially into the wafer substrate as shown in FIG. 17a. The channels/grooves 1730 may be formed through the first surface 210a of the wafer using various suitable techniques. For example, the channels may be formed using laser processing. An encapsulant material 1450 having an initial thickness D1 is applied to the first surface 210a of the wafer. The thickness D1, in one embodiment, is less than the height of the external contacts and should be sufficient to form an encapsulant layer which covers first surface 110a as well as side surfaces 110c-110d of the die later. In one embodiment, the encapsulant material covers substantially the entire first surface of the wafer and partially covers the external contacts while leaving top portions of the external contacts exposed for external connection. As shown, the encapsulant material also fills the grooves/channels 1730. The encapsulant material 1450 may be provided using any suitable techniques as described in FIG. 15a.

The wafer 210 having the encapsulant material over the first surface of the wafer is provided over a support unit. The support unit, for example, includes a carrier tape 230 such as that described in FIG. 2a. The wafer is placed over the carrier tape such that the second surface 210b of the wafer is facing the first surface 230a of the carrier tape while the first surface 210a of the wafer having an array of external contacts 170 is away from the carrier tape.

Referring to FIG. 17b, a first singulation process is performed to separate the wafer into individual dies 110. The first singulation process may employ any suitable techniques such as those described in FIG. 2b. The first singulation process is performed through the dicing channels of the wafer. For example, the first singulation process is performed through the grooves 1730 which are filled with encapsulant material and separates the wafer into individual dies. As shown, the singulated dies include sidewalls 110c-110d having a step profile 1710. The encapsulant material 1450 covers the first surface 110a and partially cover the sidewalls 110c-110d of the dies. For example, the encapsulant material 1450 covers the first surface 110a and the steps 1710 as shown in FIG. 17b.

In one embodiment, the process continues by performing a treatment on the encapsulant material 1450. The treatment, in one embodiment, transform the encapsulant material into liquid phase. For example, the volume of the encapsulant material is controlled or adjusted such that a portion of the liquid encapsulant material flows to side surfaces 110c-110d of the die 110 and fills the gaps between the dies as shown in FIG. 17c. As shown, the treatment causes the liquid encapsulant material to cover the first surface 110a as well as the entire side surfaces 110c-110d of the dies having the step profile and the gaps between the adjacent dies. A curing process may optionally be performed to cure the encapsulant material.

In one embodiment, the process continues with a second singulation process which is performed through the encapsulant material 1450 as shown in FIG. 17c. The second singulation process employs suitable techniques such as those described in FIG. 2e. In one embodiment, the second singulation process singulates the encapsulated dies in a wafer format through the encapsulant material to form individual packages. The individual packages are removed from the carrier tape after the second singulation process.

As shown in FIG. 17d, the encapsulated package 36 includes an encapsulant material 1450 that covers both the first surface and sidewalls of the die having the step profile. In one embodiment, the thickness of the encapsulant material is non-uniform across the first surface of the die. For instance, the encapsulant material over the first surface of the die includes a maximum thickness D2 at about central portion of the die. D2, for example, is less than the initial thickness D1, forming a convex surface profile. Depending on the size of the grooves, the encapsulant material over the sidewalls of the die may also include a step profile or substantially a straight profile as shown in FIG. 17d.

FIGS. 18a-18d show an embodiment of a method for forming a semiconductor package 1800. The process 1800 includes similar processes as described in FIGS. 2a-2f. In the interest of brevity, the description below will focus primarily the difference(s) between these processes and elements having the same reference numerals may not be described in detail.

Figures 18A, 18B, 18C, 18D:
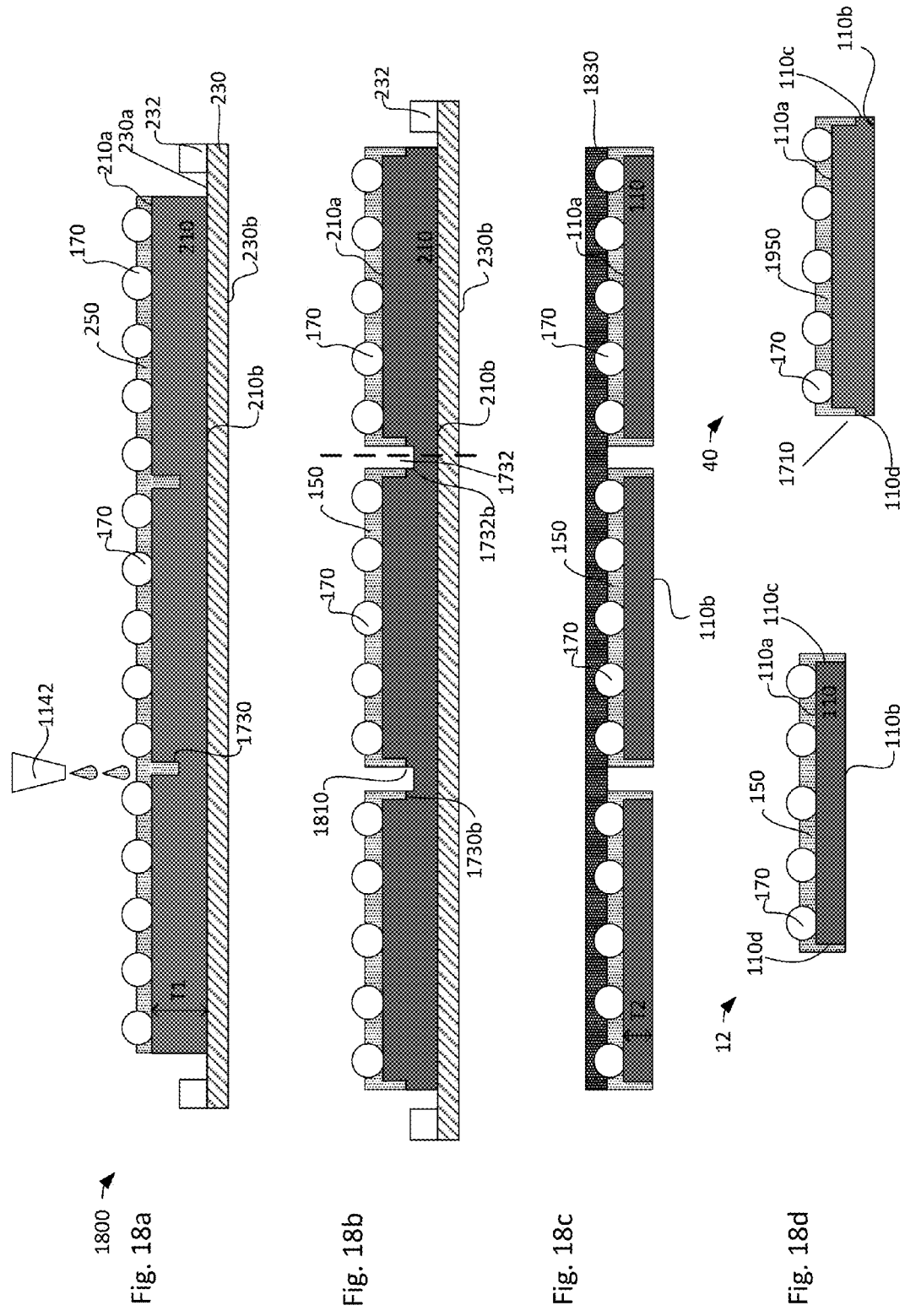

Referring to FIG. 18a, a wafer 210 having first type grooves 1730 extending from first surface 210a of the wafer is provided. The first type grooves are formed using suitable techniques as described in FIG. 17a. In one embodiment, the wafer 210 having an initial thickness T1 is provided with an encapsulant material 250 which covers its first surface 210a and fills the first type grooves 1730. The encapsulant material includes epoxy, mold compound, silicone based material and may be provided over the first surface of the wafer using various suitable techniques, including those as described in FIG. 2d. By way of example and for illustration purpose, the encapsulant material 250 is shown to be provided by dispensing technique through a dispensing nozzle 1142 while the wafer is disposed over the carrier tape 230.

In one embodiment, a partial cut is performed through the dicing channels of the wafer. For example, the partial cut is performed through the grooves filled with encapsulant material 250 as shown in FIG. 18b. This forms a second type grooves or channels 1732 which extends from the top surface of the encapsulant material and having a depth deeper than the first type grooves 1730, forming a further step profile 1810 in the dicing channel of the wafer. The partial cut may be achieved using various suitable techniques. For example, the partial cut may be achieved using laser processing or mechanical sawing.

The process continues by removing portions of the wafer substrate 210. In one embodiment, a portion of the wafer substrate is removed using a backgrinding process as shown in FIG. 18c. This may be achieved by transferring the partially processed wafer as shown in FIG. 18b to a support platform 1830. The support platform, for example, is a backgrinding tape. The partially processed wafer is placed on the support platform such that the external contacts 170 are attached to the support platform. A backgrinding process is then performed on the exposed second surface 210b of the wafer. For example, the backgrinding process removes a portion of the wafer substrate and reduces the thickness of the wafer to T2. The backgrinding process, in one embodiment, proceeds until it reaches the bottom 1730b of the first type grooves 1730. This completely separates the wafer into individual encapsulated packages as shown in FIG. 18c. Alternatively, the backgrinding process may remove a portion of the wafer substrate and ceases operation when it reaches the bottom 1732b of the second type grooves, resulting in a die having sidewalls with a step profile. Other suitable techniques may be used to remove portions of the wafer substrate.

The individual encapsulated package formed by process 1800 as shown in FIG. 18d includes configuration shown by package 12 or package 40 in FIG. 4d. For example, the encapsulant material 150 is an encapsulant layer that covers the first surface and sidewalls of the die while leaving portions of the external contacts 170 exposed as shown by package 12. Alternatively, the encapsulant material is an encapsulant layer that covers the first surface and step portions of the sidewalls of the die and partially cover the external contacts as shown by package 40. The encapsulant material in package 40 does not fully cover the sidewalls of the die.

FIGS. 19a-19d show an embodiment of a method for forming a semiconductor package 1900. The process 1900 includes similar processes as described in FIGS. 2a-2f and FIGS. 18a-18d. In the interest of brevity, the description below will focus primarily the difference(s) between these processes and elements having the same reference numerals may not be described in detail.

Referring to FIG. 19a, the wafer is processed at the same stage as that described in FIG. 18a. For example, the wafer is prepared with an encapsulant material 250 which covers its first surface 210a and fills the grooves 1730 and is provided over the carrier tape 230. The wafer includes an initial thickness T1.

The process continues by removing portions of the wafer substrate 210. In one embodiment, a portion of the wafer substrate is removed using a backgrinding process as shown in FIG. 19b. This may be achieved by transferring the partially processed wafer as shown in FIG. 19a to a support platform 1830, such as a backgrinding tape. The partially processed wafer is placed on the support platform such that the external contacts 170 are attached to the support platform. A backgrinding process is then performed on the exposed second surface 210b of the wafer. In one embodiment, the backgrinding process removes a portion of the wafer substrate and reduces the thickness of the wafer to T2 and ceases operation before it reaches bottom 1730b of the grooves 1730 as shown in FIG. 19b. Alternatively, the backgrinding process may proceed to remove a portion of the wafer substrate until it reaches the bottom 1730b of the grooves 1730. Other suitable techniques may be used to remove portions of the wafer substrate.

Referring to FIG. 19c, a backside protective layer 340 may optionally be applied to the second surface of the wafer 210b. The material of the backside protective layer 340 and its forming techniques are the same as that described in FIG. 3a.

In one embodiment, the process continues by performing a singulation process. The singulation process, for example, is performed through the dicing channels of the wafer. For example, the singulation process is performed through the grooves filled with encapsulant material 250, the wafer substrate and backside protective layer as shown in FIG. 19c. The singulation process employs suitable techniques such as those described in FIG. 2e. In one embodiment, the singulation process singulates the encapsulated structure to form individual packages. The individual packages are removed from the carrier tape 230 after the singulation process.

The die 110 of the encapsulated package 38, for example, includes sidewalls 110c-110d having a step profile 1710 as shown in FIG. 19d. Alternatively, the die may not have a step profile, depending on when the backgrinding process ceases operation. The encapsulant material 150 does not cover the entire sidewalls 110c and 110d of the die. As shown, the encapsulation material covers the active surface 110a and the step portion of the sidewalls 110c-110d.

FIGS. 20a-20c show an embodiment of a method for forming a semiconductor package 2000. The process 2000 includes similar processes as described in FIGS. 2a-2f. In the interest of brevity, the description below will focus primarily the difference(s) between these processes and elements having the same reference numerals may not be described in detail.

Referring to FIG. 20a, the wafer is processed at the same stage as that described in FIG. 2b. For example, a first singulation process is performed to separate the wafer which is prepared with external contacts 170 into individual dies 110.

The process continues by providing an encapsulant material 1950. The encapsulant material, for example, is provided on the first surface 110a of the dies and the external contacts 170 and fills the gaps between adjacent dies. In one embodiment, the encapsulant material is provided by providing a photosensitive material over the first surface of the dies and fills the gaps between the dies. In one embodiment, the photosensitive material is sprayed over the first surface of the dies through a spraying tool 1942. The photosensitive material, in one embodiment, is a negative photoresist material. To pattern the negative photosensitive material, a lithography exposure source may be employed to selectively expose the photosensitive material. In one embodiment, an exposure source 1944, such as a UV radiation source, may be provided at the second surface 230b of the carrier tape. In one embodiment, the exposure source is provided to expose portions of the photosensitive material which fills the gap between adjacent dies as shown in FIG. 20a. In such case, the dies themselves serve as a mask for the lithography process. In one embodiment, since a negative photoresist material is provided, the non-exposed portions of the photoresist material over the first surface of the dies and the external contacts are developed and removed. The photosensitive material in the gaps between the dies remain as shown in FIG. 20b.

Referring to FIG. 20b, the process continues by performing a second singulation process which is performed through the encapsulant material 1950 disposed in the gaps. The second singulation process employs suitable techniques such as those described in FIG. 2e to form individual packages. The encapsulated packages are separated from the carrier tape. The encapsulated package 10 as shown in FIG. 20c includes the same configuration as that described in FIG. 2f. For example, the encapsulant material 1950 covers the sidewalls 110c-110d of the die.

FIGS. 21a-21e show an embodiment of a method for forming a semiconductor package 2100. The process 2100 includes similar processes as described in FIGS. 2a-2f, FIGS. 18a-18d and FIGS. 20a-20c. In the interest of brevity, the description below will focus primarily the difference(s) between these processes and elements having the same reference numerals may not be described in detail.

Referring to FIG. 21a, a wafer 210 having an initial thickness T1 such as that shown in FIG. 18a is provided. The wafer includes first type channels/grooves 1730 which extends from the first surface of the wafer and partially into the wafer substrate. The wafer is provided on a carrier tape 230 such that its second surface 210b is facing the carrier tape. In one embodiment, an encapsulant material 1950 is provided on the first surface 210a of the wafer and the external contacts 170 and fills the channels 1730. In one embodiment, the encapsulant material is provided by spraying a photosensitive material which is described in FIG. 20a. The photosensitive material, in one embodiment, is a photoresist material. A positive or negative photoresist material may be used.

In one embodiment, a mask 2040 having a desired pattern is provided over the first surface of the wafer as shown in FIG. 21b. For example, the mask includes openings which expose the active surface of the dies having external contacts 170 while covering the first type grooves. To pattern the photosensitive material, a lithography exposure source may be employed to selectively expose the photosensitive material. In one embodiment, an exposure source 1944, such as a UV radiation source, may be provided over the first surface of the wafer. In one embodiment, the exposure source is provided to expose portions of the photosensitive material which cover the active surface of the wafer and external contacts as shown in FIG. 21b. In one embodiment, the exposed portions of the photoresist material over the first surface of the dies and the external contacts are developed and removed. The photosensitive material in the grooves 1730 remain as shown in FIG. 21b.

Referring to FIG. 21c, a partial cut is performed through the grooves filled with encapsulant material. The partial cut is performed using techniques as described with respect to FIG. 18b. This forms a second type grooves or channels 1732 which extends from the top surface of the encapsulant material and having a depth deeper than the first type grooves 1730, forming a further step profile 1810 in the dicing channel of the wafer.

The process continues by removing portions of the wafer substrate 210 to a reduced thickness. In one embodiment, a portion of the wafer substrate is removed using a backgrinding process which is described with respect to FIG. 18c. This may be achieved by transferring the partially processed wafer as shown in FIG. 21d to a support platform 1830 to perform the backgrinding process. In one embodiment, the backgrinding process removes a portion of the wafer substrate and reduces the thickness of the wafer to T2. For example, the backgrinding process proceeds until it reaches the bottom of the encapsulant material or bottom of the first type groove. This completely separates the wafer into individual encapsulated packages as shown in FIG. 21e having the same configuration as the package 10 that shown in FIG. 20c, except for reduction in die thickness.

In an alternative embodiment, the backgrinding process may proceed until it reaches the bottom 1732b of the second type grooves 1732. In such case, the die of the encapsulated package includes sidewalls having a step profile 1710 and the encapsulant material 1950 covers the steps of the sidewalls of the die as shown by package 41 in FIG. 2e.

The process 2100 as described above may be modified, depending on whether positive or negative photoresist is provided. Thus, depending on the type of photoresist, the pattern of the mask may be modified to cover the active surface of the dies instead of the gaps as described above and the exposure and development process may be modified accordingly.

FIGS. 22a-22d show an embodiment of a method for forming a semiconductor package 2200. The process 2200 includes similar processes as described in FIGS. 2a-2f. In the interest of brevity, the description below will focus primarily the difference(s) between these processes and elements having the same reference numerals may not be described in detail.

Figure 22A:
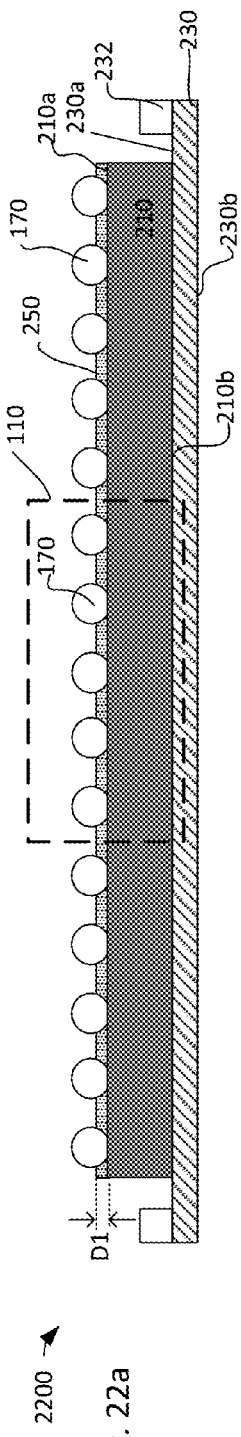

Referring to FIG. 22a, a wafer 210 such as that shown in FIG. 2a is provided. In one embodiment, a first encapsulant material/layer 250 is provided over the first surface 210a of the wafer and partially covers the array of external contacts 170. The first encapsulant material 250 includes various suitable encapsulant material, such as but not limited to epoxy, mold compound, silicone based material, and may be formed using suitable techniques including those described in FIG. 2d. The first encapsulant material includes a thickness D1 which is less than height of the external contacts 170. The wafer is provided over the carrier tape 230.

Figure 22B:
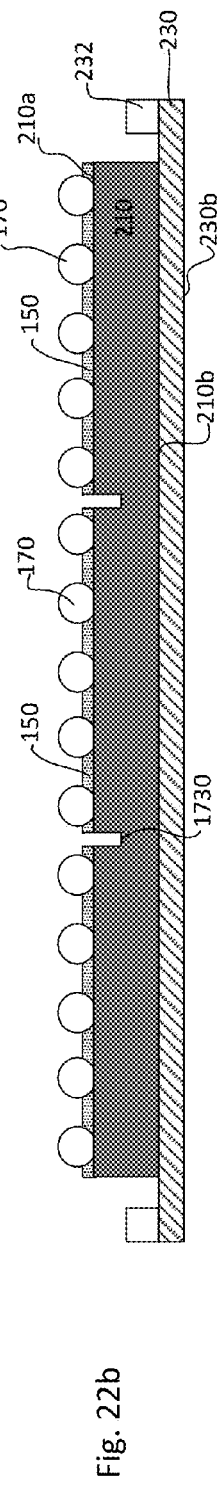

In one embodiment, the process continues by forming channels or grooves 1730 along the dicing channels of the wafer. In one embodiment, the groove extends from the top surface of the encapsulant material and partially into the wafer substrate as shown in FIG. 22b, The grooves may be formed using various suitable techniques. For example, the grooves may be formed using mechanical sawing such as diamond blade, plasma etching, laser processing, chemical etching or a combination thereof. In one embodiment, the grooves may extend to about half of the wafer thickness. Other suitable depth dimensions for the grooves may also be useful. Since the first surface of the wafer is protected by the first encapsulant material 250, sensitive layers, such as low k material of the wafer is protected from mechanical damage during formation of the grooves.

Figure 22C:
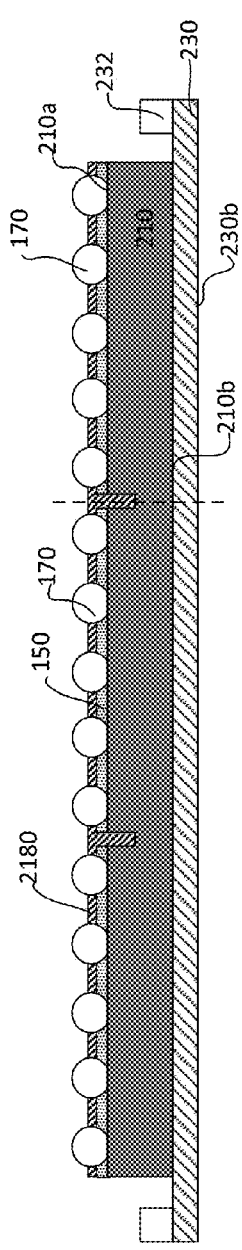

In one embodiment, the process continues by providing a second encapsulant material/layer 2180. The second encapsulant material, in one embodiment, is provided over the first encapsulant material and fills the grooves 1730 as shown in FIG. 22c. The second encapsulant material is provided over the first encapsulant material and fills the grooves using various suitable techniques including those as described in FIG. 2d.

The second encapsulant material 2180 includes any suitable thickness dimension such that the total thickness of the first and second encapsulant materials is less than the height of the external contacts 170. In one embodiment, the second encapsulant material includes the same material as the first encapsulant material. In other embodiments, the second encapsulant material may be different than the first encapsulant material.

The process continues with a singulation process which is performed through the second encapsulant material which fills the grooves 1730 as shown in FIG. 22c. The singulation process employs suitable techniques such as those described in FIG. 2e to form individual packages. The encapsulated packages are separated from the carrier tape 230.

Figure 22D:
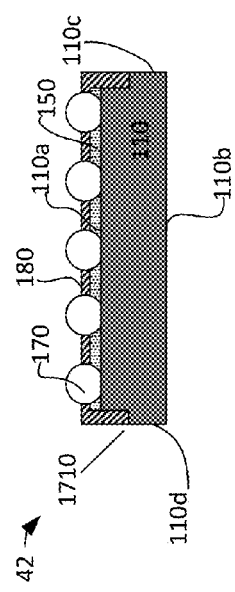

The encapsulated package 42 formed by process 2200 described above includes a die 110 having sidewalls 110c-110d with a step profile 1710 as shown in FIG. 22d. In one embodiment, the process 2200 forms an encapsulated package having an encapsulant material which includes first and second encapsulant materials/layers 150 and 180. The first encapsulant material 150, as shown, covers the first surface 110a of the die while the second encapsulant material 180 covers the first encapsulant material and a portion of the sidewalls 110c-110d of the die. For example, the second encapsulant material covers the first encapsulant material and the steps of the sidewalls of the dies.

FIGS. 23a-23e show an embodiment of a method for forming a semiconductor package 2300. The process 2300 includes similar processes as described in FIGS. 2a-2f, FIGS. 18a-18d and FIGS. 22a-22d. In the interest of brevity, the description below will focus primarily the difference(s) between these processes and elements having the same reference numerals may not be described in detail.

Referring to FIG. 23a, the wafer 210 having an initial thickness T1 is processed up to the stage similar to that described in FIG. 22b except that the grooves 2330 are formed more than half of the thickness of the wafer 210. For example, the grooves include a depth which is more than 30 µm from the first surface of the wafer. Other suitable depth dimensions for the grooves may also be useful. Techniques for forming the first encapsulant material and grooves are the same as that described in FIG. 22b.

In one embodiment, the process continues by providing a second encapsulant material/layer 2180. The second encapsulant material, in one embodiment, is provided over the first encapsulant material/layer 150 and fills the grooves 2230 as shown in FIG. 23b. The second encapsulant material is provided over the first encapsulant material and fills the grooves using various suitable techniques as described in FIG. 22c. The second encapsulant material 2180 includes any suitable thickness dimension such that the total thickness of the first and second encapsulant materials is less than the height of the external contacts 170. The second encapsulant material, for example, may or may not include the same material as the first encapsulant material.

The process continues by removing portions of the wafer substrate 210 to a reduced thickness. In one embodiment, a portion of the wafer substrate is removed using a backgrinding process which is described with respect to FIG. 18c. This may be achieved by transferring the partially processed wafer as shown in FIG. 23b to a support platform 1830 to perform the backgrinding process. In one embodiment, the backgrinding process removes a portion of the wafer substrate and reduces the thickness of the wafer to T2. For example, the backgrinding process proceeds until it reaches or exposes the bottom of the second encapsulant material 2180 which fills the grooves 2330 as shown in FIG. 23c. Other suitable techniques may be used to remove portions of the wafer substrate.

Figures 23D, 23E:
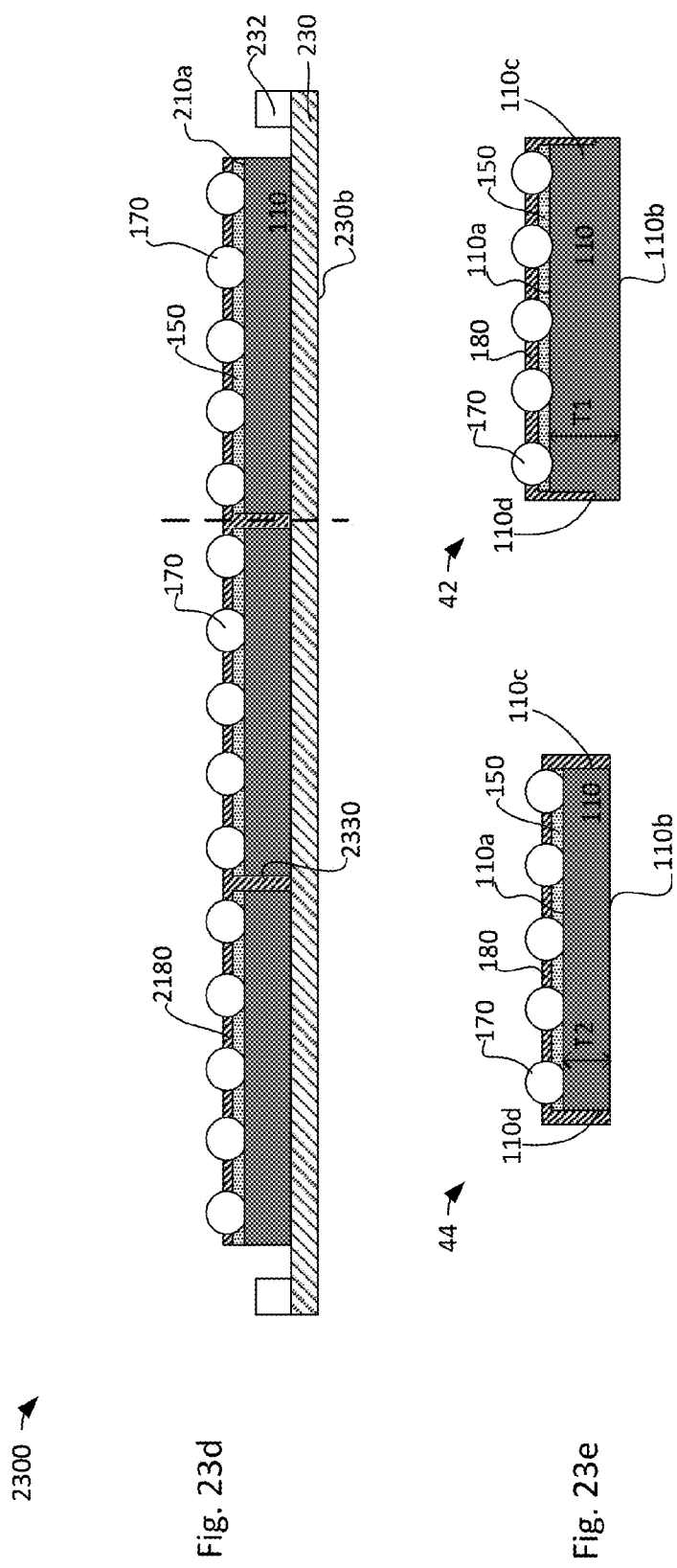

The process continues by removing the encapsulated wafer having reduced thickness from the backgrinding tape to a carrier tape 230 as shown in FIG. 23d. In one embodiment, a singulation process such as those described in FIG. 2e is employed to separate the encapsulated wafer into individual packages. The singulated process is performed through, for example, the second encapsulant material 2180 which fills the grooves 2330. The encapsulated packages are separated from the carrier tape 230.

The encapsulated package formed by process 2300 may include various configurations as shown in FIG. 23e. The encapsulated package includes an encapsulant material having first and second encapsulant materials/layers 150 and 180. In one embodiment, the first encapsulant material 150 covers the first surface of the die while the second encapsulant material 180 covers the first encapsulant material 150 and the entire sidewalls 110c-110d of the die as shown in package 44.

In another embodiment, the process 2300 may be modified such that the backgrinding process removes a portion of the wafer substrate and reduces the thickness of the wafer. However, the backgrinding process is ceased prior to reaching the bottom of the second encapsulant material which fills the grooves 2330. The singulation process is then performed as described in FIG. 23d which separates the encapsulated structure into individual packages. In such case, the singulation process forms an encapsulated package 42 such as that shown in FIG. 23e. As shown, the encapsulated package 42 includes a die having sidewalls with a step profile. The second encapsulation material 180 covers the first encapsulant material 150 and the steps of the sidewalls of the die as shown in FIG. 23e.

FIGS. 24a-24f show an embodiment of a method for forming a semiconductor package 2400. The process 2400 includes similar processes as described in FIGS. 2a-2f, FIGS. 19a-19d and FIGS. 22a-22d. In the interest of brevity, the description below will focus primarily the difference(s) between these processes and elements having the same reference numerals may not be described in detail.

Referring to FIG. 24a, the wafer having an initial thickness T1 is processed at the same stage as that described in FIG. 19a. For example, the wafer is prepared with a first encapsulant material 250 which covers its first surface 210a and fills the grooves 1730. The wafer includes an initial thickness T1 and is provided over the carrier tape 230.

The process continues by removing portions of the wafer substrate 210. In one embodiment, a portion of the wafer substrate is removed using a backgrinding process as shown in FIG. 24b. This may be achieved by transferring the partially processed wafer as shown in FIG. 24a to a support platform 1830, such as a backgrinding tape. The partially processed wafer is placed on the support platform such that the external contacts 170 are attached to the support platform. A backgrinding process is then performed on the exposed second surface 210b of the wafer. For example, the backgrinding process removes a portion of the wafer substrate and reduces the thickness of the wafer to T2 and the backgrinding process proceeds until it reaches or exposes bottom surface of the first encapsulant material 250.

The partially processed wafer having a reduced thickness is removed from the support platform 1830 and is transferred to a carrier tape 230. The partially processed wafer is placed on the carrier tape such that the second surface of the dies 110b is facing the carrier tape. As shown in FIG. 24c, a first singulation process is performed to separate the partially processed wafer into individual encapsulated packages. In one embodiment, the first singulation process is performed through the first encapsulant material which fills the grooves 1730. As shown, the singulated packages includes a first encapsulant material/layer 150 which covers the first surface 110 and sidewalls 110c-110d of the dies. The first encapsulant material, in one embodiment, includes a first thickness H1 over the first surface 110a of the die and a second thickness H2 over the sidewalls 110c-110d of the die. H1, for example, is about 15-20 μm and H2, for example, is about 12-18 μm. Other suitable thickness dimensions may also be useful.

Figure 24D:
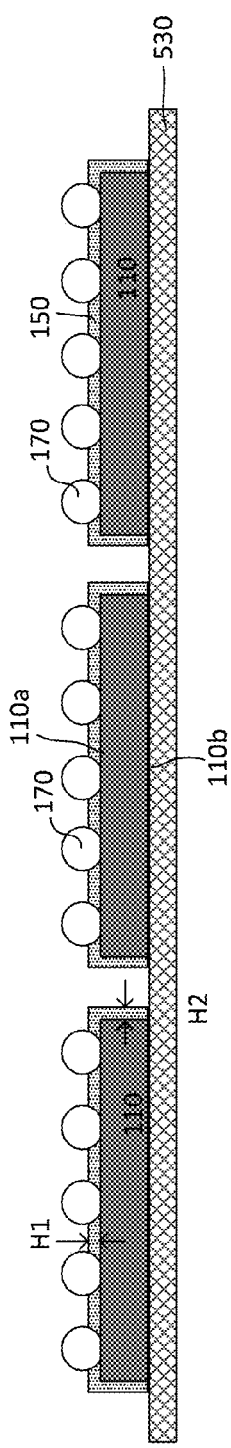

The process continues to increase the gap or separation distance between the encapsulated dies. In one embodiment, the encapsulated dies with first encapsulant material 150 may be removed from the carrier tape and transferred to a support carrier 530 using pick and place technique. The encapsulated dies are placed on the support carrier with predetermined separation distance as shown in FIG. 24d. The predetermined distance, for example, should be sufficiently wide to accommodate a second encapsulant material and tools used for a second singulation later. Other suitable techniques to increase the gap or separation distance between the individual dies may also be useful.

Figure 24E:
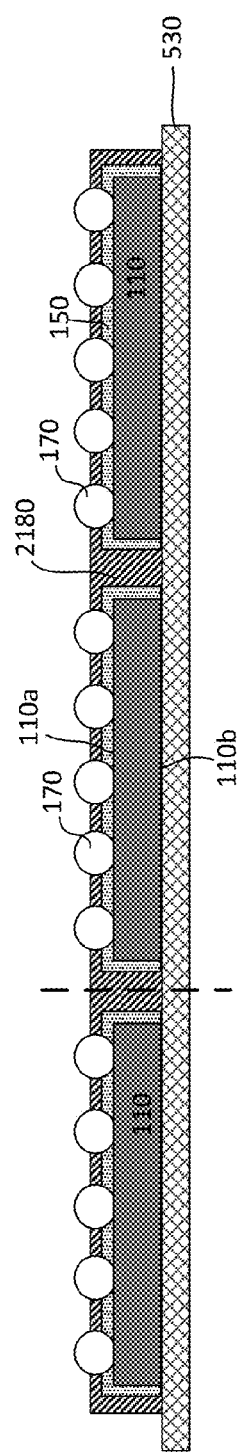

In one embodiment, the process continues by providing a second encapsulant material/layer 2180. The second encapsulant material, in one embodiment, is provided over the first encapsulant material 150 and fills the gaps between the encapsulated dies as shown in FIG. 24e. The second encapsulant material is provided over the first encapsulant material and fills the gaps using various suitable techniques such as those described in FIG. 22c. The second encapsulant material, for example, may or may not include the same material as the first encapsulant material.

The process continues with a second singulation process which is performed through the second encapsulant material which fills the gaps as shown in FIG. 24e. The second singulation process employs suitable techniques such as those described in FIG. 2e to form individual packages. The encapsulated packages are separated from the support carrier 530 after the second singulation process. In other embodiments, the support carrier may be removed prior to performing the second singulation process.

Figure 24F:
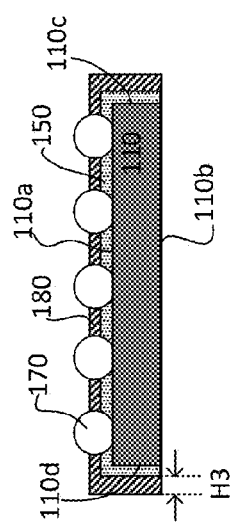

The encapsulated package 46 formed by process 2400 is shown in FIG. 24f. In one embodiment, the encapsulated package includes an encapsulant material having first and second encapsulant materials/layers 150 and 180. The first encapsulant material 150, as shown, covers the first surface and sidewalls 110c-110d of the die while the second encapsulant material 180 covers the first encapsulant material 150. The second encapsulant material 180 includes any suitable thickness dimension such that the total thickness of the first and second encapsulant materials over the first surface of the die is less than the height of the external contacts 170. For example, the second encapsulant material includes a thickness H3. H3, for example, is about 80-120 μm. Other suitable thickness dimensions may also be useful.

FIGS. 25a-25d show an embodiment of a method for forming a semiconductor package 2500. The process 2500 includes similar processes as described in FIGS. 2a-2f and FIGS. 18a-18d and FIGS. 24a-24f. In the interest of brevity, the description below will focus primarily the difference(s) between these processes and elements having the same reference numerals may not be described in detail.

Figure 25A:
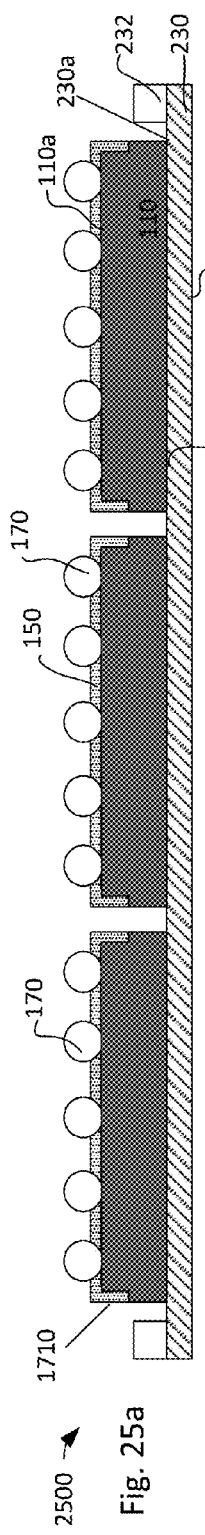

Referring to FIG. 25a, the wafer is processed similar to that described in FIG. 18b. For example, the singulated dies include sidewalls 110c-110d having a step profile 1710. The encapsulant material 150 covers the first surface 110a and partially cover the steps of sidewalls 10c-110d of the dies. However, the process 2400 differs in that a singulation process which includes a full cut is performed through the dicing channels of the wafer. This completely separates the wafer into individual dies. The full cut may be achieved using various suitable techniques, such as laser processing, plasma etching or mechanical sawing.

Figure 25B:
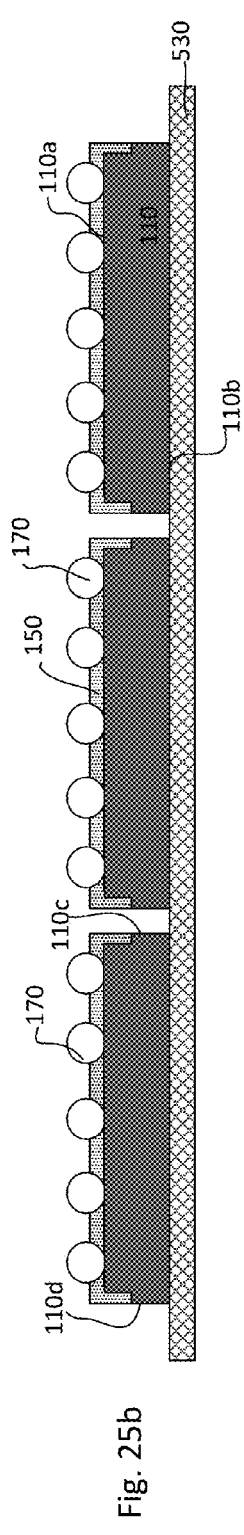

The process continues to increase the gap or separation distance between the dies. In one embodiment, the encapsulated dies with first encapsulant material 150 may be removed from the carrier tape and transferred to a support carrier 530 using pick and place technique. The encapsulated dies are placed on the support carrier with predetermined separation distance as shown in FIG. 25b. Other suitable techniques to increase the gap or separation distance between the individual dies may also be useful.

Figure 25C:
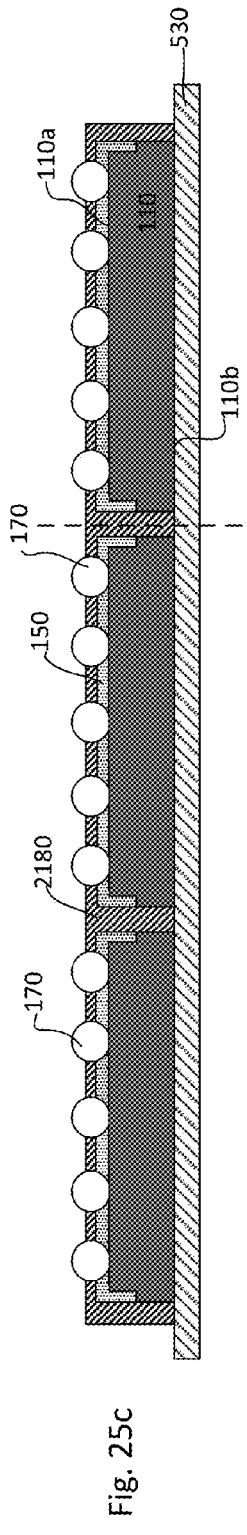

In one embodiment, the process continues by providing a second encapsulant material/layer 2180. The second encapsulant material, in one embodiment, is provided over the first encapsulant material and fills the gaps between the encapsulated dies as shown in FIG. 25c. Materials and techniques for forming the second encapsulant material are the same as previously described.

The process continues with a second singulation process which is performed through the second encapsulant material which fills the gaps as shown in FIG. 25c. The second singulation process employs suitable techniques such as those described in FIG. 2e to form individual packages and is processed as that described in FIG. 24e.

Figure 25D:
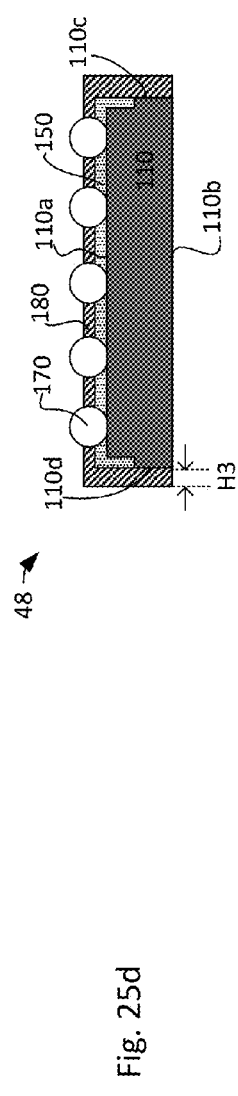

The encapsulated package 48 formed by process 2500 is shown in FIG. 25d. In one embodiment, the encapsulated package includes an encapsulant material having first and second encapsulant materials/layers 150 and 180. The first encapsulant material 150, as shown, covers the first surface and steps of the sidewalls 110c-110d of the die while the second encapsulant material 180 covers the first encapsulant material 150 and exposed sidewalls 110c-110d of the die. The second encapsulant material 180 includes any suitable thickness dimension such that the total thickness of the first and second encapsulant materials over the first surface of the die is less than the height of the external contacts 170. For example, the second encapsulant material includes a thickness H3 as described in FIG. 24f.

As described, the encapsulant material may be provided using various suitable techniques. In one embodiment, the encapsulant materials 250 and 2180 may be provided using a film assisted molding technique. The film assisted molding techniques as will be described in FIGS. 26a-26b and FIGS. 27a-27c below are suitable to be used in process 200, 300, 500, 600, 700, 800, 900, 1000, 1100, 1800, 1900, 2200, 2300, 2400 and 2500 as described above.

Figure 26A:
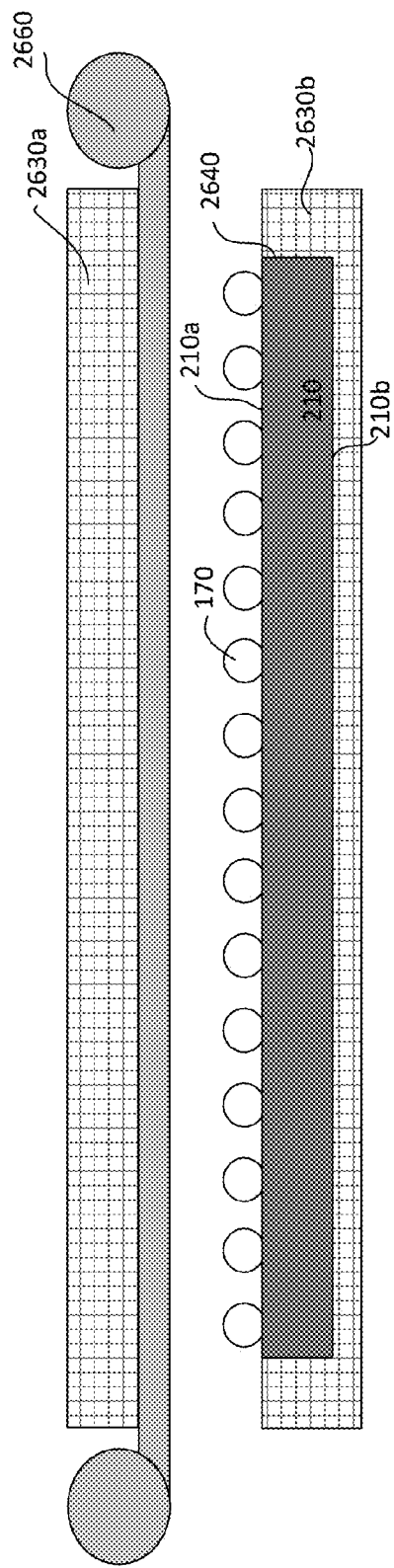
FIGS. 26a-26b show an embodiment of a film-assisted molding process.
Figure 26B:
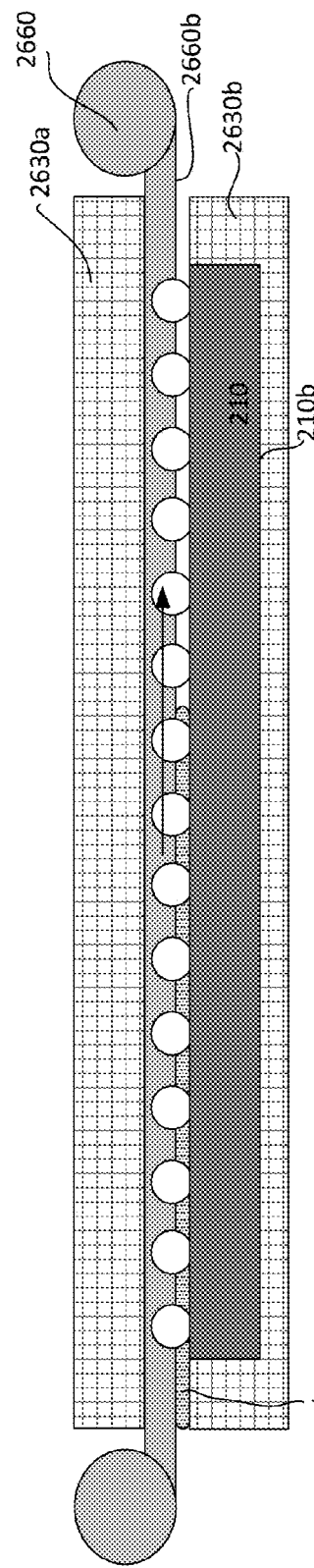

FIG. 26a-26b show an embodiment of a film assisted molding technique. As shown in FIG. 26a, a first (or top) mold 2630a and a second (or bottom) mold 2630b are provided as shown in FIG. 26a. For illustration purpose, the second mold, for example, is shown to include a cavity 2640 having a size suitable to accommodate a wafer 210. For simplicity, the wafer 210 is shown to include planar surface 210*a*. However, it is understood that the wafer 210 may also include grooves 1730 as described above. Furthermore, it is understood that the second mold may be modified to accommodate a plurality of dies.

As shown in FIG. 26*a*, the first mold includes a planar surface and a film 2660, such as a release film, is placed against the planar surface of the first mold 2630. As shown, the wafer 210 is placed into the cavity 2640 of the second mold in such a way that the second surface 210*b* of the wafer contacts the bottom of the cavity while the first surface of the wafer 210*a* having external contacts 170 are exposed.

The first and second molds, when assembled, causes the film to be placed in proximity and contacts a portion of the external contacts 170. In one embodiment, partial of the external contacts are surrounded by the film while a gap or space is defined between the bottom surface 2660*b* of the film and first surface 210*a* of the wafer as shown in FIG. 26*b*. Encapsulant material 250 or 2180, such as but not limited to epoxy based mold compound, is dispensed from one side of the wafer into the mold assembly, completely filling the space. The dispensed encapsulant material has a viscosity of about 20-500 Pa.s. Other suitable viscosity ranges may also be useful. After molding, the encapsulated wafer or dies are removed from the second mold. This, for example, forms the encapsulant material 250 which covers the entire first surface 210*a* of the wafer, such as that shown in FIG. 22*a*. The encapsulant material also partially covers the external contacts while leaving top portions of the external contacts exposed for external connection.

In another embodiment, the encapsulant material 250/2180, such as epoxy based mold compound, is provided over the first surface 210*a* of the wafer using a combination of dispensing and film assisted molding techniques as shown in FIGS. 27*a*-27*c*. The film assisted molding technique as shown in FIG. 27*a*-27*c* is similar to that described in FIGS. 26*a*-26*b*. As such, common elements having the same reference numerals may not be described or described in detail.

As shown in FIG. 27*a*, the wafer 210 is placed into the cavity 2640 of the second mold in such a way that the second surface 210*b* of the wafer contacts the bottom of the cavity with the first surface of the wafer 210*a* having external contacts 170 are exposed. In one embodiment, encapsulant material, such as but not limited to epoxy based mold compound, is provided through a dispensing nozzle or tool 1142 which is placed at about the center portion of the wafer.

The process continues by assembling the first and second molds 2630*a*-2630*b* together as shown in FIG. 27*b*. This causes the film to be placed in proximity and contacts a portion of the external contacts 170. In one embodiment, partial of the external contacts are surrounded by the film while a gap or space is defined between the bottom surface 2660*b* of the film and first surface 210*a* of the wafer as shown in FIG. 27*b*. The encapsulant material which is provided on the first surface of the wafer moves from the center portion 212*c* to the peripheral portion 212*p* of the first surface of the wafer when it is pressed by the first mold. As shown, the encapsulant material 250/2180 substantially covers the first or active surface of the wafer. After molding, the encapsulated wafer is removed from the second mold.

In some other embodiments, the encapsulant material, such as epoxy based material, may be dispensed or deposited on the active surface of the wafer depending on its state. The encapsulant material may be provided in the form of liquid or in the form of granular particles. It is also optional to heat the second mold so as to ensure that the encapsulant material can be applied to cover substantially the entire first surface of the wafer except where the flange portion 218, where the saw street or dicing channels and/or unique patterns are exposed, which are used as alignment marks 215 as shown in FIG. 27*c*.

The invention may be embodied in other specific forms without departing from the spirit or essential characteristics thereof. The foregoing embodiments, therefore, are to be considered in all respects illustrative rather than limiting the invention described herein.

What is claimed is:

1. A semiconductor package comprising:
a semiconductor die, wherein the die comprises first and second major surfaces and first and second sidewalls, and a plurality of external electrical contacts disposed on the first major surface of the die;
an encapsulant material, wherein the first and second sidewalls of the die include vertical sidewall profile and the encapsulant material fully covers the first and second sidewalls of the die; and
wherein the encapsulant material comprises vertical portions and first and second lateral extended portions, wherein
the vertical portions fully cover the first and second sidewalls of the die,
the first lateral extended portions extend over peripheral portions of the first major surface of the die, and
the second lateral extended portions extend away from the die, wherein the second lateral extended portions include a top surface which is substantially coplanar with the second major surface of the die.

2. A semiconductor package comprising:
a semiconductor die, wherein the die comprises first and second major surfaces and first and second sidewalls, and a plurality of external electrical contacts disposed on the first major surface of the die, wherein each of the first and second sidewalls of the die includes a step profile;
a first encapsulant layer that covers the first major surface of the die; and
a second encapsulant layer that covers the first encapsulant layer and a portion of the first and second sidewalls of the die.

3. The semiconductor package of claim 2 wherein:
the first and second encapsulant layers are separate and distinct layers; and
the step profile of the first and second sidewalls of the die is defined by a first and a second sidewall portion, wherein the second sidewall portion is laterally extended relative to the first sidewall portion, and the first sidewall portion is adjacent to the first major surface of the die.

4. The semiconductor package of claim 3 wherein the second encapsulant layer covers the first sidewall portion without covering the second sidewall portion of the first and second sidewalls of the die.

5. The semiconductor package of claim 3 wherein the first encapsulant layer extends to cover the first sidewall portion, and the second encapsulant layer extends beyond the first encapsulant layer to cover the second sidewall portion of the first and second sidewalls of the die.

6. A semiconductor package comprising:
a semiconductor die, wherein the die comprises first and second major surfaces and first and second sidewalls, and a plurality of external electrical contacts disposed on the first major surface of the die, wherein each of the first and second sidewalls of the die includes a first and a second sidewall portion, and the second sidewall portion is laterally extended relative to the first sidewall portion to define a step profile of the first and second sidewalls; and an encapsulant layer, wherein the encapsulant layer directly contacts and covers the first sidewall portion without covering the second sidewall portion of the first and second sidewalls of the die.

7. The semiconductor package of claim 6 wherein the encapsulant layer additionally overlaps the first major surface of the die.

8. The semiconductor package of claim 7 wherein the encapsulant layer directly contacts and covers the first major surface of the die.

9. The semiconductor package of claim 6 wherein the encapsulant layer is a first encapsulant layer and the semiconductor package additionally comprises a second encapsulant layer, wherein the second encapsulant layer is separate and distinct from the first encapsulant layer.

10. The semiconductor package of claim 9 wherein the first encapsulant layer additionally extends over and covers the first major surface of the die.

11. The semiconductor package of claim 10 wherein the second encapsulant layer is disposed over and covers the first encapsulant layer, wherein the second encapsulant layer extends beyond the first encapsulant layer to cover the second sidewall portion of the first and second sidewalls of the die.

12. The semiconductor package of claim 9 wherein the second encapsulant layer is disposed on and covers the first major surface of the die.

13. The semiconductor package of claim 12 wherein the first encapsulant layer extends over and covers the second encapsulant layer.

14. The semiconductor package of claim 6 wherein the encapsulant layer does not cover the first major surface of the die.

15. The semiconductor package of claim 6 wherein the second major surface of the die is exposed.

16. The semiconductor package of claim 15 wherein the encapsulant layer extends to cover the first major surface of the die.

17. The semiconductor package of claim 6 wherein the second sidewall portion of the first and second sidewalls of the die is devoid of encapsulant material.

18. The semiconductor package of claim 6 wherein the encapsulant layer does not contact the external electrical contacts of the die.

* * * * *